(12) United States Patent
Otsuka

(10) Patent No.: US 6,522,173 B1
(45) Date of Patent: Feb. 18, 2003

(54) ELECTRONIC DEVICE

(75) Inventor: Kanji Otsuka, 1074-38, Kohan 2-chome, Higashiyamato-shi, Tokyo, 207-0002 (JP)

(73) Assignees: Kanji Otsuka, Higashiyamato (JP); Fujitsu Limited, Kawasaki (JP); Oki Electric Industry Co., Ltd., Tokyo (JP); Sanyo Electric Co., Ltd., Moriguchi (JP); Sharp Kabushiki Kaisha, Osaka (JP); Sony Corporation, Tokyo (JP); Kabushiki Kaisha Toshiba, Kawasaki (JP); NEC Corporation, Tokyo (JP); Hitachi, Ltd., Tokyo (JP); Matsushita Electronics Corporation, Osaka (JP); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/280,652

(22) Filed: Mar. 29, 1999

(30) Foreign Application Priority Data

Mar. 31, 1998 (JP) ............................................. 10-087457

(51) Int. Cl.$^7$ ................................................. H01P 3/08
(52) U.S. Cl. ........................... 326/101; 326/47; 326/86; 333/1; 333/12; 333/25; 333/238; 710/126
(58) Field of Search ....................... 326/101, 47; 333/1, 333/238, 12, 25

(56) References Cited

U.S. PATENT DOCUMENTS

| | | | | |
|---|---|---|---|---|
| 5,027,088 A | * | 6/1991 | Shimizu et al. | 333/1 |
| 5,418,504 A | * | 5/1995 | Notenburg | 333/1 |
| 6,025,742 A | * | 2/2000 | Chan | 327/108 |
| 6,151,648 A | * | 11/2000 | Haq | 710/107 |
| 6,237,056 B1 | * | 5/2001 | Lam et al. | 710/126 |

* cited by examiner

Primary Examiner—Michael Tokar
Assistant Examiner—Vibol Tan
(74) Attorney, Agent, or Firm—Armstrong, Westerman & Hattori, LLP

(57) ABSTRACT

An electronic device includes a wiring board, and at least one pair of signal lines that is provided on the wiring board in parallel and has an equal length. A chip is mounted on the wiring board and includes at least one differential driver which outputs complementary digital transmit signals to said at least one of lines. A pair of power system lines is provided to supply first and second power supply voltages to the above-mentioned at least one differential driver. The power system lines are parallel to each other and have an equal length.

22 Claims, 38 Drawing Sheets

ELECTRONIC DEVICE

BACKGROUND OF THE INVENTION

1. Field of the Invention

The present invention relates to an electronic device having a transfer circuit which transfers a digital transmit signal output from a driver to a receiver via signal lines.

2. Description of the Related Art

FIG. 1 is a circuit diagram of an example of a conventional electronic device. The electronic device includes a CMOS differential driver 3 and a CMOS differential receiver 4. The CMOS driver 3 converts a digital transmit signal into complementary transmission digital signals CS and /CS, which are output to signal lines 1 and 2, respectively. The CMOS differential receiver 4 receives the complementary digital transmit signals CS and /CS transferred over the digital signal RS corresponding to the digital transmit signal TS.

The CMOS differential driver 3 includes a CMOS driver 5, which outputs the positive phase digital transmit signal CS which is in phase with the digital transmit signal TS. The CMOS driver 5 includes an n-channel MOS (nMOS) transistor 6 serving as a pull-up element, and a p-channel MOS (pMOS) transistor 7 serving as a pull-down element. The CMOS differential driver 3 includes a CMOS inverter 8, which includes a pMOS transistor 9 serving as a pull-up element, and an nMOS transistor 10 serving as a pull-down element.

The CMOS differential receiver 4 includes a CMOS driver 11, which receives the in-phase phase digital transmit signal CS transferred over the signal line 1. The CMOS driver 11 includes an nMOS transistor 12 serving as a pull-up element, and a pMOS transistor 13 serving as a pull-down element. The CMOS differential receiver 4 includes a CMOS inverter 14, which receives the anti-phase digital transmit signal /CS transferred over the signal line 2. The CMOS inverter 14 includes a pMOS transistor 15 serving as a pull-up element, and an nMOS transistor 16 serving as a pull-down element.

In the electronic device thus configured, when the digital transmit signal TS switches from the low level to the high level, the nMOS transistor 6 of the CMOS driver 5 is turned ON, and the pMOS transistor 7 is turned OFF. Further, the pMOS transistor 9 of the CMOS inverter 8 is turned OFF and the nMOS transistor 10 thereof is turned ON.

Hence, a charge which switches the input terminal of the CMOS driver 11 to the high level from the low level is supplied to the signal line 1 via the CMOS driver 5, and a charge which switches the input terminal of the CMOS inverter 14 to the low level from the high level is drawn to the ground from the signal line 2 via the CMOS inverter 8.

The above phenomenon can be understood so that positive signal energy which changes the input terminal of the CMOS driver 11 from the low level to the high level is supplied to the signal line 1 from the CMOS drier 5 and negative signal energy which changes the input terminal of the CMOS inverter 14 from the high level to the low level is supplied to the signal line 2 from the CMOS inverter 8.

When the input terminal of the CMOS driver 11 switches from the low level to the high level and the input terminal of the CMOS inverter 14 switches from the high level to the low level, the nMOS transistor 12 of the CMOS driver 11 is turned ON and the pMOS transistor 13 is turned OFF. Further, the pMOS transistor 15 of the CMOS inverter 14 is turned ON, and the nMOS transistor 16 thereof is turned OFF.

Hence, the outputs of the CMOS driver 11 and the CMOS inverter 14 are turned to the high level from the low level. Thus, the receive digital signal RS output by the CMOS differential receiver 4 is switched to the high level from the low level. Thus, the CMOS differential receiver 4 substantially receives the digital transmit signal TS.

In contrast, when the digital transmit signal TS switches from the high level to the low level, the nMOS transistor 6 of the CMOS driver 5 is turned OFF, and the pMOS transistor 7 is turned ON. Further, the pMOS transistor 9 of the CMOS inverter 8 is turned ON, and the nMOS transistor 10 thereof is turned OFF.

Hence, a charge which switches the input terminal of the CMOS driver 11 from the high level to the low level is drawn to the ground from the signal line 1 via the CMOS driver 5, and a charge which switches the input terminal of the CMOS inverter 14 from the low level to the high level is supplied to the signal line 2 from the CMOS inverter 8.

The above phenomenon can be considered so that negative signal energy which changes the input terminal of the CMOS driver 11 from the high level to the low level is supplied to the signal line 1 from the CMOS driver 5, and positive signal energy which changes the input terminal of the CMOS inverter 14 from the low level to the high level is supplied to the signal line 2 from the CMOS inverter 8.

When the input terminal of the CMOS inverter 11 switches from the high level to the low level and the input terminal of the CMOS inverter 14 switches from the low level to the high level, the nMOS transistor 12 of the CMOS driver 11 is turned OFF and the pMOS transistor 13 thereof is turned ON. Further, the pMOS transistor 15 of the CMOS inverter 14 is turned OFF and the nMOS transistor 16 thereof is turned ON.

Hence, the outputs of the CMOS driver 11 and the CMOS inverter 14 are switched from the high level to the low level. Hence, the receive digital signal RS output by the CMOS differential receiver 4 is switched from the high level to the low level. Thus, the CMOS differential receiver 4 substantially receives the digital transmit signal TS.

As described above, in the conventional electronic device shown in FIG. 1, complementary signal energy is supplied to the signal lines 1 and 2 from the CMOS differential driver 3 when the digital transmit signal TS changes, so that the complementary digital transmit signals CS and /CS derived from the digital transmit signal TS are transferred to the CMOS differential receiver 4 via the signal lines 1 and 2.

When the signal lines 1 and 2 are equal-length parallel lines so that the coupling coefficient is close to 1, the signal lines 1 and 2 form a transfer path in which the electromagnetic field is approximately closed. Hence, the complementary digital transmit signals CS and /CS are transferred in a mode close to a TEM (Transversed Electromagnetic Mode), and thus speeding up of signal transfer can be achieved.

However it is to be noted that, when the complementary digital transmit signals CS and /CS are transferred to the CMOS differential receiver 4 from the CMOS differential driver 3, complementary signal energy supplied to the signal lines 1 and 2 from the CMOS differential driver 3 are supplied from the power supply line. Hence, in order to further speed up the signal transfer, it is required to supply the complementary signal energy to the CMOS differential driver 3 from the power supply line at a higher speed. However, in this regard, there is no proposal.

SUMMARY OF THE INVENTION

It is an object of the present invention to provide an electronic device or apparatus equipped with a CPU and a plurality of memories in which a signal can be transferred between the CPU and the memories at a higher speed.

The above object of the present invention is achieved by an electronic device comprising: a wiring board; at least one pair of signal lines that are provided on the wiring board in parallel and have equal lengths; a chip that is mounted on the wiring board and includes at least one differential driver which outputs complementary digital transmit signals to the above-mentioned at lest one of the pair of lines; and a pair of power system lines through which first and second power supply voltages are supplied to the above-mentioned at least one differential driver, said pair of power system lines being parallel to each other and having an equal length.

When a transmit digital signal applied to the differential driver changes its level, resultant complementary signal energy which changes the levels of input terminals of a differential receiver connected to the pair of signal lines is supplied thereto by the differential driver. The above complementary signal energy is supplied to the differential driver via the power system lines.

The power system lines are parallel to each other and have an equal length, and thus function as a transfer path in which the electromagnetic field is approximately closed with respect to the complementary signal energy to be supplied to the differential driver. Hence, the complementary signal energy to be supplied to the differential driver can be transferred thereto at a high speed without any attenuation. Thus, the complementary digital transmit signals can be transferred over the pair of signal lines at a high speed.

The above-mentioned objects of the present invention are also achieved by an electronic device comprising: a wiring board; at least one signal line formed on the wiring board; a chip that is mounted on the wiring board and includes a driver which outputs a non-differential digital transmit signal; and a first capacitor connected between power system lines formed on the chip via which lines first and second power supply voltages are supplied to the driver, the power system lines being parallel to each other and having an equal length.

With the above configuration, before complementary signal energy is supplied to the differential driver via the power system lines, complementary signal energy can be supplied thereto from the first capacitor. Hence, the transmit digital signal can be transferred over the signal line at a high speed.

The above-mentioned objects of the present invention are also achieved by an electronic device comprising: a wiring board having first and second surfaces; a CPU mounted on a chip mounting area provided on a central position of the first surface of the wiring board; memories mounted on at least one of the first and second surfaces of the wiring board; and first, second, third and fourth groups of respective parallel signal lines having an equal length. The first, second, third and fourth groups respectively extend on the first surface from sides of the chip mounting area in four orthogonal directions, penetrate through the wiring board, and extend on the second surface toward a center thereof. The memories located at an equal distance from connections between terminals of the CPU and the first through fourth groups of signal lines along the four orthogonal distances are of an identical type and are connected to corresponding groups of signal lines.

Hence, it is possible to minimize the lengths of the signal lines of an electronic device which is formed by a single wiring board and is required to connect a CPU and memories accessed thereby by means of equal-length parallel lines. Hence, signals can be transferred between the CPU and the memories at a high speed.

The above-mentioned objects of the present invention are also achieved by an electronic device comprising: first and second wiring boards respectively having first and second surfaces; a CPU mounted on a chip mounting area provided on a central position of the first surface of the first wiring board; memories mounted on at least one of the first and second surfaces of the wiring board; and first, second, third and fourth groups of respective parallel signal lines having an equal length. The first, second, third and fourth groups respectively extend on the first surface from sides of the chip mounting area in four orthogonal directions and extending on the second surface toward a center thereof. The memories located at an equal distance from connections between terminals of the CPU and the first through fourth groups of signal lines along the four orthogonal distances are of an identical type and are connected to corresponding groups of signal lines.

Hence, it is possible to minimize the lengths of the signal lines of an electronic device which is formed by two wiring boards and is required to connect a CPU and memories accessed thereby by means of equal-length parallel lines. Hence, signals can be transferred between the CPU and the memories at a high speed.

The aforementioned objects of the present invention are achieved by an electronic device comprising: first and second semiconductor substrates respectively having first and second surfaces; a CPU mounted on a chip mounting area provided on a central position of the first surface of the first semiconductor substrate; memories mounted on at least one of the first and second surfaces of the semiconductor substrate; and first, second, third and fourth groups of respective parallel signal lines having an equal length. The first, second, third and fourth groups respectively extend on the first surface from sides of the chip mounting area in four orthogonal directions and extend on the second surface toward a center thereof. The memories located at an equal distance from connections between terminals of the CPU and the first through fourth groups of signal lines along the four orthogonal distances are of an identical type and are connected to corresponding groups of signal lines.

Hence, it is possible to minimize the lengths of the signal lines of an electronic device which is formed by two semiconductor substrates and is required to connect a CPU and memories accessed thereby by means of equal-length parallel lines. Hence, signals can be transferred between the CPU and the memories at a high speed.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to FIGS. 2 through 48, of first through twenty-seventh embodiments of the present invention.

Figure 2:
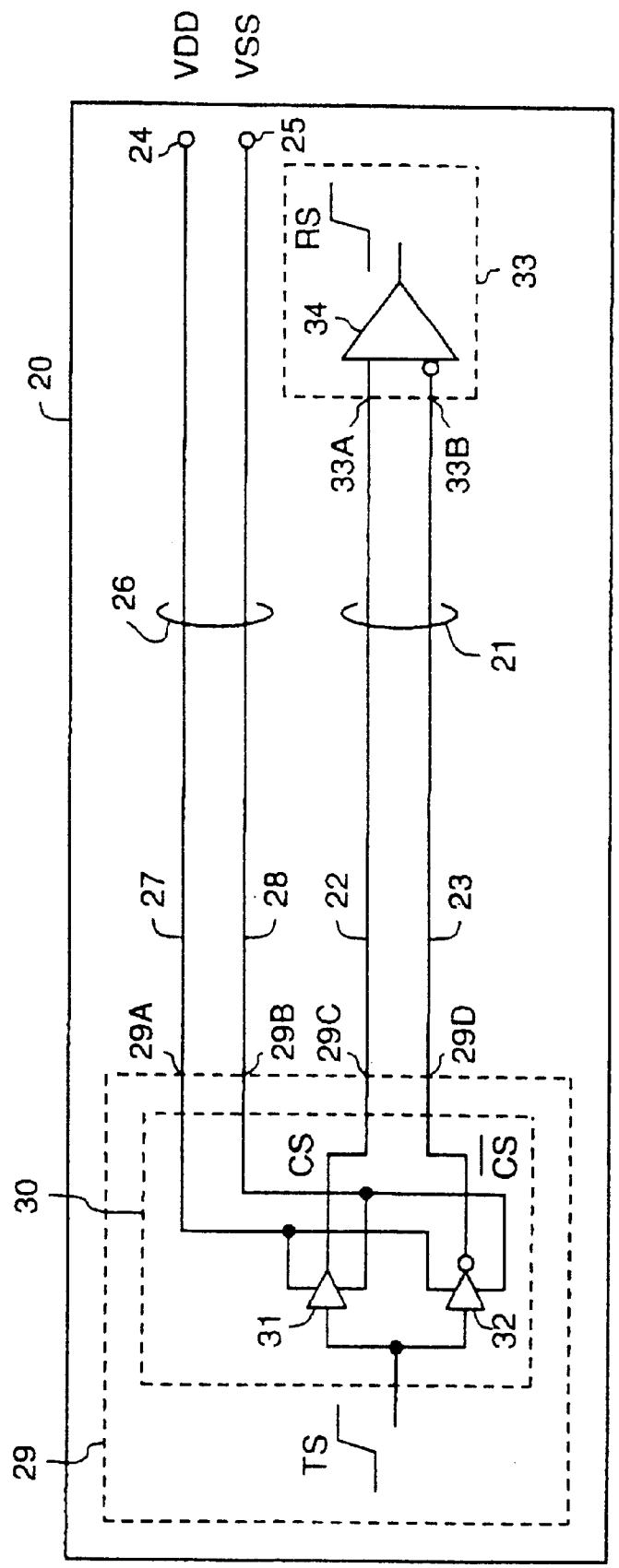
FIG. 2 is a schematic diagram of a first embodiment of the present invention.
Figure 3:
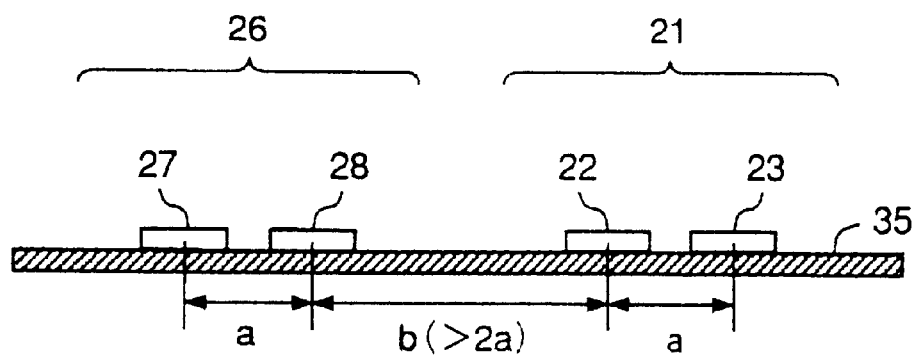
FIG. 3 is a schematic cross-sectional view of a first structure of a pair of signal lines and a pair of power supply and ground lines employed in the first embodiment of the present invention.
Figure 4:
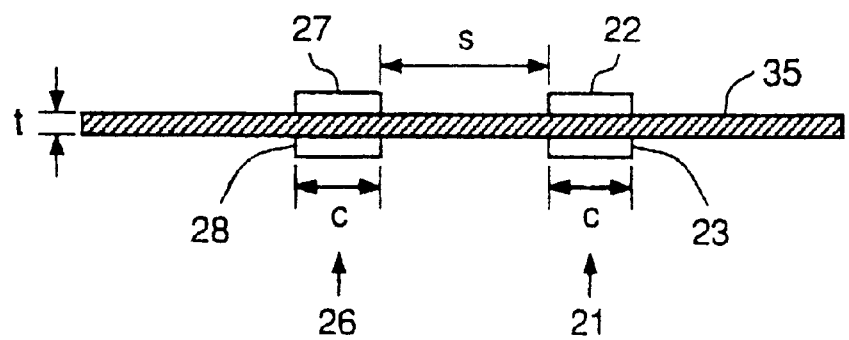
FIG. 4 is a schematic cross-sectional view of a second structure of the pair of signal lines and the par of power supply and ground lines employed in the first embodiment of the present invention.

First Embodiment
(FIGS. 2 Through 4)

FIG. 2 is a schematic diagram illustrating a first embodiment of the present invention, which has a pair of signal lines having no branch and includes a transfer circuit transferring signals in one way.

The configuration shown in FIG. 2 includes a wiring board 20, and a pair 21 of signal lines 22 and 23 formed of equal-length parallel lines having a large coupling coefficient. A power supply voltage input terminal 24 is formed on the wiring board 20 and receives a positive power supply voltage VDD. A ground voltage input terminal 25 is formed on the wiring board 20 and receives a ground voltage VSS. A pair 26 of a power supply line 27 and a ground line 28 is formed of equal-length parallel lines having a large coupling coefficient. The pair 26 of power supply and ground lines has the same characteristic impedance value as that of the pair 21 of signal lines. Hereinafter, the power supply line and the ground line may be referred to as power system lines as a whole.

An integrated circuit chip (hereinafter referred to as an IC chip) 29 is mounted on the wiring board 20, and has a power supply voltage input terminal 29A connected to the power supply line 27, a ground voltage input terminal 29B connected to the ground line 28, and signal output terminals 29C and 29D connected to the signal lines 22 and 23, respectively. The IC chip 29 has a CMOS differential driver 30, which converts the digital transmit signal TS into the complementary digital transmit signals CS and /CS, and outputs the signals CS and /CS to ends of the signal lines 22 and 23 via the signal output terminals 29C and 29D.

Figure 1:
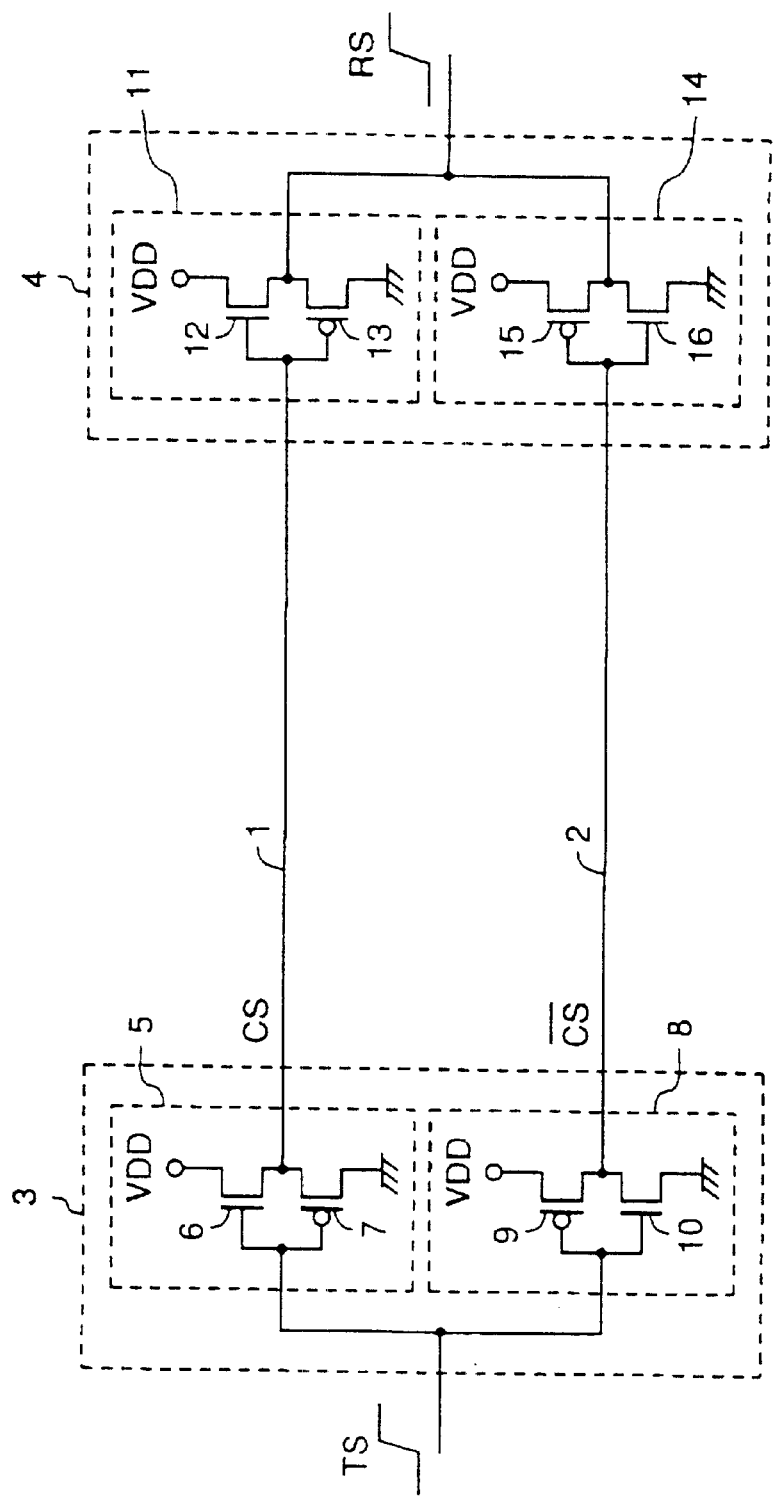
FIG. 1 is a circuit diagram of a conventional electronic device.

The CMOS differential driver 30 includes a CMOS driver 31 having the same configuration as that of the CMOS driver 5 shown in FIG. 1, and a CMOS inverter 32 having the same configuration as that of the CMOS inverter 8 shown in FIG. 1.

An IC chip 33 is mounted on the wiring board 33, and has signal input terminals 33A} and 33B respectively connected to the other ends of the signal lines 22 and 23. The IC chip 33 includes a CMOS differential receiver 34, which receives the complementary digital transmit signals CS and /CS transferred over the signal lines 22 and 23 and outputs the receive digital signal RS corresponding to the digital transmit signal TS to an internal circuit (not shown). The CMOS differential driver 34 has the same configuration as that of the CMOS differential receiver 4 shown in FIG. 1.

It is possible to set the characteristic impedance value of the signal link pair 21 to an arbitrary value between 20Ω and 100Ω. However, since the gates of the CMOS differential receiver 34 are CMOS gates (CMOS driver and CMOS inverter), the complementary digital transmit signals CS and /CS transferred over the pair 21 of signal lines are reflected thereon, and the reflected complementary digital transmit signals CS and /CS are propagated through the pair 21 of signal lines in the reverse direction and reach the CMOS differential driver 30.

Thus, the ON resistance of the CMOS differential driver 30 is made to match the characteristic impedance value of the pair 21 of signal lines so that the reflected complementary digital transmit signals CS and /CS propagated through the pair 21 of signal lines in the reverse direction. With the above arrangement, it is possible to prevent the reflected complementary digital transmit signals CS and /CS from being reflected on the CMOS differential driver 30 again and prevent the forward complementary digital transmit signals CS and /CS from being disturbed at any timing.

FIG. 3 is a schematic cross-sectional view of a first structure of the pair 21 of signal lines and the pair 26 of power supply and ground lines. In the first structure, the signal lines 22 and 23, the power supply line 27 and the ground line 28 are formed in parallel on an identical surface of an insulating board 35 forming the wiring board 20 so that the pair 21 of signal lines and the pair 26 are arranged in a coplanar wiring formation. In the vicinity of the pair 21 of signal lines and the pair 26 of power supply and ground lines, there are no power supply line and ground line which are not paired.

It will now be assumed that 'a' denotes the distance between the center of the signal line 22 and the signal line 23 in the width direction and the distance between the center of the power supply line 27 and the center of the ground line 28 in the width direction and that 'b' denotes the interval between the pair 21 of signal lines and the pair 26 of power supply and ground lines. When it is designed to satisfy b>2a, it is possible to make both the coupling coefficient between the signal lines 22 and 23 and the coupling coefficient between the power supply line 27 and the ground line 28 approximately equal to 1. Hence, the pair 21 of signal lines and the pair 26 of power supply and ground lines form transfer lines in which the electromagnetic field is approximately closed.

FIG. 4 is a schematic cross-sectional view of a second structure of the pair 21 of signal lines and the pair 26 of power supply and ground lines. In the second structure, the signal line 22 and the signal line 23 face each other through the insulating board 35 and the power supply line 27 and the ground line 28 face each other therethrough, so that the pair 21 of signal lines and the pair 26 of power supply and ground lines are arranged in a stacked wiring formation. In the vicinity of the pair 21 of signal lines and the pair 26 of power supply and ground lines, there are no power supply line and ground line which lines are not paired.

It will now be assumed that 't' denotes the thickness of the insulating board 35, 'c' denotes the widths of the signal lines 22 and 23, the power supply line 27 and the ground line 28, and 's' denotes the interval between the adjacent pairs of lines. When it is designed to satisfy s/(t+c)>2, it is possible to make both the coupling coefficient between the signal lines 22 and 23 and the coupling coefficient between the power supply line 27 and the ground line 28 approximately equal to 1. Hence, the pair 21 of signal lines and the pair 26 of power supply and ground lines form transfer lines in which the electromagnetic field is approximately closed. The pair 26 of power supply and ground lines is not necessary to be equal in length to the pair 21 of signal lines and be parallel thereto.

In the first embodiment of the present invention thus configured, when the digital transmit signal TS switches from the low level to the high level, positive signal energy which changes the in-phase input terminal of the CMOS differential receiver 34 from the low level to the high level is supplied to the signal line 22 from the CMOS driver 31 and is transferred over the signal line 22 towards the in-phase input terminal of the CMOS differential receiver 34. Further, negative signal energy which changes the anti-phase input terminal of the CMOS differential receiver 34 from the high level to the low level is supplied to the signal line 23 from the CMOS inverter 32 and is transferred over the signal line 23 towards the anti-phase input terminal of the CMOS differential receiver 34.

In contrast, when the digital transmit signal TS switches from the high level to the low level, negative signal energy which changes the in-phase input terminal of the CMOS differential receiver 34 from the high level to the low level is supplied to the signal line 22 from the CMOS driver 31 and is transferred over the signal line 22 towards the in-phase input terminal of the CMOS differential driver 34. Further, positive signal energy which changes the anti-phase input terminal of the CMOS differential receiver 34 from the low level to the high level is supplied to the signal line 23 from the CMOS inverter 32 and is transferred over the signal line 23 towards the anti-phase input terminal of the CMOS differential receiver 34.

As described above, according to the first embodiment of the present invention, the complementary signal energy is transferred over the signal lines 22 and 23 towards the CMOS differential receiver 34 when the digital transmit signal TS changes. In this case, it is to be noted that the signal lines 22 and 23 are paired equal-length parallel lines having a large coupling coefficient. Hence, the signal lines 22 and 23 form a transfer path in which the electromagnetic field is approximately closed. Thus, the complementary signal energy can be transferred with reduced loss, so that the complementary signal energy can be transferred over the signal lines 22 and 23 in a mode close to the TEM.

Since the power supply line 27 and the ground line 28 are paired equal-length parallel lines having a large coupling coefficient, the power supply line 27 and the ground line 28 form a transfer path in which the electromagnetic field is approximately closed. Thus, even when the pair 26 of power supply and ground lines is long, the complementary signal energy necessary to transfer the complementary digital transmit signals CS and /CS from the CMOS differential driver 30 to the CMOS differential receiver 34 can be transferred, with reduced loss, to the CMOS differential driver 30 from the power supply voltage input terminal 24 and the ground voltage input terminal 25 in a mode close to the TEM.

In addition to the above, the pair 26 of power supply and ground lines has the same characteristic impedance value as that of the pair 21 of signal lines and thus matches the pair 21 thereof on the characteristic impedance basis. Hence, complementary signal energy consumed on the pair 21 of signal lines matches the complementary signal energy supplied from the power voltage input terminal 24 and the ground voltage input terminal 25 to the CMOS differential driver 30. Thus, the complementary signal energy can be transferred with reduced loss.

Thus, according to the first embodiment of the present invention, it is possible to prevent the waveforms of the complementary digital transmit signals CS and /CS from being deformed and to thus transfer, at a speed close to that of light, the complementary digital transmit signals CS and /CS over the pair 21 of signal lines from the CMOS differential driver 30 to the CMOS differential receiver 34.

It is preferable that a power supply line and a ground line over which the power supply voltage and the ground voltage are applied to the CMOS driver 30 built in the IC chip 29 are formed of paired equal-length parallel lines. In this case, it is possible to further speed up a transfer of the complementary digital transmit signals CS and /CS over the pair 21 of signal lines from the CMOS differential driver 30 to the CMOS differential receiver 34.

Furthermore, according to the first embodiment of the present invention, the IC chip 33 is equipped with the differential receiver 34 as a receiver. The differential receiver 34 does not respond to in-phase noise and noise superimposed on one of the signal lines 22 and 23, but responds to only the complementary digital transmit signals CS and /CS. Hence, the transmission system has a large noise margin, and the signal voltage can be reduced. For example, although the smallest amplitude in the existing circuits is equal to 0.8 V–1.5 V, the first embodiment of the present invention can reduce the smallest amplitude down to about 0.1 V. Hence, it is possible to decrease the rising and falling slopes and achieve a transfer of high-frequency signals and reduction in power consumption.

Figure 5:
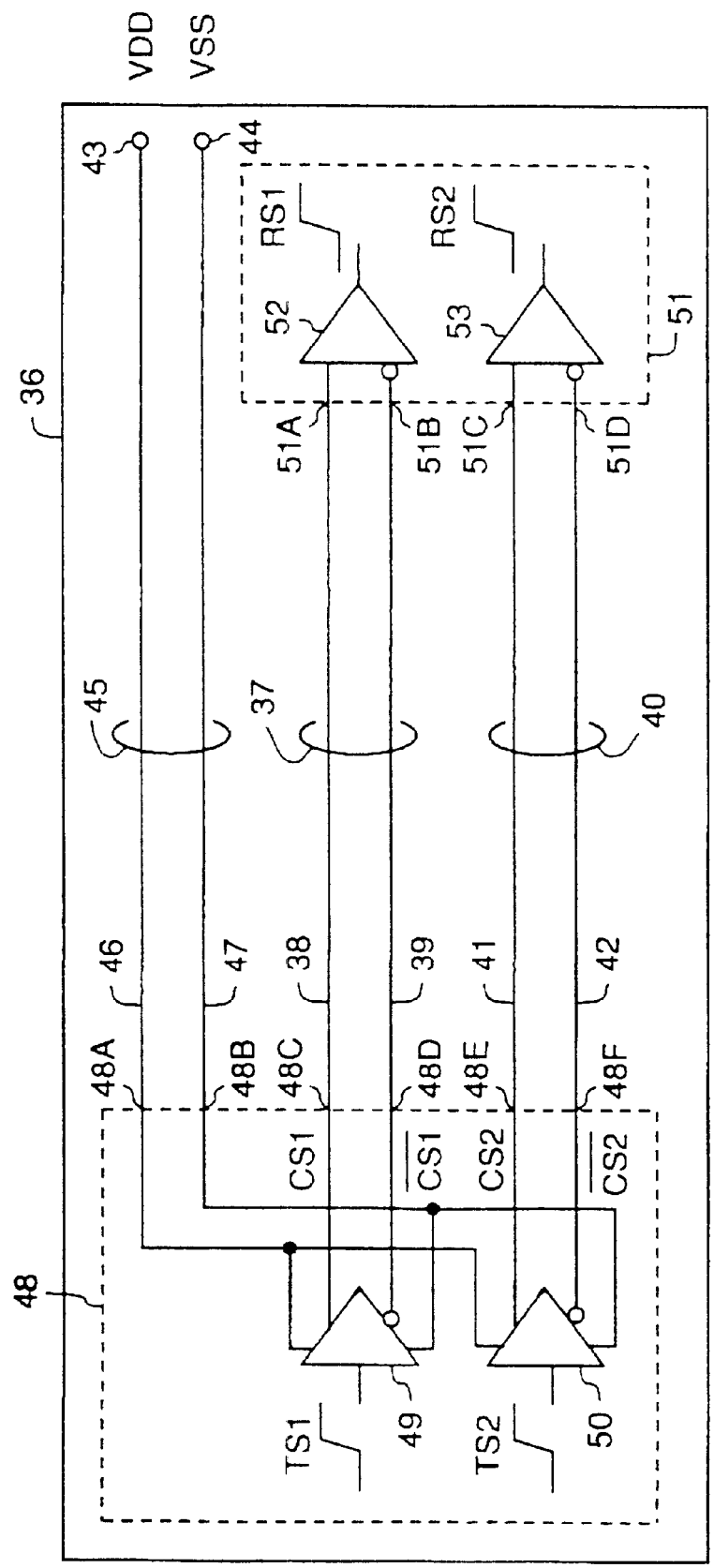
FIG. 5 is a schematic diagram of a second embodiment of the present invention.
Figure 6:
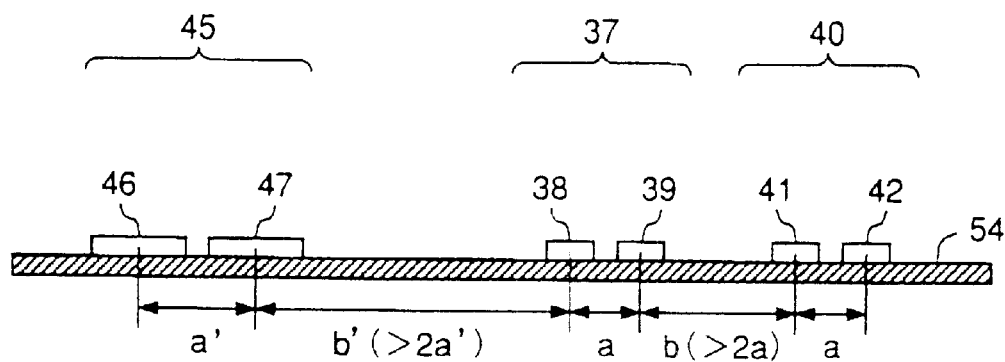
FIG. 6 is a schematic cross-sectional view of a first structure of a pair of signal lines and a pair of power supply and ground lines employed in the second embodiment of the present invention.
Figure 7:
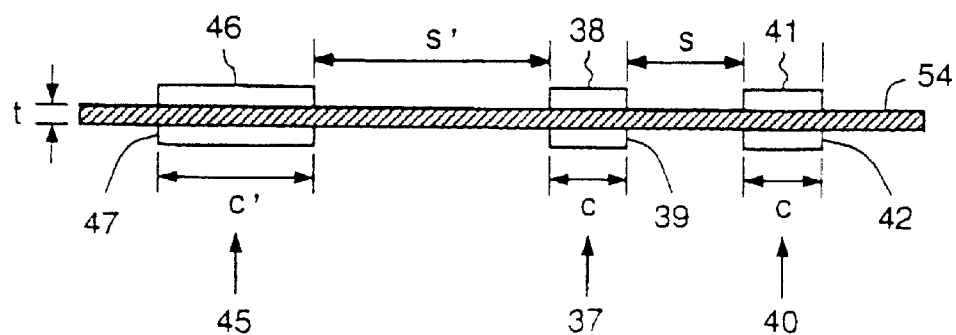
FIG. 7 is a schematic cross-sectional view of a second structure of the pair of signal lines and the pair of power supply and ground lines employed in the second embodiment of the present invention.

Second Embodiment
(FIGS. 5–7)

FIG. 5 is a schematic diagram of a second embodiment of the present invention, which has two pairs of signal lines having no branch and includes a transfer circuit which transfers signals in one way.

The configuration shown in FIG. 5 includes a wiring board 36, a pair 37 of signal lines 38 and 39 that is formed of equal-length parallel lines having a large coupling coefficient, and a pair 40 of signal lines 41 and 42 that is formed of equal-length parallel lines having a large coupling coefficient. The pairs 37 and 40 of signal lines have the same coupling coefficient and characteristic impedance value, and are equal to and parallel to each other.

A power supply voltage input terminal 43 is formed on the wiring board 36 and receives the positive power supply voltage VDD. A ground voltage input terminal 44 is formed on the wiring board 36 and receives the ground voltage VSS. A pair 45 of a power supply line 46 and a ground line 47 is formed of equal-length parallel lines having a large coupling coefficient.

The circuit is designed to satisfy a condition that Z1=Z0/2 where Z0 denotes the characteristic impedance values of the pairs 37 and 40 of signal lines, Z1 denotes the characteristic impedance value of the pair 45 of power supply and ground lines, and 2 denotes the number of pairs of signal lines. In case where the condition Z1=Z0/2 is not satisfied, it is preferable to adjust the circuit to obtain a condition as close to the above condition as possible.

An IC chip 48 is mounted on the wiring board 36, and has a power supply voltage input terminal 48A connected to a power supply line 46 and a ground voltage input terminal 48B connected to a ground line 47. The IC chip 48 has signal output terminals 48C, 48D, 48E and 48F respectively connected to ends of the signal lines 38, 39, 41 and 42.

A CMOS differential driver 49 of the IC chip 48 converts a digital transmit signal TS1 supplied from an internal circuit (not shown) into complementary digital transmit signals CS1 and /CS1, and outputs the signals CS1 and /CS1 to the signal lines 38 and 39 via the signal output terminals 48C and 48D, respectively. The CMOS differential driver 49 has the same configuration as that of the CMOS differential driver 3 shown in FIG. 1.

A CMOS differential driver 50 of the IC chip 48 converts a digital transmit signal TS2 supplied from the internal circuit into complementary digital transmit signals CS2 and /CS2, and outputs the signals CS2 and /CS2 to the signal lines 41 and 42 via the signal output terminals 48E and 48F, respectively. The CMOS differential driver 50 has the same configuration as that of the CMOS differential driver 3 shown in FIG. 1.

An IC chip 51 is mounted on the wiring board 36 and has signal input terminals 51A, 51B, 51C and 51D respectively connected to the other ends of the signal lines 38, 39, 41 and 42.

The IC chip 51 has a CMOS differential receiver 52, which receives the complementary digital transmit signals CS1 and /CS1 transferred over the signal lines 38 and 39 and outputs a receive digital signal RS1 corresponding to the digital transmit signal TS1 to an internal circuit (not shown). The CMOS differential receiver 52 has the same configuration as that of the CMOS differential receiver 4 shown in FIG. 1.

The IC chip 51 has a CMOS differential receiver 53, which receives the complementary digital transmit signals CS2 and /CS2 transferred over the signal lines 41 and 42 and outputs a receive digital signal RS2 corresponding to the digital transmit signal TS2 to an internal circuit (not shown). The CMOS differential receiver 53 has the same configuration as that of the CMOS differential receiver 4 shown in FIG. 1.

It is possible to set the characteristic impedance value of the signal link pairs 37 and 40 to an arbitrary value between 20Ω and 100Ω. However, since the gates of the CMOS differential receivers 52 and 53 are CMOS gates (CMOS drivers and CMOS inverters), the complementary digital transmit signals CS1 and /CS1 and CS2 and /CS2 transferred over the pairs 37 and 40 of signal lines are respectively reflected thereon, and the reflected complementary digital transmit signals CS1 and /CS1 and CS2 and /CS2 are propagated through the pairs 37 and 40 of signal lines in the reverse direction and reach the CMOS differential drivers 49 and 50.

Thus, the ON resistance values of the CMOS differential drivers 49 and 50 are made to match the characteristic impedance values of the pairs 37 and 40 of signal lines so that the reflected complementary digital transmit signals CS1 and /CS1 and CS2 and /CS2 propagated through the pairs 37 and 40 of signal lines in the reverse direction. With the above arrangement, it is possible to prevent the reflected complementary digital transmit signals CS1 and /CS1 and CS2 and /CS2 from being reflected on the CMOS differential drivers 37 and 40 again and prevent the forward complementary digital transmit signals CS1 and /CS1 and CS2 and /CS2 from being disturbed at any timing.

FIG. 6 is a schematic cross-sectional view of a first structure of the pairs 37 and 40 of signal lines and the pair 45 of power supply and ground lines. In the first structure, the signal lines 38, 39, 41 and 42, the power supply line 46 and the ground line 47 are formed in parallel on an identical surface of an insulating board 54 forming the wiring board 36 so that the pairs 37 and 40 of signal lines and the pair 45 of power supply and ground lines are arranged in a coplanar wiring formation. In the vicinity of the pairs 37 and 40 of signal lines and the pair 45 of power supply and ground lines, there are no power supply line and ground line which are not paired.

It will now be assumed that 1) 'a' denotes the distance between the center of the signal line 38 and the signal line 39 in the width direction and the distance between the center of the signal line 41 and the signal line 42, 2) 'a'' denotes the distance between the power supply line 46 and the ground line 47 in the width direction, 3) 'b' denotes the interval between the pairs 37 and 40 of signal lines, and 4) 'b'' denotes the interval between the signal line part 37 and the pair 45 of power supply and ground lines. When it is designed to satisfy b>2a and b'>2a', it is possible to make the coupling coefficient between the signal lines 38 and 39, the coupling coefficient between the signal lines 41 and 42, and the coupling coefficient between the power supply line 46 and the ground line 47 approximately equal to 1. Hence, the pairs 37 and 40 of signal lines and the pair 45 of power supply and ground lines form transfer lines in which the electromagnetic field is approximately closed.

FIG. 7 is a schematic cross-sectional view of a second structure of the pairs 37 and 40 of signal lines and the pair 45 of power supply and ground lines. In the second structure, the signal line 38 and the signal line 39 face each other through the insulating board 35, the signal lines 41 and 42 face each other therethrough, and the power supply line 46 and the ground line 47 face each other therethrough, so that the pairs 37 and 40 of signal lines and the pair 45 of power supply and ground lines are arranged in a stacked wiring formation. In the vicinity of the pairs 37 and 40 of signal lines and the pair 45 of power supply and ground lines, there are no power supply line and ground line which lines are not paired.

It will now be assumed that 't' denotes the thickness of the insulating board 54, 'c' denotes the widths of the signal lines 38, 39, 41 and 42, 'c'' denotes the power supply line 46 and the ground line 47, 's' denotes the interval between the pairs 37 and 38 of signal lines, and 's'' denotes the distance between the pair 37 of signal lines and the pair 45 of power supply and ground lines. When it is designed to satisfy $s/(t+c)>2$ and $s'/(t+c')>2$, it is possible to make both the coupling coefficients between the signal lines 38 and 39 and between the signal lines 41 and 42, and the coupling coefficient between the power supply line 46 and the ground line 47 approximately equal to 1. Hence, the pairs 37 and 40 of signal lines and the pair 45 of power supply and ground lines form transfer lines in which the electromagnetic field is approximately closed. The pair 45 of power supply and ground lines is not necessary to be equal in length to the pairs 37 and 40 of signal lines and be parallel thereto but may be formed in an arbitrary direction.

In the second embodiment of the present invention thus configured, when the digital transmit signal TS1 switches from the low level to the high level, positive signal energy which changes the in-phase input terminal of the CMOS differential receiver 52 from the low level to the high level is supplied to the signal line 38 from the in-phase output terminal the CMOS driver 49 and is transferred over the signal line 38 towards the in-phase input terminal of the CMOS differential receiver 52. Further, negative signal energy which changes the anti-phase input terminal of the CMOS differential receiver 52 from the high level to the low level is supplied to the signal line 39 from the anti-phase output terminal of the CMOS inverter 49 and is transferred over the signal line 39 towards the anti-phase input terminal of the CMOS differential receiver 52.

When the digital transmit signal TS2 switches from the low level to the high level, positive signal energy which changes the in-phase input terminal of the CMOS differential receiver 53 from the low level to the high level is supplied to the signal line 41 from the in-phase output terminal the CMOS driver 50 and is transferred over the signal line 41 towards the in-phase input terminal of the CMOS differential receiver 53. Further, negative signal energy which changes the anti-phase input terminal of the CMOS differential receiver 53 from the high level to the low level is supplied to the signal line 42 from the anti-phase output terminal of the CMOS inverter 50 and is transferred over the signal line 42 towards the anti-phase input terminal of the CMOS differential receiver 53.

In contrast, when the digital transmit signal TS1 switches from the high level to the low level, negative signal energy which changes the in-phase input terminal of the CMOS differential receiver 52 from the high level to the low level is supplied to the signal line 38 from the in-phase output terminal of the CMOS driver 49 and is transferred over the signal line 38 towards the in-phase input terminal of the CMOS differential driver 52. Further, positive signal energy which changes the anti-phase input terminal of the CMOS differential receiver 52 from the low level to the high level is supplied to the signal line 39 from the anti-phase output terminal of the CMOS inverter 49 and is transferred over the signal line 39 towards the anti-phase input terminal of the CMOS differential receiver 52.

When the digital transmit signal TS2 switches from the high level to the low level, negative signal energy which changes the in-phase input terminal of the CMOS differential receiver 53 from the high level to the low level is supplied to the signal line 41 from the in-phase output terminal of the CMOS driver 50 and is transferred over the signal line 41 towards the in-phase input terminal of the CMOS differential driver 53. Further, positive signal energy which changes the anti-phase input terminal of the CMOS differential receiver 53 from the low level to the high level is supplied to the signal line 42 from the anti-phase output terminal of the CMOS inverter 50 and is transferred over the signal line 41 towards the anti-phase input terminal of the CMOS differential receiver 53.

As described above, according to the second embodiment of the present invention, the complementary signal energy is transferred over the signal lines 38 and 39 and the signal lines 41 and 42 towards the CMOS differential receivers 52 and 53 when the digital transmit signals TS1 and TS2 changes. In this case, it is to be noted that the signal lines 38 and 38 and the signal lines 41 and 42 are respectively pairs of equal-length parallel lines having a large coupling coefficient. Hence, the signal lines 22 and 23 and signal lines 41 and 42 form respective transfer paths in which the electromagnetic field is approximately closed. Thus, the complementary signal energy can be transferred with reduced loss, so that the complementary signal energy can be transferred over the signal lines 38 and 39 and the signal lines 41 and 42 in a mode close to the TEM.

Since the power supply line 46 and the ground line 47 form a pair of equal-length parallel lines having a large coupling coefficient, the power supply line 46 and the ground line 47 form a transfer path in which the electromagnetic field is approximately closed. Thus, even when the pair 45 of power supply and ground lines is long, the complementary signal energy necessary to transfer the complementary digital transmit signals CS1 and /CS1 and CS2 and /CS2 to the CMOS differential receivers 51 and 52 can be transferred, with reduced loss, to the CMOS differential drivers 49 and 50 from the power supply voltage input terminal 43 and the ground voltage input terminal 44 in a mode close to the TEM.

In addition to the above, the second embodiment of the present invention is designed to satisfy Z1=Z0/2 where Z0 denotes the characteristic impedance of the pairs 37 and 40 of signal lines and Z1 denotes the characteristic impedance of the pair 45 of power supply and ground lines. Hence, the pair 26 of power supply and ground lines matches the pair 21 of signal lines on the characteristic impedance basis. Hence, complementary signal energy consumed on the pairs 37 and 40 of signal lines matches the complementary signal energy supplied from the power voltage input terminal 43 and the ground voltage input terminal 44 to the CMOS differential drivers 49 and 50. Thus, the complementary signal energy can be transferred with reduced loss.

Thus, according to the second embodiment of the present invention, it is possible to prevent the waveforms of the complementary digital transmit signals CS1 and /CS1 and CS2 and /CS2 from being deformed and to thus transfer, at a speed close to that of light, these complementary digital transmit signals over the pairs 37 and 40 of signal lines from the CMOS differential drivers 49 and 50 to the CMOS differential receivers 52 and 53.

It is preferable that a power supply line and a ground line over which the power supply voltage and the ground voltage are applied to the CMOS drivers 49 and 50 built in the IC chip 48 are formed of paired equal-length parallel lines. In this case, it is possible to further speed up a transfer of the complementary digital transmit signals CS1 and /CS1 and CS2 and /CS2 over the pairs 37 and 40 of signal lines from the CMOS differential drivers 49 and 50 to the CMOS differential receivers 52 and 53.

Furthermore, according to the second embodiment of the present invention, the IC chip 51 is equipped with the differential receivers 52 and 53 as receivers. The differential receiver 52 does not respond to in-phase noise and noise superimposed on one of the signal lines 38 and 39, but responds to only the complementary digital transmit signals CS1 and /CS1. Similarly, the differential receiver 53 does not respond to in-phase noise and noise superimposed on one of the signal lines 41 and 42, but responds to only the complementary digital transmit signals CS2 and /CS2. Hence, the transmission system has a large noise margin, and the signal voltage can be reduced. For example, although the smallest amplitude in the existing circuits is equal to 0.8 V–1.5 V, the first embodiment of the present invention can reduce the smallest amplitude down to about 0.1 V. Hence, it is possible to decrease the rising and falling slopes and achieve a transfer of high-frequency signals and reduction in power consumption.

Figure 8:
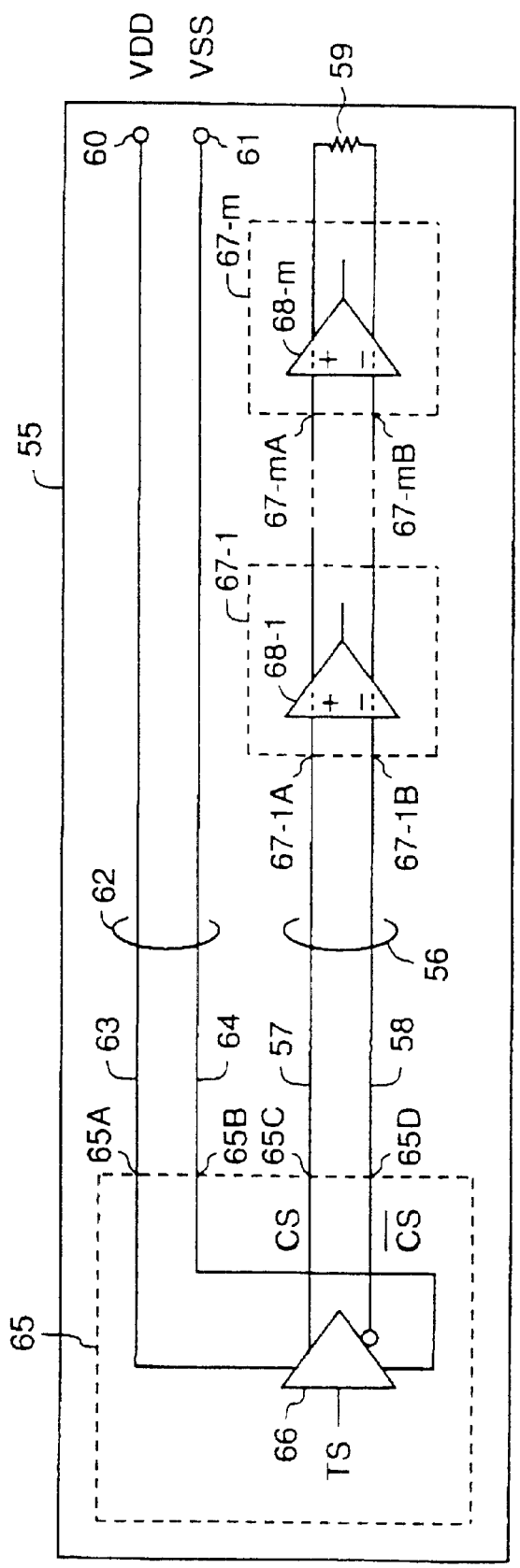
FIG. 8 is a schematic diagram of a third embodiment of the present invention.

Third Embodiment
(FIG. 8)

FIG. 8 is a schematic diagram illustrating a third embodiment of the present invention, which has a pair of signal lines having a branch and includes a transfer circuit transferring signals in one way.

The configuration shown in FIG. 8 includes a wiring board 55, a pair 58 of signal lines, and a terminating resistor 59. The pair 58 consists of equal-length parallel signal lines 57 and 58 which are formed on the wiring board 55 and has a large coupling coefficient. The terminating resistor 59 terminates the signal lines 57 and 58.

A power supply voltage input terminal 60 is formed on the wiring board 55 and receives the positive power supply voltage VDD. A ground voltage input terminal 61 is formed on the wiring board 55 and receives the ground voltage VSS. A pair 62 of a power supply line 63 and a ground line 64 is formed of equal-length parallel lines having a large coupling coefficient. The pair 62 of power supply and ground lines, which is formed on the wiring board 55, has the same characteristic impedance value as that of the pair 56 of signal lines.

The pair 56 of signal lines and the pair 62 of power supply and ground lines may have a coplanar wiring structure as shown in FIG. 3 or a stacked wiring formation as shown in FIG. 4.

An IC chip 65 is mounted on the wiring board 55, and has a power supply voltage input terminal 65A connected to the power supply line 63, a ground voltage input terminal 65B connected to the ground line 64, and signal output terminals 65C and 65D connected to the signal lines 57 and 58, respectively. The IC chip 65 has a CMOS differential driver 66, which converts the digital transmit signal TS supplied from an internal circuit (not shown) into the complementary digital transmit signals CS and /CS, and outputs the signals CS and /CS to ends of the signal lines 57 and 58 via the signal output terminals 65C and 65D. The CMOS differential driver 66 has the same configuration as that of the CMOS differential driver 3 shown in FIG. 1.

IC chips 67-1–67-m of an identical type or different types are mounted on the wiring board 55. The IC chips 67-1–67-m respectively have signal input terminals 67-1A–67-mA connected to the signal line 57, and signal input terminals 67-1B–67-mB connected to the signal line 58. The IC chips 67-1–67-m have respective operational amplifiers 68-1–68-m which receive the complementary signals CS and /CS transferred over the signal lines 57 and 58.

The operational amplifier 68-1 has an in-phase input terminal connected to the signal input terminal 67-1A, and an anti-phase input terminal connected to the signal input terminal 67-1B. The operational amplifier 68-m has an in-phase input terminal connected to the signal input terminal 67-mA and an anti-phase input terminal connected to the signal input terminal 67-mB.

In the third embodiment of the present invention thus configured, when the digital transmit signal TS changes from the low level to the high level, positive signal energy which switches the in-phase input terminals of the operational amplifiers 68-1–68-m from the low level to the high level is supplied to the signal line 57 from the in-phase output terminal of the CMOS differential driver 66, and is transferred over the signal line 57 toward the in-phase input terminals of the operational amplifiers 68-1–68-m. Further, negative signal energy which switches the anti-phase input terminals of the operational amplifiers 68-1–68-m from the high level to the low level is supplied to the signal line 58 from the anti-phase output terminal of the CMOS differential driver 66 and is transferred over the signal line 58 toward the anti-phase input terminals of the operational amplifiers 68-1–68-m.

In contrast, when the digital transmit signal TS changes from the high level to the low level, negative signal energy which switches the in-phase input terminals of the operational amplifiers 68-1–68-m from the high level to the low level is supplied to the signal line 57 from the in-phase output terminal of the CMOS differential driver 66, and is transferred toward the in-phase output terminals of the operational amplifiers 68-1–68-m. Further, negative signal energy which switches the anti-phase input terminals of the operational amplifiers 68-1–68-m from the low level to the high level is supplied to the signal line 58 from the anti-phase output terminal of the CMOS differential driver 66, and is transferred toward the anti-phase output terminals of the operational amplifiers 68-1–68-m.

The input impedance values of the operational amplifiers 68-1–68-m are as high as more than 1000 times the characteristic impedance value (20Ω–100Ω) of the pair 56 of signal lines. Hence, the complementary signal energy transferred over the pair 56 of signal lines is hardly absorbed in the operational amplifiers 68-1–68-m and reaches the terminating resistor 59 without substantial loss. Then, the terminating resistor 59 consumes the complementary signal energy as heat. Hence, a reflection of the complementary signal energy does not occur, and the complementary digital transmit signals CS and /CS can normally pass through the operational amplifiers 68-1–68-m.

According to the third embodiment of the present invention, the signal lines 57 and 58 are formed by a pair of equal-length parallel lines having a large coupling coefficient. Hence, the signal lines 57 and 58 form a transmission path in which the electromagnetic field is approximately closed. Thus, the complementary signal energy can be transferred with reduced loss, so that the complementary signal energy can be transferred over the signal lines 57 and 58 in a mode close to the TEM.

Since the power supply line 63 and the ground line 64 are paired equal-length parallel lines having a large coupling coefficient, the power supply line 63 and the ground line 64 form a transfer path in which the electromagnetic field is approximately closed. Thus, even when the pair 62 of power supply and ground lines is long, the complementary signal energy necessary to transfer the complementary digital transmit signals CS and /CS to the operational amplifiers 68-1–68-m can be transferred, with reduced loss, to the CMOS differential driver 66 from the power supply voltage input terminal 60 and the ground voltage input terminal 61 in a mode close to the TEM.

In addition to the above, the pair 62 of power supply and ground lines has the same characteristic impedance value as that of the pair 56 of signal lines so that the pair 62 matches the pair 56 on he characteristic impedance basis. Hence, the complementary signal energy supplied from the power voltage input terminal 60 and the ground voltage input terminal 61 can be transferred to the CMOS differential driver 66 via the pair 62 of power supply and ground lines with reduced loss.

Thus, according to the first embodiment of the present invention, it is possible to prevent the waveforms of the complementary digital transmit signals CS and /CS from being deformed and to thus transfer, at a speed close to that of light, the complementary digital transmit signals CS and /CS over the pair 21 of signal lines from the CMOS differential driver 30 to the CMOS differential receiver 34.

Hence, according to the third embodiment of the present invention, it is possible to prevent the waveforms of the complementary digital transmit signals CS and /CS from being deformed and to thus transfer, at a speed close to that of light, the complementary digital transmit signals CS and /CS over the pair 56 of signal lines from the CMOS differential driver 66 toward the operational amplifiers 68-1–68-m.

It is preferable that a power supply line and a ground line over which the power supply voltage and the ground voltage are applied to the CMOS driver 66 built in the IC chip 65 are formed of paired equal-length parallel lines. In this case, it is possible to further speed up a transfer of the complementary digital transmit signals CS and /CS over the pair 56 of signal lines from the CMOS differential driver 66 to the operational amplifiers 68-1–68-m.

The above-mentioned configuration of the third embodiment of the present invention is arranged so that the IC chips 67-1–67-m respectively include the operational amplifiers 68-1–68-m as differential receivers. The operational amplifiers 68-1–68-m do not respond to in-phase noise and noise superimposed on one of the signal lines 57 and 58, but respond to only the complementary digital transmit signals CS and /CS. Hence, the transmission system has a large noise margin, and the signal voltage can be reduced. For example, although the smallest amplitude in the existing circuits is equal to 0.8 V–1.5 V, the third embodiment of the present invention can reduce the smallest amplitude down to about 0.1 V. Hence, it is possible to decrease the rising and falling slopes and achieve a transfer of high-frequency signals and reduction in power consumption.

Figure 9:
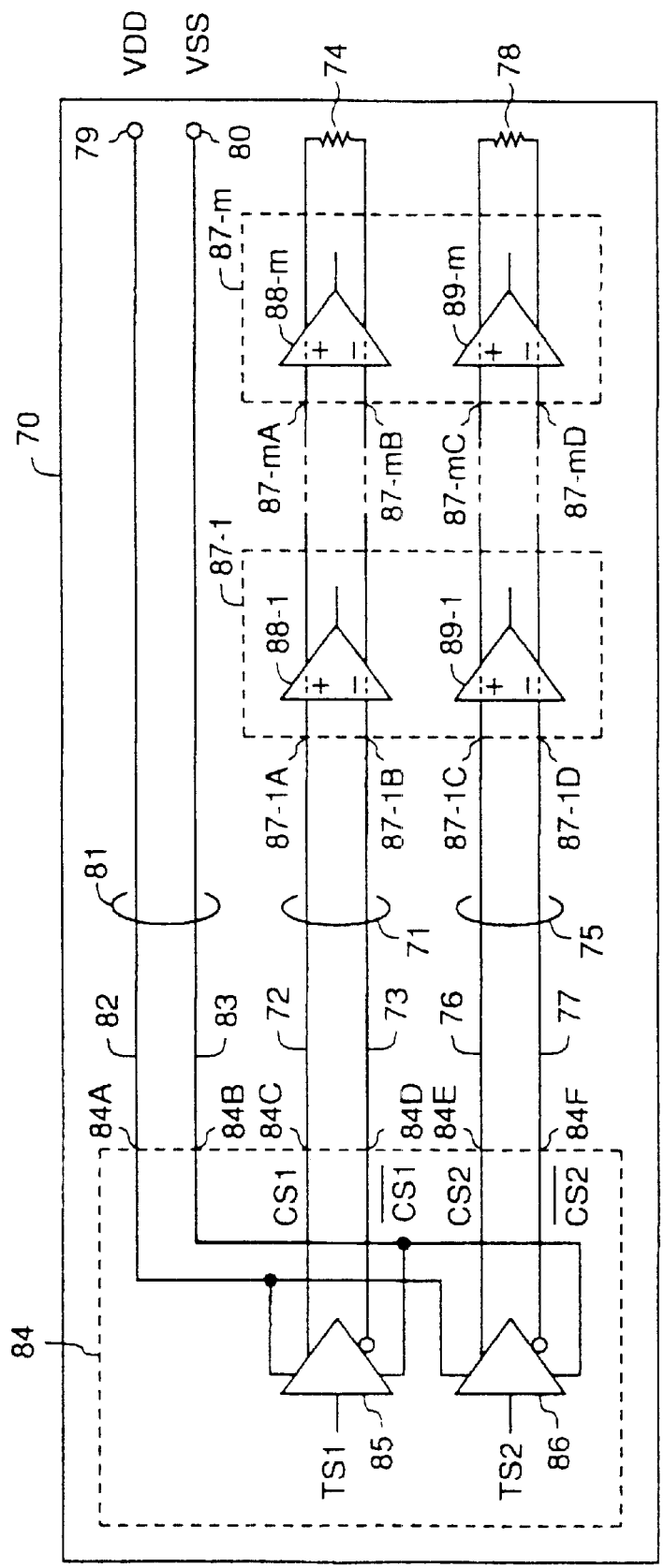
FIG. 9 is a schematic diagram of a fourth embodiment of the present invention.
Figure 10:
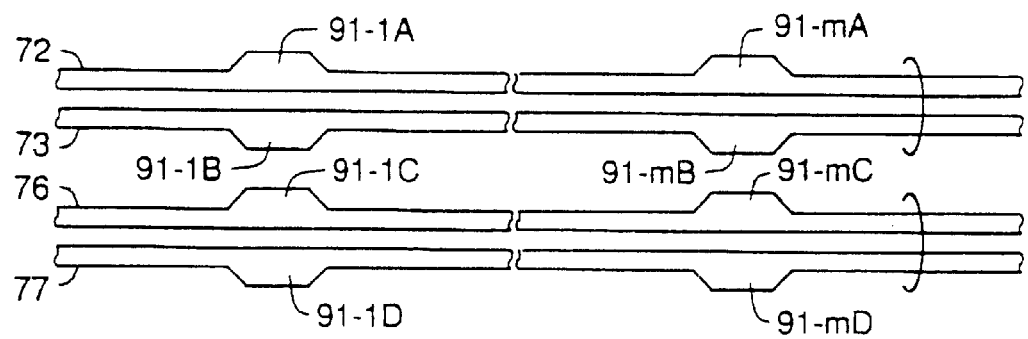
FIG. 10 is a schematic plan view of a structure of an IC chip mounting area employed when the pair of signal lines used in the fourth embodiment of the present invention has a coplanar wiring structure.
Figure 11:
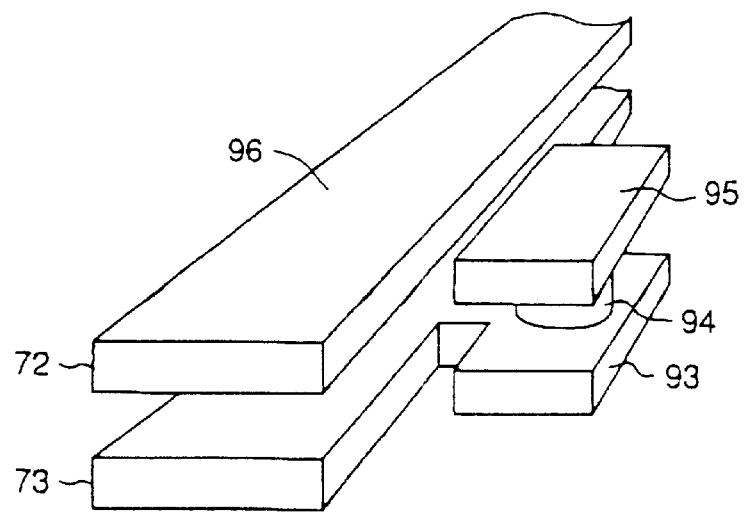
FIG. 11 is a schematic perspective view of part of an IC chip mounting area employed when the pair of signal lines used in the fourth embodiment of the present invention has a stacked wiring structure.

Fourth Embodiment
(FIGS. 9–11)

FIG. 9 is a schematic diagram illustrating a fourth embodiment of the present invention, which has two pairs of signal lines respectively having a branch and includes a transfer circuit transferring signals in one way.

The configuration shown in FIG. 9 includes a wiring board 70 and pairs 71 and 75 of signal lines. The pair 71 consists of equal-length parallel signal lines 72 and 73 which are formed on the wiring board 70 and has a large coupling coefficient. Similarly, the pair 75 consists of equal-length parallel signal lines 76 and 77 which are formed on the wiring board 70 and has a large coupling coefficient. The pairs 71 and 75 of signal lines have the same coupling coefficient, characteristic impedance and equal length as each other, and are parallel to each other.

A power supply voltage input terminal 79 is formed on the wiring board 70 and receives the positive power supply voltage VDD. A ground voltage input terminal 80 is formed on the wiring board 70 and receives the ground voltage VSS. A pair 81 of a power supply line 82 and a ground line 83 is formed of equal-length parallel lines having a large coupling coefficient. The pair 81 of power supply and ground lines is formed on the wiring board 70.

The circuit is designed to satisfy a condition that $Z1=Z0/2$ where $Z0$ denotes the characteristic impedance values of the pairs 71 and 75 of signal lines, $Z1$ denotes the characteristic impedance value of the pair 81 of power supply and ground lines, and 2 denotes the number of pairs of signal lines. In case where the condition $Z1=Z0/2$ is not satisfied, it is preferable to adjust the circuit to obtain a condition as close to the above condition as possible.

The pairs 71 and 75 of signal lines and the pair 81 of power supply and ground lines may have a coplanar wiring structure as shown in FIG. 6 or a stacked wiring formation as shown in FIG. 7.

An IC chip 84 is mounted on the wiring board 70, and has a power supply voltage input terminal 84A connected to the power supply line 82, a ground voltage input terminal 84B connected to the ground line 83, and signal output terminals 84C, 84D, 84E and 84F respectively connected to the signal lines 72, 73, 76 and 77.

The IC chip 84 has a CMOS differential driver 85, which converts the digital transmit signal TS1 into the complementary digital transmit signals CS1 and /CS1, and outputs the signals CS1 and /CS1 to ends of the signal lines 72 and 73 via the signal output terminals 84C and 84D. The CMOS differential driver 85 has the same configuration as that of the CMOS differential driver 3 shown in FIG. 1.

The IC chip 84 has a CMOS differential driver 86, which converts the digital transmit signal TS2 into the complementary digital transmit signals CS2 and /CS2, and outputs the signals CS2 and /CS2 to ends of the signal lines 76 and 77 via the signal output terminals 84E and 84F. The CMOS differential driver 86 has the same configuration as that of the CMOS differential driver 3 shown in FIG. 1.

IC chips 87-1–87-m of an identical type or different types are mounted on the wiring board 70. The IC chips 87-1–87-m respectively have signal input terminals 87-1A–87-mA connected to the signal line 72, and signal input terminals 87-1B–87-mB connected to the signal line 73. Further, the IC chips 87-1–87-m respectively have signal input terminals 87-1C–87-mC connected to the signal line 76, and signal input terminals 87-1D–87-mD connected to the signal line 77.

The IC chips 87-1–87-m respectively have operational amplifiers 88-1–88-m which receive the complementary digital transmit signals CS1 and /CS1 transferred over the signal lines 72 and 73, and operational amplifiers 89-1–89-m which receive the complementary digital transmit signals CS2 and /CS2 transferred over the signal lines 76 and 77.

The operational amplifier 88-1 has an in-phase input terminal connected to the signal input terminal 87-1A, and an anti-phase input terminal connected to the signal input terminal 87-1B. The operational amplifier 88-m has an in-phase input terminal connected to the signal input terminal 87-mA and an anti-phase input terminal connected to the signal input terminal 87-mB.

FIG. 10 is a schematic cross-sectional view of a structure of an IC chip mounting area in which the pairs 71 and 75 of signal lines are formed in a coplanar formation as in the case shown in FIG. 6. In FIG. 10, reference numbers 91-1A, 91-1B, 91-1C and 91-1D indicate pads for connections with the signal input terminals 87-1A, 87-1B, 87-1C and 87-1D of the IC chip 87-1. Reference numbers 91-mA, 91-mB, 91-mC and 91-mD indicate pads for connections with the signal input terminals 87-mA, 87-mB, 87-mC and 87-mD of the IC chip 87-m.

FIG. 11 is a schematic perspective view of a structure of a part of the IC chip area in which the pairs 71 and 75 of signal lines are formed in a stacked formation as in the case shown in FIG. 7. An illustration of an insulating board forming the wiring board 70 is omitted. The structure shown in FIG. 11 has a conductor layer 93 extending from the signal line 73, a conductor layer 94 formed in a contact hole formed in the formation area of the conductor layer 93 of the wiring board 70 (not shown), and a conductor layer 95 formed on the surface of the insulating board and connected to the conductor layer 94. In the structure shown in FIG. 11, the conductor layer 95 serves as a pad for making a connection with the signal input terminal 87-1 of the IC chip 87-1. A portion 96 neighboring the conductor layer 95 of the signal line 72 serves as a pad for making a connection with the signal input terminal 87-1B of the IC chip 87-1.

In the fourth embodiment of the present invention thus configured, when the digital transmit signal TS1 changes from the low level to the high level, positive signal energy which switches the in-phase input terminals of the operational amplifiers 88-1–88-m from the low level to the high level is supplied to the signal line 72 from the in-phase output terminal of the CMOS differential driver 85, and is transferred over the signal line 72 toward the operational amplifiers 88-1–88-m. Further, negative signal energy which switches the anti-phase input terminals of the operational amplifiers 88-1–88-m from the high level to the low level is supplied to the signal line 73 from the anti-phase output terminal of the CMOS differential driver 85 and is transferred over the signal line 73 toward the anti-phase input terminals of the operational amplifiers 88-1–88-m.

When the digital transmit signal TS2 changes from the low level to the high level, positive signal energy which switches the in-phase input terminals of the operational amplifiers 89-1–89-m from the low level to the high level is supplied to the signal line 76 from the in-phase output terminal of the CMOS differential driver 86, and is transferred over the signal line 76 toward the operational amplifiers 89-1–89-m. Further, negative signal energy which switches the anti-phase input terminals of the operational amplifiers 89-1–89-m from the high level to the low level is supplied to the signal line 77 from the anti-phase output terminal of the CMOS differential driver 86 and is transferred over the signal line 77 toward the anti-phase input terminals of the operational amplifiers 89-1–89-m.

In contrast, when the digital transmit signal TS1 changes from the high level to the low level, negative signal energy which switches the in-phase input terminals of the operational amplifiers 88-1–88-m from the high level to the low level is supplied to the signal line 72 from the in-phase output terminal of the CMOS differential driver 85, and is transferred over the signal line 72 toward the in-phase output terminals of the operational amplifiers 88-1–88-m. Further, negative signal energy which switches the anti-phase input terminals of the operational amplifiers 88-1–88-m from the low level to the high level is supplied to the signal line 73 from the anti-phase output terminal of the CMOS differential driver 85, and is transferred over the signal line 73 toward the anti-phase output terminals of the operational amplifiers 88-1–88-m.

When the digital transmit signal TS2 changes from the high level to the low level, negative signal energy which switches the in-phase input terminals of the operational amplifiers 89-–89-m from the high level to the low level is supplied to the signal line 76 from the in-phase output terminal of the CMOS differential driver 86, and is transferred over the signal line 76 toward the in-phase output terminals of the operational amplifiers 89-1–89-m. Further, negative signal energy which switches the anti-phase input terminals of the operational amplifiers 89-1–89-m from the low level to the high level is supplied to the signal line 77 from the anti-phase output terminal of the CMOS differential driver 86, and is transferred over the signal line 77 toward the anti-phase output terminals of the operational amplifiers 89-1–89-m.

The input impedance values of the operational amplifiers 88-1–88-m and 89-1–89-m are as high as more than 1000 times the characteristic impedance value (20Ω–100Ω) of the pairs 71 and 75 of signal lines. Hence, the complementary signal energy transferred over the pairs 71 and 75 of signal lines is hardly absorbed in the operational amplifiers 88-1–88-m and 89--89-m and reaches the terminating resistors 74 and 78 without substantial loss. Then, the terminating resistors 74 and 78 consume the complementary signal energy as heat. Hence, a reflection of the complementary signal energy does not occur, and the complementary digital transmit signals CS1 and /CS1 and CS2 and /CS2 can normally pass through the operational amplifiers 88-1–88-m and 89-1–89-m.

According to the fourth embodiment of the present invention, the signal lines 72 and 73 and the signal lines 76 and 77 are respectively formed by pairs of equal-length parallel lines having a large coupling coefficient. Hence, the signal lines 72 nad 73 and the signal lines 76 and 77 respectively form transmission paths in which the electromagnetic field is approximately closed. Thus, the complementary signal energy can be transferred with reduced loss, so that the complementary signal energy can be transferred over the signal lines 72 and 73 and the signal lines 76 and 77 in a mode close to the TEM.

Since the power supply line 82 and the ground line 83 are formed of a pair of equal-length parallel lines having a large coupling coefficient, the power supply line 82 and the ground line 83 form a transfer path in which the electromagnetic field is approximately closed. Thus, even when the pair 81 of power supply and ground lines is long, the complementary signal energy necessary to transfer the complementary digital transmit signals CS1 and /CS1 and CS2 and /CS2 to the operational amplifiers 88-1–88-m and 89-1–89-m can be transferred, with reduced loss, to the CMOS differential drivers 85 and 86 from the power supply voltage input terminal 79 and the ground voltage input terminal 80 in a mode close to the TEM.

The circuit is designed to satisfy a condition that Z1=Z0/2 where Z0 denotes the characteristic impedance values of the pairs 71 and 75 of signal lines, Z1 denotes the characteristic impedance value of the pair 81 of power supply and ground lines, and 2 denotes the number of pairs of signal lines. the pair 26 of power supply and ground lines has the same characteristic impedance value as that of the pair 21 of signal lines and thus matches the pair 21 of signal lines. Hence, complementary signal energy consumed on the pairs 71 and 75 of signal lines matches the complementary signal energy supplied from the power voltage input terminal 79 and the ground voltage input terminal 80 to the CMOS differential drivers 85 and 86. Thus, the complementary signal energy can be transferred with reduced loss.

Thus, according to the fourth embodiment of the present invention, it is possible to prevent the waveforms of the complementary digital transmit signals CS1 and /CS1 and CS2 and /CS2 from being deformed and to thus transfer, at a speed close to that of light, the complementary digital transmit signals CS1 and /CS1 and CS2 and /CS2 over the pairs 71 and 75 of signal lines from the CMOS differential drivers 85 and 86 to the operational amplifiers 88-1–88-m and 89-1–89-m.

It is preferable that a power supply line and a ground line over which the power supply voltage and the ground voltage are applied to the CMOS drivers 85 and 86 built in the IC chip 84 are formed of paired equal-length parallel lines. In this case, it is possible to further speed up a transfer of the complementary digital transmit signals CS1 and /CS1 and CS2 and /CS2 over the pairs 71 and 75 of signal lines from the CMOS differential drivers 85 and 86 to the operational amplifiers 88-1–88-m and 89-1–89-m.

The above-mentioned configuration of the fourth embodiment of the present invention is arranged so that the IC chips 87-1–87-m respectively include the operational amplifiers 88-1–88-m as differential receivers. The operational amplifiers 88-1–88-m do not respond to in-phase noise and noise superimposed on one of the signal lines 72 and 73, but respond to only the complementary digital transmit signals CS1 and /CS1. Similarly, The operational amplifiers 89-1–89-m do not respond to in-phase noise and noise superimposed on one of the signal lines 76 and 77, but respond to only the complementary digital transmit signals CS2 and /CS2. Hence, the transmission system has a large noise margin, and the signal voltage can be reduced. For example, although the smallest amplitude in the existing circuits is equal to 0.8 V–1.5 V, the fourth embodiment of the present invention can reduce the smallest amplitude down to about 0.1 V. Hence, it is possible to decrease the rising and falling slopes and achieve a transfer of high-frequency signals and reduction in power consumption.

Figure 12:
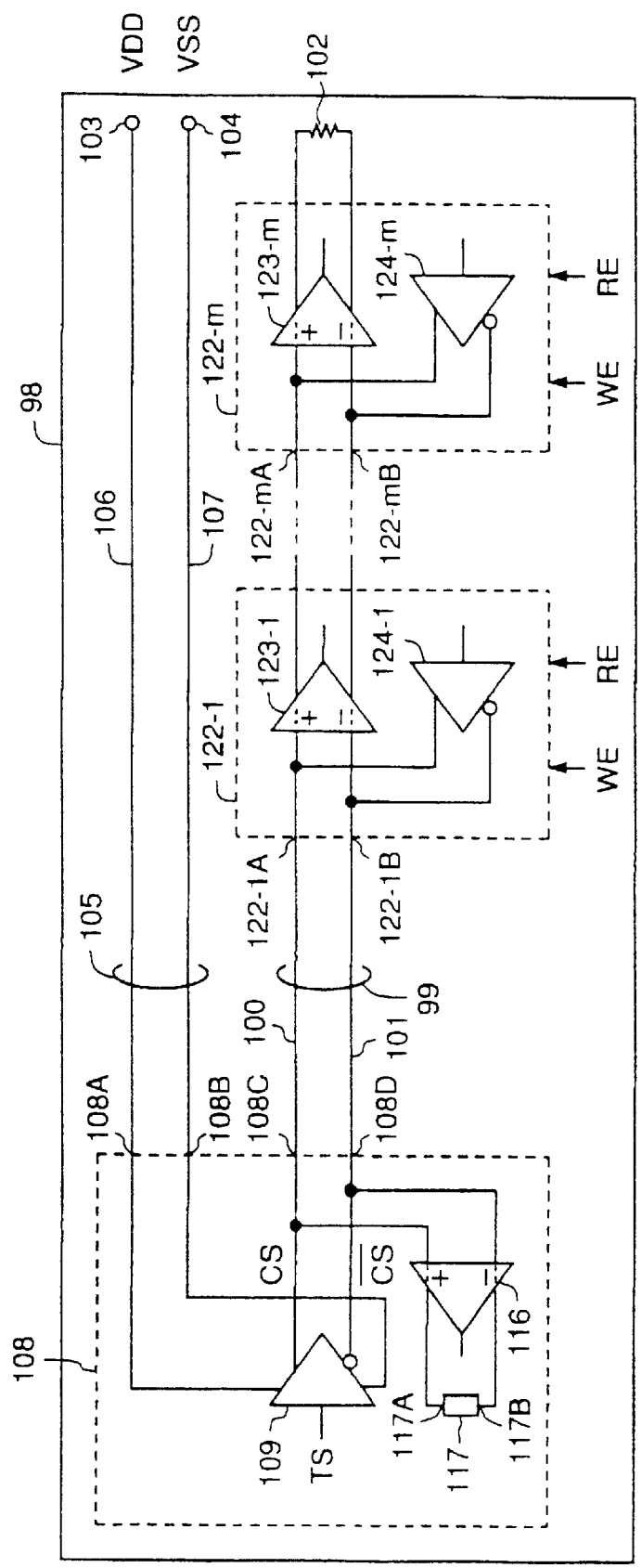
FIG. 12 is a schematic diagram of a fifth embodiment of the present invention.
Figure 13:
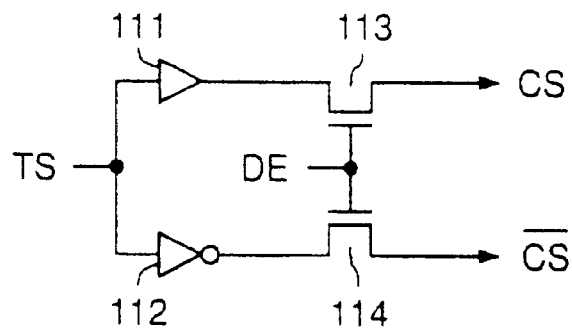
FIG. 13 is a circuit diagram of a configuration of a three-state CMOS differential driver employed in the fifth embodiment of the present invention.
Figure 14:
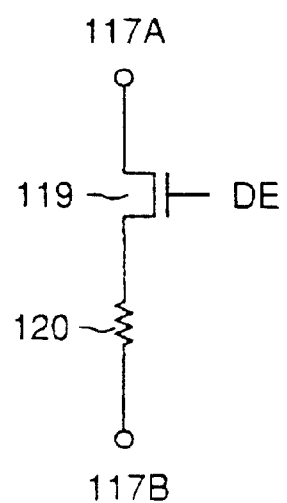
FIG. 14 is a circuit diagram of a configuration of a terminating resistor part employed in the fifth embodiment of the present invention.

Fifth Embodiment
(FIGS. 12–14)

FIG. 12 is a schematic diagram illustrating a fifth embodiment of the present invention, which has a pair of signal lines having a branch and includes a transfer circuit transferring signals in two ways.

The configuration shown in FIG. 12 includes a wiring board 98, a pair 99 of signal lines, and a terminating resistor 102. The pair 99 consists of equal-length parallel signal lines 100 and 101 which are formed on the wiring board 55 and has a large coupling coefficient. The terminating resistor 102 terminates the signal lines 100 and 101.

A power supply voltage input terminal 103 is formed on the wiring board 98 and receives the positive power supply voltage VDD. A ground voltage input terminal 104 is formed on the wiring board 98 and receives the ground voltage VSS. A pair 105 of a power supply line 106 and a ground line 107 is formed of equal-length parallel lines having a large coupling coefficient. The pair 105 of power supply and ground lines, which is formed on the wiring board 98, has the same characteristic impedance value as that of the pair 99 of signal lines.

The pair 99 of signal lines and the pair 105 of power supply and ground lines may have a coplanar wiring structure as shown in FIG. 3 or a stacked wiring formation as shown in FIG. 4.

An IC chip 108 is mounted on the wiring board 98, and has a power supply voltage input terminal 108A connected to the power supply line 106, a ground voltage input terminal 108B connected to the ground line 107, and signal output terminals 108C and 108D connected to the signal lines 100 and 101, respectively. The IC chip 108 has a three-state CMOS differential driver 109, which converts the digital transmit signal TS supplied from an internal circuit (not shown) into the complementary digital transmit signals CS and /CS, and outputs the signals CS and /CS to ends of the signal lines 100 and 101 via the signal output terminals 108C and 108D.

FIG. 13 is a circuit diagram of the three-state CMOS differential driver 109, which is made up of a CMOS driver 111, a CMOS inverter 112, and nMOS transistors 113 and 114. The CMOS driver 111 has the same configuration as that of the CMOS driver 5 shown in FIG. 1. The CMOS inverter 112 has the same configuration as that of the CMOS inverter 8 shown in FIG. 1. The nMOS transistors 113 and 114 are turned ON and OFF by a driver enable signal DE. When the driver enable signal DE is at the high level, the nMOS transistors 113 and 114 are in the active state. When the driver enable signal DE is at the low level, the nMOS transistors 113 and 114 are in the inactive state.

Turning to FIG. 12 again, the IC ship 108 includes an operational amplifier 116 functioning as a differential receiver, and a terminating resistor part 117 which terminates signal lines provided in the IC chip 108 connected to the signal lines 100 and 101. An in-phase input terminal of the operational amplifier 116 and an end 117A of the terminating resistor part 117 are connected to the signal input terminal 108C. An anti-phase input terminal of the operational amplifier 116 and the other end 117B of the terminating resistor part 117 are connected to the signal input terminal 108D.

FIG. 14 is a circuit diagram of a configuration of the terminating resistor part 117, which is-made up of an nMOS transistor 119 and a terminating resistor 120. The nMOS transistor 119 is turned ON and OFF by the driver enable signal DE.

Turning to FIG. 11 again, IC chips 122-1–122-m of an identical type or different types are mounted on the wiring board 98. The IC chips 122-1–122-m respectively have signal input terminals 122-1A–122-mA connected to the signal line 100, and signal input terminals 122-1B–122-mB connected to the signal line 101.

The IC chip 122-1 includes an operational amplifier 123-1 functioning as a differential receiver, which has an in-phase signal input terminal connected to the signal input terminal 122-1A and an anti-phase signal input terminal connected to the signal input terminal 122-1B. Further, the IC chip 122-1 includes a three-state CMOS differential driver 124-1 configured in the same manner as the three-state CMOS differential driver 109, and has an in-phase output terminal connected to the signal input terminal 122-1A and an anti-phase output terminal connected to the signal input terminal 122-1B.

The IC chip 122-m includes an operational amplifier 123-m functioning as a differential receiver, which has an in-phase signal input terminal connected to the signal input terminal 122-mA and an anti-phase signal input terminal connected to the signal input terminal 122-mB. Further, the IC chip 122-m includes a three-state CMOS differential driver 124-m configured in the same manner as the three-state CMOS differential driver 109, and has an in-phase output terminal connected to the signal input terminal 122-mA and an anti-phase output terminal connected to the signal input terminal 122-mB.

In the fifth embodiment of the present invention thus configured, under a condition that a write enable signal WE issued by the IC chip 108 is in the active state, when the digital transmit signal TS changes from the low level to the high level, positive signal energy which switches the in-phase input terminals of the operational amplifiers 123-1–123-m from the low level to the high level is supplied to the signal line 100 from the in-phase output terminal of the CMOS differential driver 109, and is transferred over the signal line 100 toward the in-phase input terminals of the operational amplifiers 123-1–123-m. Further, negative signal energy which switches the anti-phase input terminals of the operational amplifiers 123-1–123-m from the high level to the low level is supplied to the signal line 101 from the anti-phase output terminal of the CMOS differential driver 109 and is transferred over the signal line 101 toward the anti-phase input terminals of the operational amplifiers 123-1–123-m.

In contrast, when the digital transmit signal TS changes from the high level to the low level, negative signal energy which switches the in-phase input terminals of the operational amplifiers 123-1–123-m from the high level to the low level is supplied to the signal line 100 from the in-phase output terminal of the CMOS differential driver 109, and is transferred toward the in-phase output terminals of the operational amplifiers 123-1–123-m. Further, negative signal energy which switches the anti-phase input terminals of the operational amplifiers 123-1–123-m from the low level to the high level is supplied to the signal line 101 from the anti-phase output terminal of the CMOS differential driver 109, and is transferred toward the anti-phase output terminals of the operational amplifiers 123-1–123-m.

The input impedance values of the operational amplifiers 123-1–123-m are as high as more than 1000 times the characteristic impedance value (20Ω–100Ω) of the pair 99 of signal lines. Hence, the complementary signal energy transferred over the pair 99 of signal lines is hardly absorbed in the operational amplifiers 123-1–123-m and reaches the terminating resistor 102 without substantial loss. Then, the terminating resistor 102 consumes the received complementary signal energy as heat. Hence, a reflection of the complementary signal energy does not occur, and the complementary digital transmit signals CS and /CS can normally pass through the operational amplifiers 123-1–123-m.

In the state in which a read enable signal RE issued by the IC chip 108 is in an active state, when the operational amplifier 116 of the IC chip 108 is changed to the receivable state, the complementary digital transmit signal is output to the pair 99 of signal lines from the CMOS differential driver 124-1 of the IC chip 122-1 or the CMOS differential driver 124-m of the IC chip 122-m, and is transferred over the pair 99 of signal lines in two ways. The complementary digital transmit signal transferred rightward is absorbed by the terminating resistor 102. The complementary digital transmit signal transferred leftward is absorbed by the terminating resistor 120 of the terminating resistor part 117. Hence, no reflection of the complementary digital transmit signals occurs. Thus, the operational amplifier 116 is always capable of receiving the complementary digital transmit signal having a good waveform.

It is preferable that the ON resistance values of the three-state CMOS differential drivers 109, and 124-1–124-m are equal to or less than half the characteristic impedance value of the pair 99 of signal lines.

As described above, according to the fifth embodiment of the present invention, when the digital transmit signal TS changes in the state in which the write enable signal WE issued by the IC chip 108 is in the active state, the complementary signal energy is transferred over the signal lines 100 and 101 toward the operational amplifiers 123-1–123-m. The signal lines 100 and 101 are formed of a pair of equal-length parallel lines having a large coupling coefficient. Hence, the signal lines 100 and 101 form a transfer path in which the electromagnetic field is approximately closed. Hence, the complementary digital transmit signals can be transferred in a mode close to the TEM with reduced loss.

Since the power supply line 106 and the ground line 107 are paired equal-length parallel lines having a large coupling coefficient, the power supply line 106 and the ground line 107 form a transfer path in which the electromagnetic field is approximately closed. Thus, even when the pair 105 of power supply and ground lines is long, the complementary signal energy necessary to transfer the complementary digital transmit signals CS and /CS to the operational amplifiers 123-1–123-m can be transferred, with reduced loss, to the CMOS differential driver 109 from the power supply voltage input terminal 104 and the ground voltage input terminal 105 in a mode close to the TEM.

In addition to the above, the pair 105 of power supply and ground lines has the same characteristic impedance value as that of the pair 99 of signal lines so that the pair 105 matches the pair 99 on the characteristic impedance basis. Hence, complementary signal energy consumed on the pair 99 of signal lines matches the complementary signal energy supplied from the power voltage input terminal 103 and the ground voltage input terminal 104 to the CMOS differential driver 109. Thus, the complementary signal energy can be transferred with reduced loss.

Thus, according to the fifth embodiment of the present invention, it is possible to prevent the waveforms of the complementary digital transmit signals CS and /CS from being deformed and to thus transfer, at a speed close to that of light, the complementary digital transmit signals CS and /CS over the pair 99 of signal lines from the CMOS differential driver 109 to the operational amplifiers 123-1–123-m.

It is preferable that a power supply line and a ground line over which the power supply voltage and the ground voltage are applied to the CMOS differential driver 109 built in the IC chip 108 are formed of paired equal-length parallel lines. In this case, it is possible to further speed up a transfer of the complementary digital transmit signals CS and /CS over the pair 99 of signal lines from the CMOS differential driver 109 to the operational amplifiers 123-1–123-m.

The above-mentioned configuration of the fifth embodiment of the present invention is arranged so that the IC chips 122-1–122-m respectively include the operational amplifiers 123-1–123-m as differential receivers. The operational amplifiers 123-1–123-m do not respond to in-phase noise and noise superimposed on one of the signal lines 100 and 101, but respond to only the complementary digital transmit signals CS and /CS. Hence, the transmission system has a large noise margin, and the signal voltage can be reduced. For example, although the smallest amplitude in the existing circuits is equal to 0.8 V–1.5 V, the fifth embodiment of the present invention can reduce the smallest amplitude down to about 0.1 V. Hence, it is possible to decrease the rising and falling slopes and achieve a transfer of high-frequency signals and reduction in power consumption.

Figure 15:
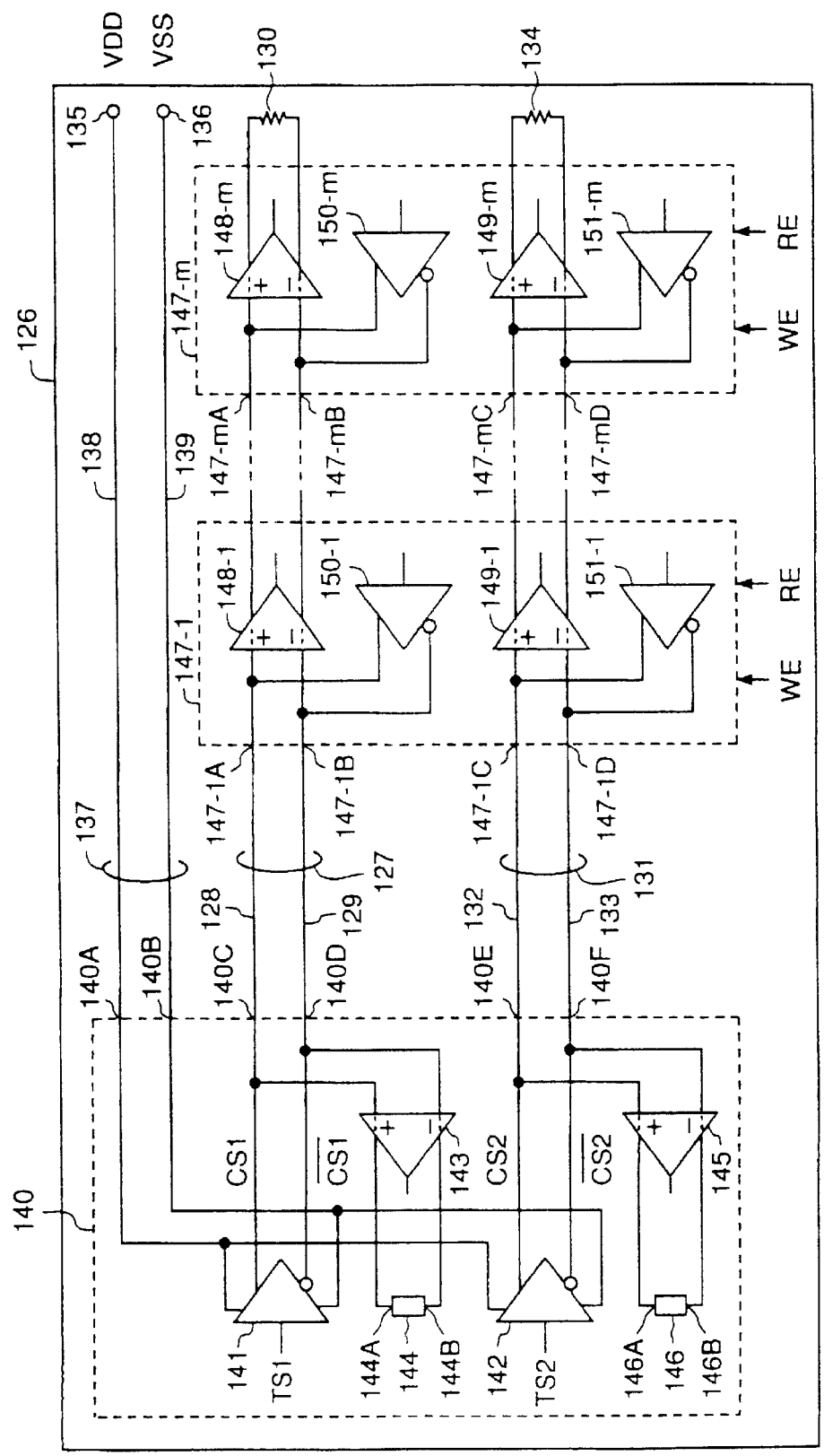
FIG. 15 is a schematic diagram of a sixth embodiment of the present invention.

Sixth Embodiment
(FIG. 15)

FIG. 15 is a schematic diagram illustrating a sixth embodiment of the present invention, which has two pairs of signal lines respectively having a branch and includes a transfer circuit transferring signals in two ways.

The configuration shown in FIG. 15 includes a wiring board 126, a pair 127 of signal lines 128 and 129, and a pair 131 of signal lines 132 and 133. The signal lines 128 and 129 are formed of equal-length parallel lines having a large coupling coefficient. Similarly, the signal lines 132 and 333 are formed of equal-length parallel lines having a large coupling coefficient. The pairs 127 and 131 of signal lines have an identical coupling coefficient, characteristic impedance and length, and are parallel to each other.

A power supply voltage input terminal 135 is formed on the wiring board 126 and receives the positive power supply voltage VDD. A ground voltage input terminal 136 is formed on the wiring board 126 and receives the ground voltage VSS. A pair 137 of a power supply line 138 and a ground line 139 is formed of equal-length parallel lines having a large coupling coefficient.

The circuit is designed to satisfy a condition that Z1=Z0/2 where Z0 denotes the characteristic impedance values of the pairs 127 and 131 of signal lines, Z1 denotes the characteristic impedance value of the pair 137 of power supply and ground lines, and 2 denotes the number of pairs of signal lines. In case where the condition Z1=Z0/2 is not satisfied, it is preferable to adjust the circuit to obtain a condition as close to the above condition as possible.

The pairs 127 and 131 of signal lines and the pair 137 of power supply and ground lines may have a coplanar wiring structure as shown in FIG. 3 or a stacked wiring formation as shown in FIG. 4.

An IC chip 140 is mounted on the wiring board 126, and has a power supply voltage input terminal 140A connected to the power supply line 138, a ground voltage input terminal 140B connected to the ground line 139, and signal output terminals 140C, 140D, 140E and 140F connected to the signal lines 128, 129, 132 and 133, respectively.

The IC chip 140 has a three-state CMOS differential driver 141, which converts the digital transmit signal TS1 supplied from an internal circuit (not shown) into the complementary digital transmit signals CS1 and /CS1, and outputs the signals CS1 and /CS1 to ends of the signal lines 128 and 129 via the signal output terminals 140C and 140D. The driver 141 is configured in the same manner as the three-state CMOS differential driver 109 shown in FIG. 12.

The IC chip 140 has another three-state CMOS differential driver 142, which converts the digital transmit signal TS2 supplied from the internal circuit into the complementary digital transmit signals CS2 and /CS2, and outputs the signals CS2 and /CS2 to ends of the signal lines 132 and 133 via the signal output terminals 140E and 140F. The driver 142 is configured in the same manner as the three-state CMOS differential driver 109 shown in FIG. 12.

The IC ship 140 includes an operational amplifier 143 functioning as a differential receiver, and a terminating resistor part 144 which terminates signal lines provided in the IC chip 143 connected to the signal lines 128 and 129. The terminating resistor part 144 is configured in the same manner as the terminating resistor part 117 shown in FIG. 12. An in-phase input terminal of the operational amplifier 143 and an end 144A of the terminating resistor part 144 are connected to the signal input terminal 140C. An anti-phase input terminal of the operational amplifier 143 and the other end 144B of the terminating resistor part 144 are connected to the signal input terminal 140D.

The IC ship 140 includes another operational amplifier 145 functioning as a differential receiver, and a terminating resistor part 146 which terminates signal lines provided in the IC chip 143 connected to the signal lines 132 and 133. The terminating resistor part 146 is configured in the same manner as the terminating resistor part 117 shown in FIG. 12. An in-phase input terminal of the operational amplifier 145 and an end 146A of the terminating resistor part 146 are connected to the signal input terminal 140E. An anti-phase input terminal of the operational amplifier 145 and the other end 146B of the terminating resistor part 146 are connected to the signal input terminal 140F.

IC chips 147-1–147-m of an identical type or different types are mounted on the wiring board 126. The IC chips 147-1–147-m respectively have signal input terminals 147-1A–147-mA connected to the signal line 128, and signal input terminals 147-1B–147-mB connected to the signal line 129.

The IC chip 147-1 includes an operational amplifier 148-1 functioning as a differential receiver, which has an in-phase input terminal connected to the signal input terminal 147-1A and an anti-phase input terminal connected to the signal input terminal 147-1B. The IC chip 147-1 includes an operational amplifier 149-1 functioning as a differential receiver, which has an in-phase input terminal connected to the signal input terminal 147-1C and an anti-phase input terminal connected to the signal input terminal 147-1D. The IC chip 147-1 further includes a three-state CMOS differential driver 150-1 configured in the same manner as the three-state CMOS differential driver 141, and has an in-phase output terminal connected to the signal input terminal 147-1A and an anti-phase output terminal connected to the signal input terminal 147-1B. Further, the IC chip 147-1 includes a three-state CMOS differential driver 151-1 configured in the same manner as the three-state CMOS differential driver 141, and has an in-phase output terminal connected to the signal input terminal 147-1C and an anti-phase output terminal connected to the signal input terminal 147-1D.

The IC chip 147-m includes an operational amplifier 148-m functioning as a differential receiver, which has an in-phase input terminal connected to the signal input terminal 147-mA and an anti-phase input terminal connected to the signal input terminal 147-mB. The IC chip 147-m includes an operational amplifier 149-m functioning as a differential receiver, which has an in-phase input terminal connected to the signal input terminal 147-mC and an anti-phase input terminal connected to the signal input terminal 147-mD. The IC chip 147-m further includes a three-state CMOS differential driver 150-m configured in the same manner as the three-state CMOS differential driver 141, and has an in-phase output terminal connected to the signal input terminal 147-mA and an anti-phase output terminal connected to the signal input terminal 147-mB. Further, the IC chip 147-m includes a three-state CMOS differential driver 151-m configured in the same manner as the three-state CMOS differential driver 141, and has an in-phase output terminal connected to the signal input terminal 147-mC and an anti-phase output terminal connected to the signal input terminal 147-mD.

In the sixth embodiment of the present invention thus configured, under the condition that the write enable signal WE issued by the IC chip 140 is in the active state, when the digital transmit signal TS1 changes from the low level to the high level, positive signal energy which switches the in-phase input terminals of the operational amplifiers 148-1–148-m from the low level to the high level is supplied to the signal line 128 from the in-phase output terminal of the CMOS differential driver 141, and is transferred over the signal line 128 toward the in-phase input terminals of the operational amplifiers 148-1–148-m. Further, negative signal energy which switches the anti-phase input terminals of the operational amplifiers 148-1–148-m from the high level to the low level is supplied to the signal line 129 from the anti-phase output terminal of the CMOS differential driver 141 and is transferred over the signal line 129 toward the anti-phase input terminals of the operational amplifiers 148-1–148-m.

When the digital transmit signal TS2 changes from the low level to the high level, positive signal energy which switches the in-phase input terminals of the operational amplifiers 149-1–149-m from the low level to the high level is supplied to the signal line 132 from the in-phase output terminal of the CMOS differential driver 142, and is transferred over the signal line 132 toward the in-phase input terminals of the operational amplifiers 149-1–149-m. Further, negative signal energy which switches the anti-phase input terminals of the operational amplifiers 149-1–149-m from the high level to the low level is supplied to the signal line 133 from the anti-phase output terminal of the CMOS differential driver 142 and is transferred over the signal line 133 toward the anti-phase input terminals of the operational amplifiers 149-1–149-m.

In contrast, when the digital transmit signal TS1 changes from the high level to the low level, negative signal energy which switches the in-phase input terminals of the operational amplifiers 148-1–148-m from the high level to the low level is supplied to the signal line 128 from the in-phase output terminal of the CMOS differential driver 141, and is transferred toward the in-phase output terminals of the operational amplifiers 148-1–148-m. Further, negative signal energy which switches the anti-phase input terminals of the operational amplifiers 148-1–148-m from the low level to the high level is supplied to the signal line 129 from the anti-phase output terminal of the CMOS differential driver 141, and is transferred toward the anti-phase output terminals of the operational amplifiers 148-1–148-m.

When the digital transmit signal TS2 changes from the high level to the low level, negative signal energy which switches the in-phase input terminals of the operational amplifiers 149-1–149-m from the high level to the low level is supplied to the signal line 132 from the in-phase output terminal of the CMOS differential driver 142, and is transferred toward the in-phase output terminals of the operational amplifiers 149-1–149-m. Further, negative signal energy which switches the anti-phase input terminals of the operational amplifiers 149-1–149-m from the low level to the high level is supplied to the signal line 133 from the anti-phase output terminal of the CMOS differential driver 142, and is transferred toward the anti-phase output terminals of the operational amplifiers 149-1–149-m.

The input impedance values of the operational amplifiers 148-1–148-m and 149-1–149-m are as high as more than 1000 times the characteristic impedance values (20Ω–100Ω) of the pairs 127 and 131 of signal lines. Hence, the complementary signal energy transferred over the pairs 9127 and 131 of signal lines is hardly absorbed in the operational amplifiers 148-1–148-m and 149-1–149-m and reaches the terminating resistors 130 and 134 without substantial loss. Then, the terminating resistors 130 and 134 consume the received complementary signal energy as heat. Hence, a reflection of the complementary signal energy does not occur, and the complementary digital transmit signals CS1 and /CS1 and CS2 and /CS2 can normally pass through the operational amplifiers 148-1–148-m and 149-1–149-m.

In the state in which the read enable signal RE issued by the IC chip 140 is in the active state, when the operational amplifiers 143 and 145 of the IC chip 108 are changed to the receivable state, the complementary digital transmit signals are output to the pairs 127 and 131 of signal lines from the CMOS differential drivers 150-1 and 151-1 of the IC chip 147-1 or the CMOS differential drivers 148-m and 149-m of the IC chip 147-m, and are transferred over the pairs 127 and 131 of signal lines in two ways. The complementary digital transmit signals transferred rightward are absorbed by the terminating resistors 130 and 134. The complementary digital transmit signals transferred leftward are absorbed by the terminating resistors 144 and 146 in the IC chip 140. Hence, no reflection of the complementary digital transmit signals occurs. Thus, the operational amplifiers 143 and 145 are always capable of receiving the complementary digital transmit signals having a good waveform.

It is preferable that the ON resistance values of the three-state CMOS differential drivers 141, 142, 150-1–150-m, and 151-1–151-m are equal to or less than half the characteristic impedance values of the pairs 127 and 131 of signal lines.

As described above, according to the sixth embodiment of the present invention, when the digital transmit signals TS1 and TS2 change in the state in which the write enable signal WE issued by the IC chip 140 is in the active state, the complementary signal energy is transferred over the signal lines 128 and 129 and the signal lines 132 and 133 toward the operational amplifiers 148-1–148-m and the operational amplifiers 149-1–149-m. The signal lines 128 and 129 and the signal lines 132 and 133 are formed of respective pairs of equal-length parallel lines having a large coupling coefficient. Hence, the signal lines 128 and 129 and the signal lines 132 and 133 form transfer paths in which the electromagnetic field is approximately closed. Hence, the complementary digital transmit signals can be transferred in a mode close to the TEM with reduced loss.

Since the power supply line 138 and the ground line 139 are paired equal-length parallel lines having a large coupling coefficient, the power supply line 138 and the ground line 139 form a transfer path in which the electromagnetic field is approximately closed. Thus, even when the pair 137 of power supply and ground lines is long, the complementary signal energy necessary to transfer the complementary digital transmit signals CS and /CS to the operational amplifiers 148-1–148-m and 149-1–149-m can be transferred, with reduced loss, to the CMOS differential drivers 141 and 142 from the power supply voltage input terminal 135 and the ground voltage input terminal 136 in a mode close to the TEM.

Further, the circuit is designed to satisfy a condition that Z1=Z0/2 where Z0 denotes the characteristic impedance values of the pairs 127 and 131 of signal lines, Z1 denotes the characteristic impedance value of the pair 137 of power supply and ground lines, and 2 denotes the number of pairs of signal lines. The pair 137 of power supply and ground lines has the same characteristic impedance value as that of the pairs 127 and 131 of signal lines and thus matches those pairs on the characteristic impedance basis. Hence, complementary signal energy consumed on the pairs 127 and 131 of signal lines matches the complementary signal energy supplied from the power voltage input terminal 135 and the ground voltage input terminal 136 to the CMOS differential drivers 141 and 142. Thus, the complementary signal energy can be transferred with reduced loss.

Thus, according to the sixth embodiment of the present invention, it is possible to prevent the waveforms of the complementary digital transmit signals CS1 and /CS1 and CS2 and /CS2 from being deformed and to thus transfer, at a speed close to that of light, the complementary digital transmit signals CS1 and /CS1 and CS2 and /CS2 over the pairs 127 and 131 of signal lines from the CMOS differential drivers 141 and 142 to the operational amplifiers 148-1–148-m and 149-1–149-m.

It is preferable that a power supply line and a ground line over which the power supply voltage and the ground voltage are applied to the CMOS differential drivers 141 and 142 built in the IC chip 140 are formed of paired equal-length parallel lines. In this case, it is possible to further speed up a transfer of the complementary digital transmit signals CS1 and /CS1 and CS2 and /CS2 over the pairs 127 and 131 of signal lines from the CMOS differential drivers 141 and 142 to the operational amplifiers 148-1–148-m and 149-1–149-m.

The above-mentioned configuration of the sixth embodiment of the present invention is arranged so that the IC chips 147-1–147-m respectively include the operational amplifiers 148-1–148-m as differential receivers. The operational amplifiers 148-1–148-m do not respond to in-phase noise and noise superimposed on one of the signal lines 128 and 129, but respond to only the complementary digital transmit signals CS1 and /CS1. Similarly, the operational amplifiers 149-1–149-m do not respond to in-phase noise and noise superimposed on one of the signal lines 132 and 133, but respond to only the complementary digital transmit signals CS2 and /CS2. Hence, the transmission system has a large noise margin, and the signal voltage can be reduced. For example, although the smallest amplitude in the existing circuits is equal to 0.8 V–1.5 V, the fifth embodiment of the present invention can reduce the smallest amplitude down to about 0.1 V. Hence, it is possible to decrease the rising and falling slopes and achieve a transfer of high-frequency signals and reduction in power consumption.

Figure 16:
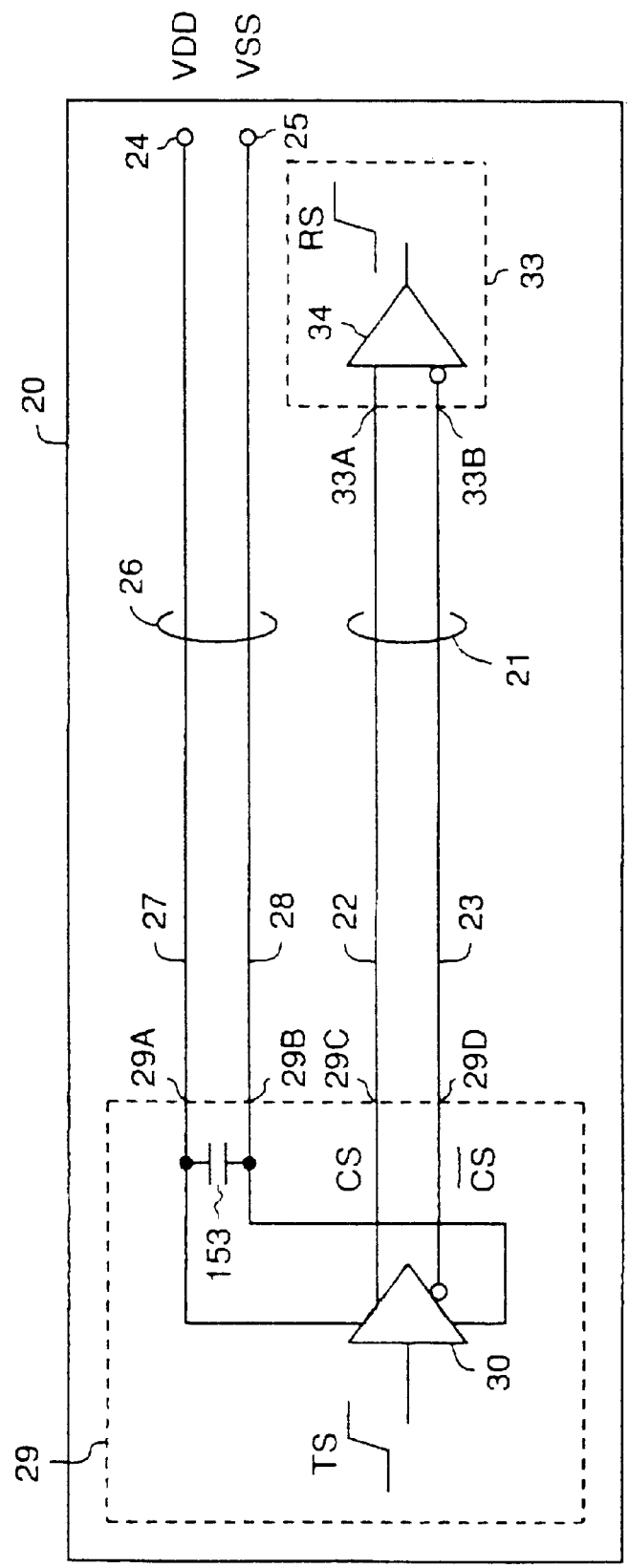
FIG. 16 is a schematic diagram of a seventh embodiment of the present invention.
Figure 17A:
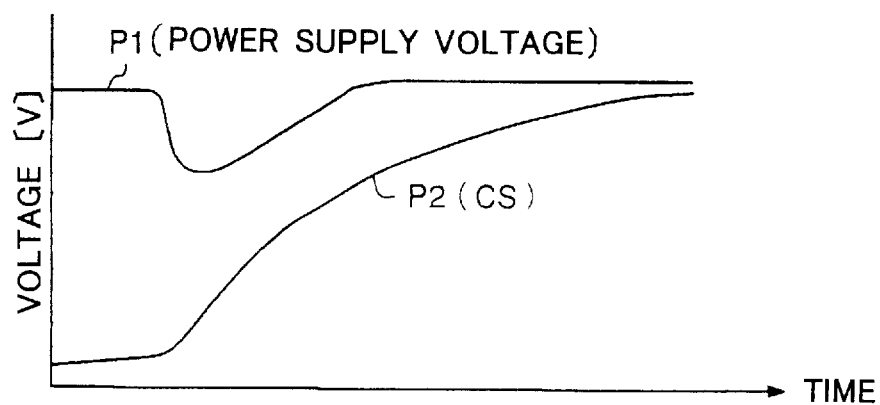
FIG. 17 is a waveform diagram of an operation of the seventh embodiment of the present invention.

Seventh Embodiment
(FIGS. 16, 17A and 17)

FIG. 16 is a schematic diagram illustrating a seventh embodiment of the present invention, in which a capacitor 153 is connected between the power supply line and the ground line for the CMOS differential driver 30 provided in the IC chip 29. The other parts of the configuration shown in FIG. 16 are the same as those of the configuration of the first embodiment shown in FIG. 2.

If the time it takes the in-phase digital transmit signal CS output via the in-phase output terminal of the CMOS differential driver 30 to rise is longer than the time necessary to set the signal energy for causing the whole signal line 22 to be high (the above time corresponds to the propagation delay time of the signal line 22), the positive signal energy is supplied to the signal line 22 and the signal energy is simultaneously supplied to the CMOS differential driver 34. Hence, the CMOS differential receiver 34 does not see the existence of the signal line 22.

In contrast, the time it takes the in-phase digital transmit signal CS output via the in-phase output terminal of the CMOS differential driver 30 to rise is shorter than the time necessary to set the signal energy for causing the whole signal line 22 to be high, it is not possible to speed up a transfer of the in-phase digital transmit signal CS unless the in-phase digital transmit signal CS output from the CMOS differential driver 30 is switched to the high level before the signal CS is transferred to the CMOS differential receiver 34.

When the in-phase digital transmit signal CS is switched to the low level, it is necessary to rapidly discharge the energy of the highly powered signal line 22 to somewhere in order to speed up a transfer of the in-phase digital transmit signal.

A "good" receiver is required to be capable of sensing small signal energy and changes its own state. When the time it takes the signal to rise is longer than the propagation delay time of the signal line, it is enough to supply small signal energy to the signal line. Hence, a driver having a small drivability (a small power consumption) can be used.

In contrast, recently, there has been a trend such that the time it takes the signal to rise is shorter than the propagation delay time of the signal line. In the above situation, it is more important to design how to supply signal energy to the signal line by the driver rather than the performance of the receiver.

The good receiver has a performance in which the electrical energy of a signal applied thereto is not consumed, in other words, the input resistance of the receiver is high. If the input resistance is equal to 1 kΩ, the characteristic impedance of the signal line ranges from 25 to 200 Ω. Hence, the signal line consumes energy equal to single-digit or double-digit times more than energy consumed by the receiver.

When the signal line is 30 cm long and the signal travels at a speed of $2 \times 10^8$ m/s, the time necessary for the signal to travel along the signal line is equal to 1.5 ns. Hence, even when a receiver is provided along the signal line, the time 1.5 ns is used to supply signal energy to the signal line and the driver is needed to continue to supply the signal energy to the signal line for the above time. That is, the driver is required to have a drivability in which the characteristic impedance of the signal line is handled as a load.

Figure 17B:
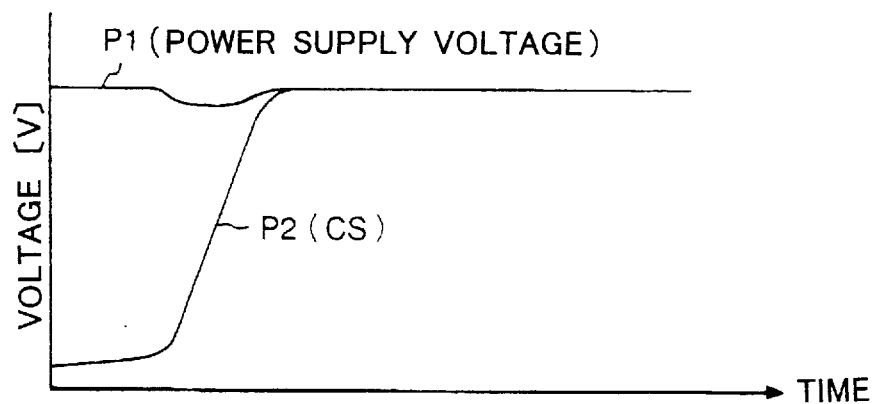

FIGS. 17A and 17B are respectively time charts showing a relationship between the voltage of the power supply line in the IC chip and the in-phase digital transmit signal CS output from the CMOS differential driver 30. More particularly, FIG. 17A shows a case where the capacitor 153 is not provided and FIG. 17B shows a case where the capacitor 153 is provided. A solid line P1 indicates the power supply voltage, and a solid line P2 indicates the in-phase digital transmit signal CS.

The differential driver 30 is primarily a switch circuit, and the drivability thereof depends on the pair 26 of power supply and ground lines. If the characteristic impedance Z1 of the pair 26 of power supply and ground lines is larger than the characteristic impedance Z0 of the pair 21 of signal lines and the capacitor 153 is not used, as shown in FIG. 17A, the power supply voltage drops and the in-phase digital transmit signal CS gradually rises.

In contrast, the seventh embodiment of the present invention employs the capacitance 153 connected between the power supply and ground lines for the CMOS differential driver 30 built in the IC chip 29. Hence, even if the characteristic impedance Z1 of the pair 26 of power supply and ground lines is larger than the characteristic impedance Z0 of the pair 21 of signal lines, the charge stored in the capacitor 153 is supplied to the signal line 22, and as shown in FIG. 17B, the in-phase digital transmit signal CS output from the CMOS differential driver 30 rises rapidly.

When it is assumed that tpd [s] denotes the time necessary to supply the signal energy to the signal line 22 from the CMOS differential driver 30, that is, the delay time of the signal line 22, and I [A] denotes a current flowing through the signal line 22 for the above time, a charge Q [C] supplied to the signal line 22 for the above time can be expressed as follows:

$$Q = Itpd \, [C].$$

When the amplitude (voltage) of the digital transmit signal CS is denoted as V [V], the capacitance C [F] of the capacitor necessary to store the charge can be written as follows:

$$C = Q/V \, [F].$$

When the ON resistance of the CMOS differential driver 30 is 50Ω, the characteristic impedance of the pair 21 of signal lines is 50Ω, the amplitude of the signal is 0.1 V, and the delay time tpd of the signal line 22 is 1.5 ns, then I=1 mA, Q=1.5 pC, and C=15 pF.

In the case where the pair 21 of signal lines is formed in the stacked wiring formation, the following expression stands:

$$Q = \epsilon_0 \epsilon_r VA/d$$

where $\epsilon_0$ denotes the vacuum dielectric constant, $\epsilon_r$ denotes the dielectric constant of the insulating board, V denotes a voltage applied across the signal lines 22 and 23, A denotes the area of the signal line 22, and d denotes the distance between the signal lines 22. When $\epsilon_0 = 8.85 \times 10^{-12}$ [F/n], $\epsilon_r = 3$, and Q=1.5 pC, then A/D=0.564 m. When d=20 nm, then A=$1.13 \times 10^{-8}$ m$^2$, and thus the signal line 22 has a size of A=0.11 mm×0.11 mm.

The above size A of the signal line 22 is too big to be built in an active area of the IC chip 29. However, the signal line 22 can be formed under the bonding pads respectively functioning as the power supply voltage input terminal 29A and the ground voltage input terminal 29B.

As described above, the seventh embodiment of the present invention employs the capacitor 153 connected between the power supply line and the ground line for the CMOS differential driver 30 provided in the IC chip 29. Hence, when the digital transmit signal TS changes, the complementary signal energy can be supplied to the CMOS differential driver 30 from the capacitor 153 before the complementary signal energy is supplied to the CMOS differential driver 30 via the pair 26 of power supply and ground lines. Thus, it is possible to further speed up a transfer of the complementary digital transmit signals CS and /CS as compared to the first embodiment of the present invention shown in FIG. 2.

It is to be noted that the seventh embodiment of the present invention is particularly effective to a case where Z1>Z0 where Z1 denotes the characteristic impedance of the pair 62 of power supply and ground lines, and Z0 denotes the characteristic impedance of the pair 56 of signal lines.

Figure 18:
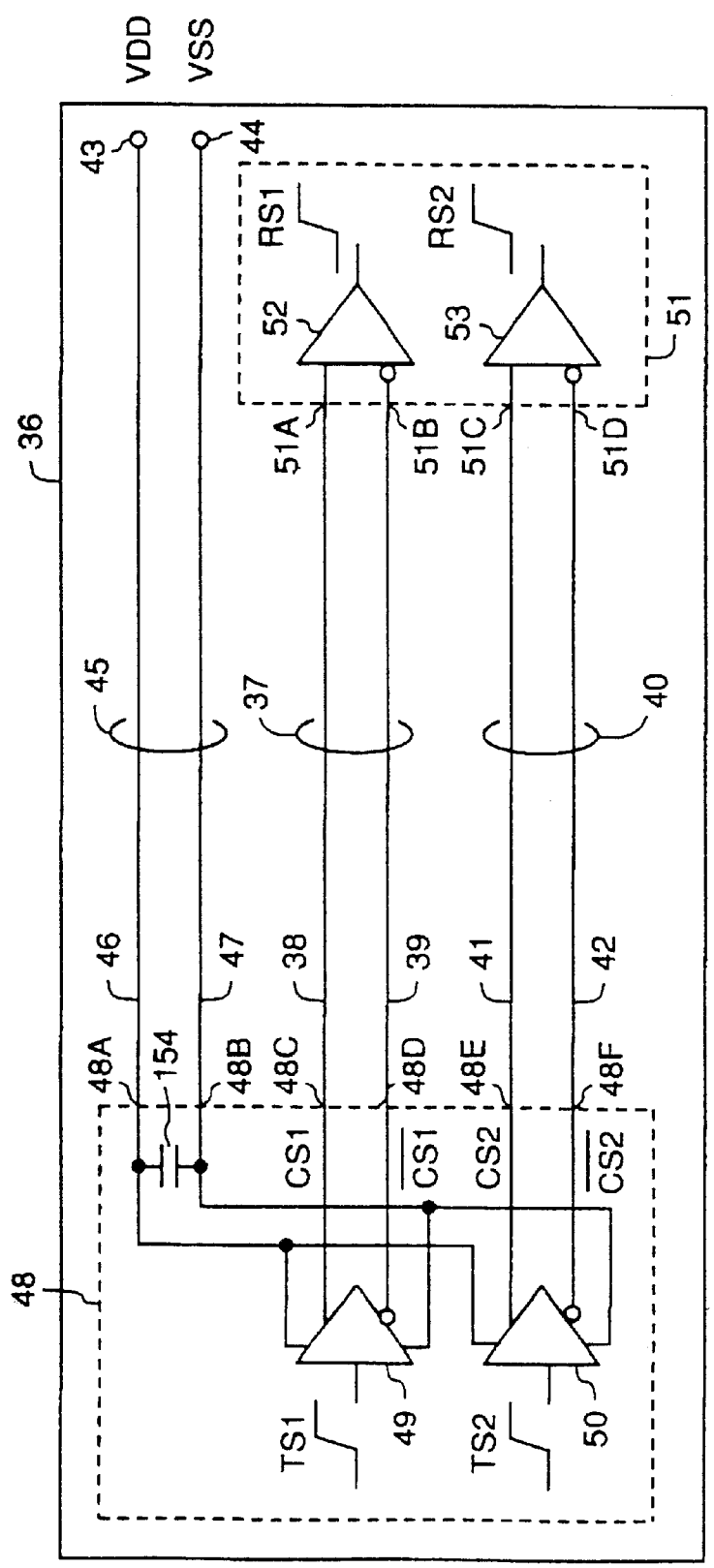
FIG. 18 is a schematic diagram of an eighth embodiment of the present invention.

Eighth Embodiment
(FIG. 18)

FIG. 18 is a schematic diagram illustrating an eighth embodiment of the present invention, in which a capacitor 154 is connected between the power supply line and the ground line for the CMOS differential drivers 49 and 50 in the IC chip 48. The other parts of the configuration shown in FIG. 18 are the same as those of the second embodiment of the present invention shown in FIG. 5.

When the digital transmit signals TS1 and TS2 change, the complementary signal energy can be supplied to the CMOS differential drivers 49 and 50 from the capacitor 154 before the complementary signal energy is supplied to the CMOS differential drivers 49 and 50 via the pair 45 of power supply and ground lines. Hence, it is possible to further speed up a transfer of the complementary digital transmit signals CS1 and /CS1 and CS2 and /CS2, as compared to the second embodiment of the present invention.

The eighth embodiment of the present invention is particularly effective to a case where Z1>Z0 where Z1 denotes the characteristic impedance of the pair 45 of power supply and ground lines, and Z0 denotes the characteristic impedance of the pairs 37 and 40 of signal lines.

Figure 19:
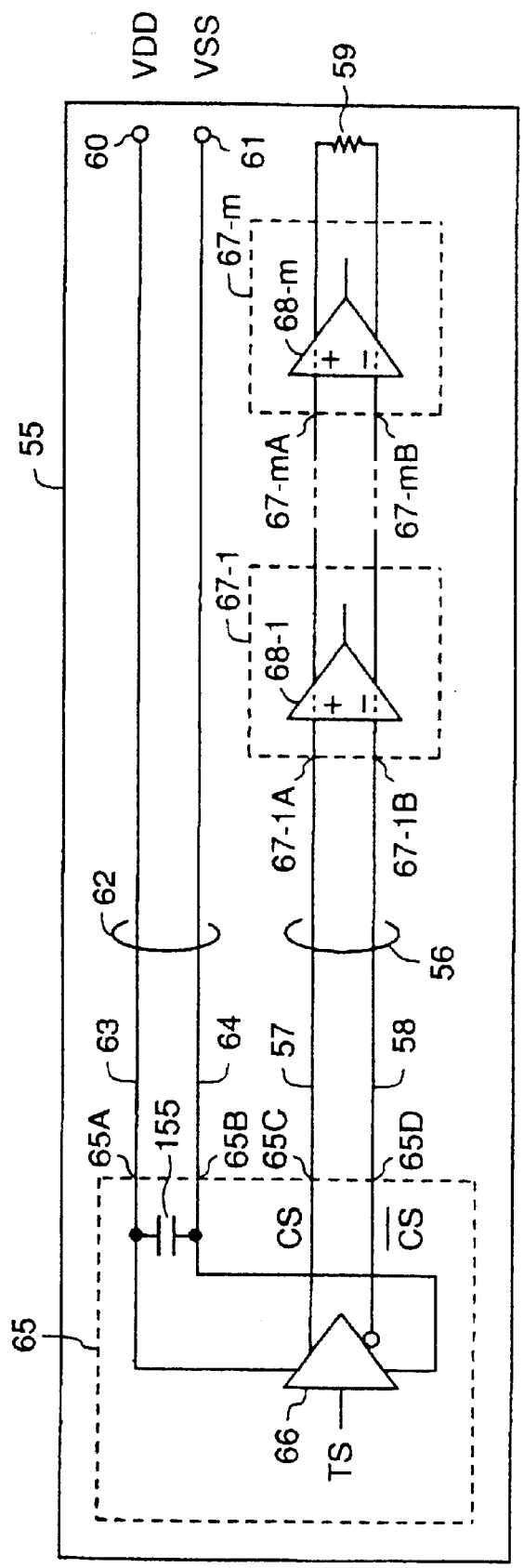
FIG. 19 is a schematic diagram of a ninth embodiment of the present invention.

Ninth Embodiment
(FIG. 19)

FIG. 19 is a schematic diagram of a ninth embodiment of the present invention, in which a capacitor 155 is connected between the power supply line and the ground line for the CMOS differential driver 66 provided in the IC chip 65. The other parts of the configuration shown in FIG. 19 are the same as those of the third embodiment of the present invention shown in FIG. 8.

When the digital transmit signal TS changes, the complementary signal energy can be supplied to the CMOS differential driver 66 from the capacitor 155 before the complementary signal energy is supplied to the CMOS differential driver 66 via the pair 62 of power supply and ground lines. Hence, it is possible to further speed up a transfer of the complementary digital transmit signals CS and /CS, as compared to the third embodiment of the present invention.

The ninth embodiment of the present invention is particularly effective to a case where ZI>Z0 where Z1 denotes the characteristic impedance of the pair 62 of power supply and ground lines, and Z0 denotes the characteristic impedance of the pair 56 of signal lines.

Figure 20:
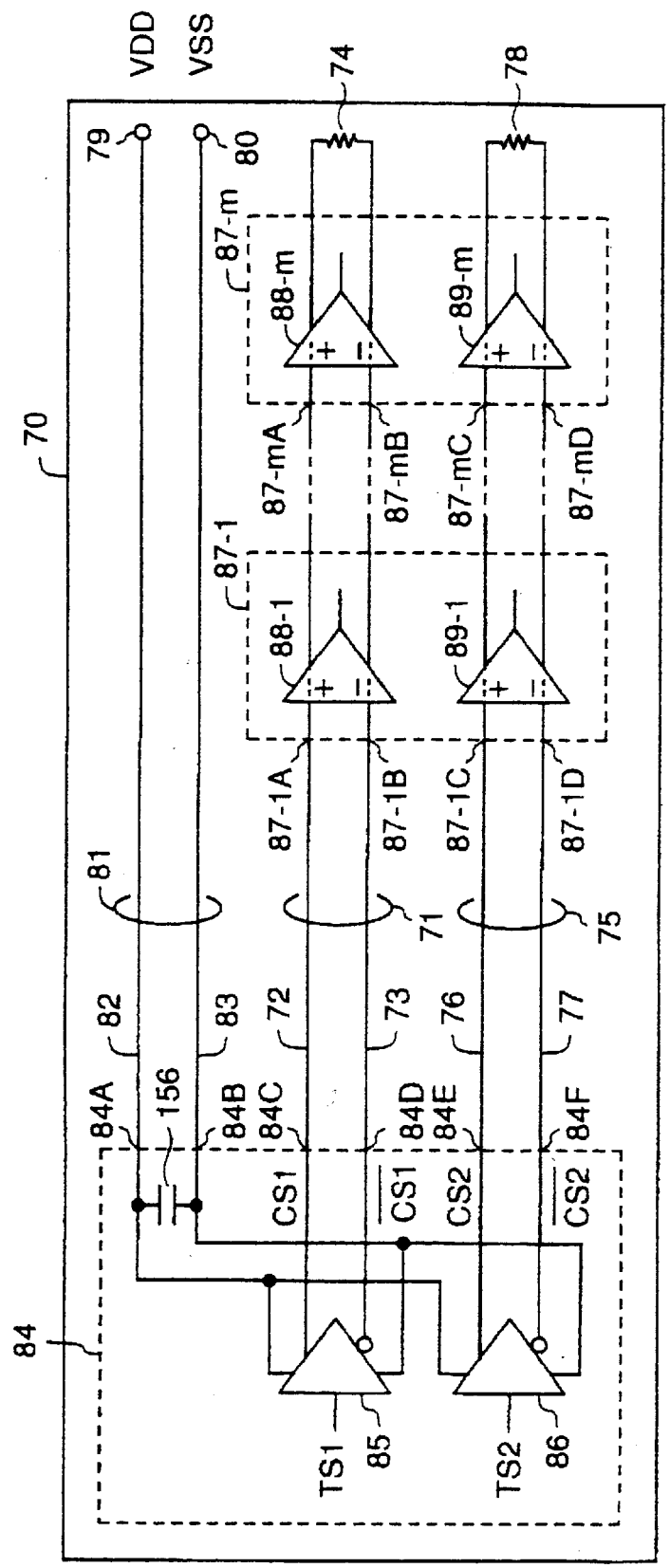
FIG. 20 is a schematic diagram of a tenth embodiment of the present invention.

Tenth Embodiment
(FIG. 20)

FIG. 20 is a schematic diagram illustrating a tenth embodiment of the present invention, in which a capacitor 156 is connected between the power supply line and the ground line for the CMOS differential drivers 85 and 86 provided in the IC chip 84. The other parts of the configuration shown in FIG. 20 are the same as those of the fourth embodiment of the present invention.

When the digital transmit signals TS1 and TS2 change, the complementary signal energy can be supplied to the CMOS differential drivers 85 and 86 from the capacitor 155 before the complementary signal energy is supplied to the CMOS differential drivers 85 and 86 via the pair 81 of power supply and ground lines. Hence, it is possible to further speed up a transfer of the complementary digital transmit signals CS1 and /CS1 and CS2 and /CS2, as compared to the fourth embodiment of the present invention.

The tenth embodiment of the present invention is particularly effective to a case where Z1>Z0 where Z1 denotes the characteristic impedance of the pair 81 of power supply and ground lines, and Z0 denotes the characteristic impedance of the pairs 71 and 75 of signal lines.

Figure 21:
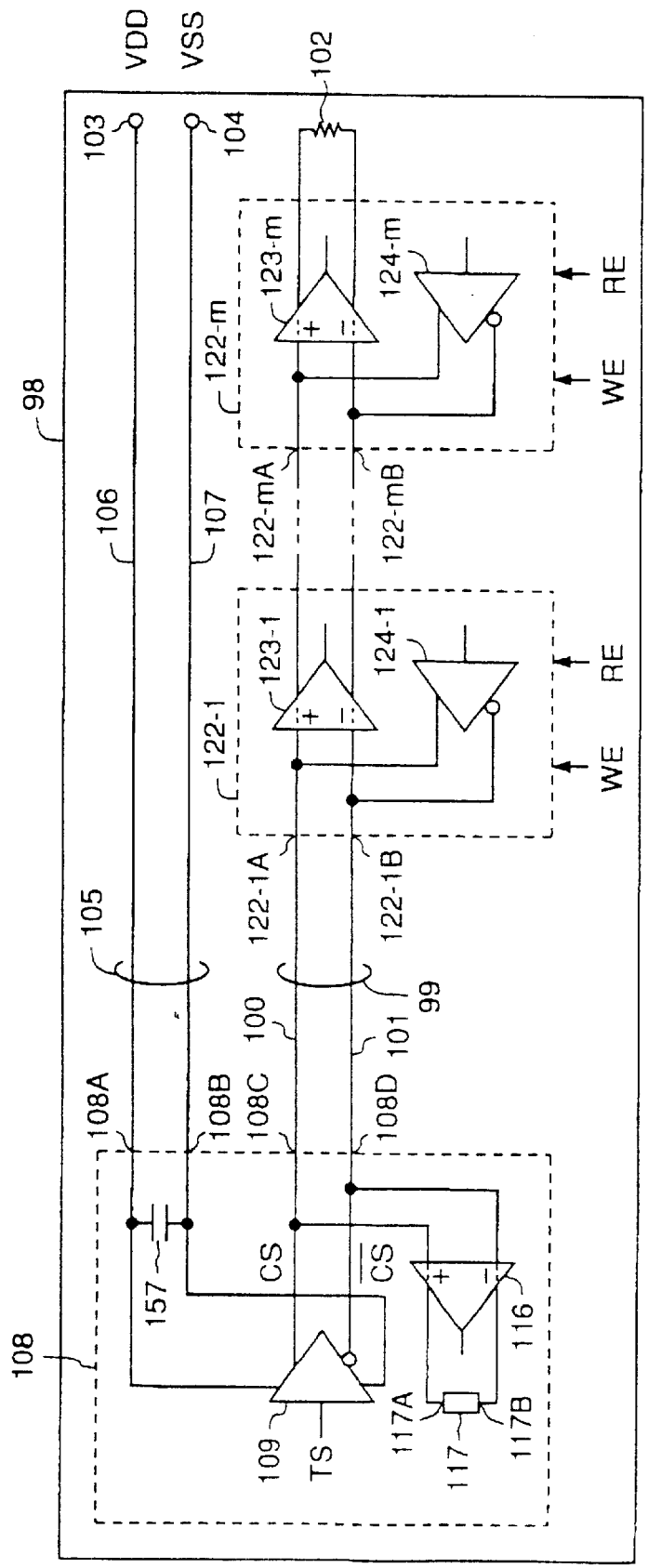
FIG. 21 is a schematic diagram of an eleventh embodiment of the present invention.

Eleventh Embodiment
(FIG. 21)

FIG. 21 is a schematic diagram of an eleventh embodiment of the present invention, in which a capacitor 157 is connected between the power supply line and the ground line for the three-state CMOS differential driver 109 provided in the IC chip 108. The other parts of the configuration shown in FIG. 21 are the same as those of the fifth embodiment of the present invention shown in FIG. 12.

When the digital transmit signal TS changes, the complementary signal energy can be supplied to the CMOS differential driver 109 from the capacitor 157 before the complementary signal energy is supplied to the CMOS differential driver 109 via the pair 105 of power supply and ground lines. Hence, it is possible to further speed up a transfer of the complementary digital transmit signals CS and /CS, as compared to the fifth embodiment of the present invention.

The eleventh embodiment of the present invention is particularly effective to a case where Z1>Z0 where Z1 denotes the characteristic impedance of the pair 105 of power supply and ground lines, and Z0 denotes the characteristic impedance of the pair 99 of signal lines.

Figure 22:
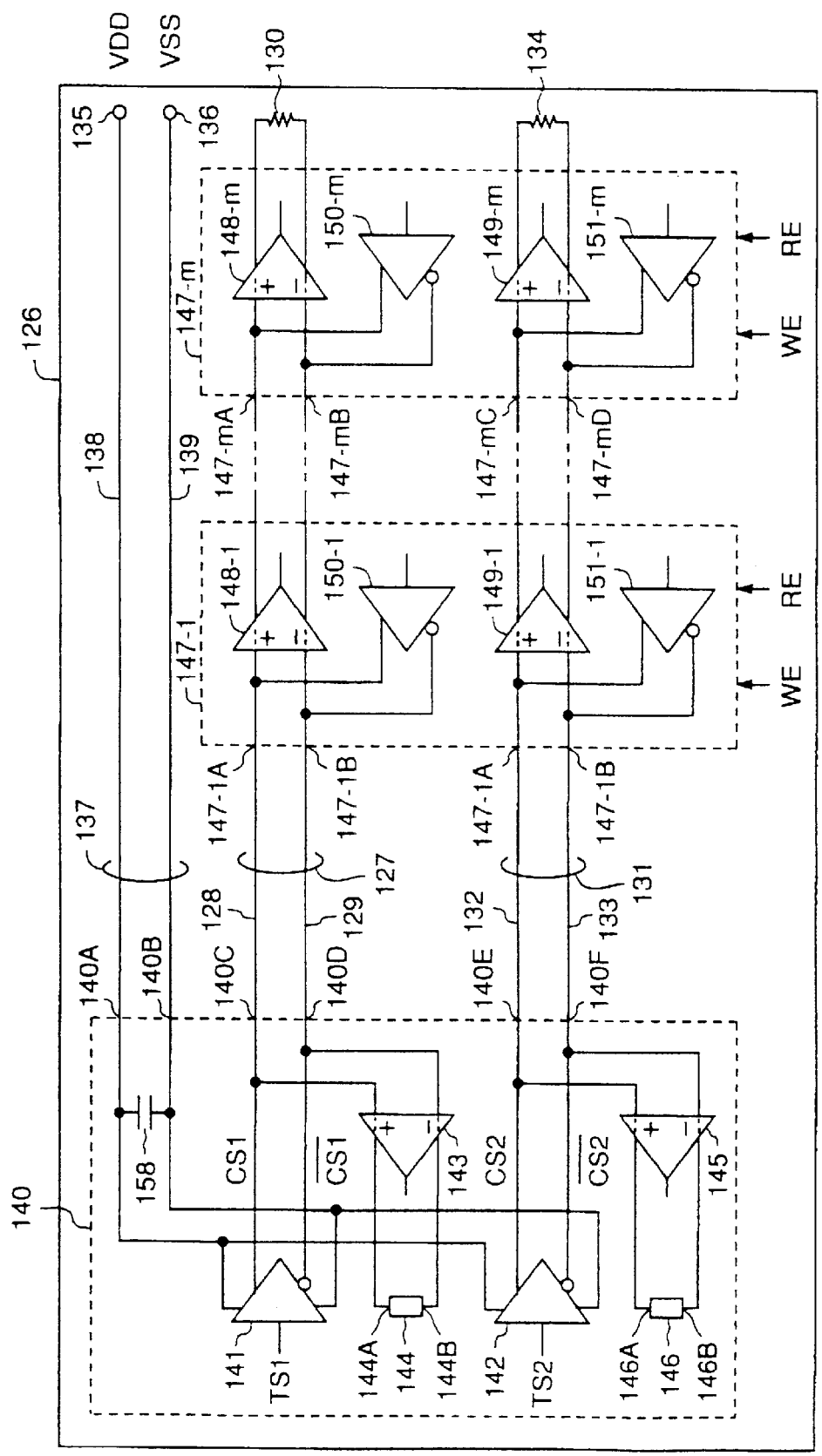
FIG. 22 is a schematic diagram of a twelfth embodiment of the present invention.

Twelfth Embodiment
(FIG. 22)

FIG. 22 is a schematic diagram of a twelfth embodiment of the present invention, in which a capacitor 158 is connected between the power supply line and the ground line for the three-state CMOS differential drivers 141 and 142 provided in the IC chip 140. The other parts of the configuration shown in FIG. 22 are the same as those of the sixth embodiment of the present invention.

When the digital transmit signals TS1 and TS2 change, the complementary signal energy can be supplied to the CMOS differential drivers 141 and 142 from the capacitor 158 before the complementary signal energy is supplied to the CMOS differential drivers 142 and 143 via the pair 137 of power supply and ground lines. Hence, it is possible to further speed up a transfer of the complementary digital transmit signals CS1 and /CS1 and CS2 and /CS2, as compared to the sixth embodiment of the present invention.

The twelfth embodiment of the present invention is particularly effective to a case where Z1>Z0 where Z1 denotes the characteristic impedance of the pair 137 of power supply and ground lines, and Z0 denotes the characteristic impedance of the pairs 127 and 131 of signal lines.

The use of the capacitor connected between the power supply line and the ground line provided in the IC chip as employed in the seventh through twelfth embodiments of the present invention can be applied to an electronic device having an IC chip equipped with a driver which outputs a non-differential digital transmit signal. In such an application, it is possible to speed up a transfer of the non-differential digital transmit signal in the electronic device.

Figure 23:
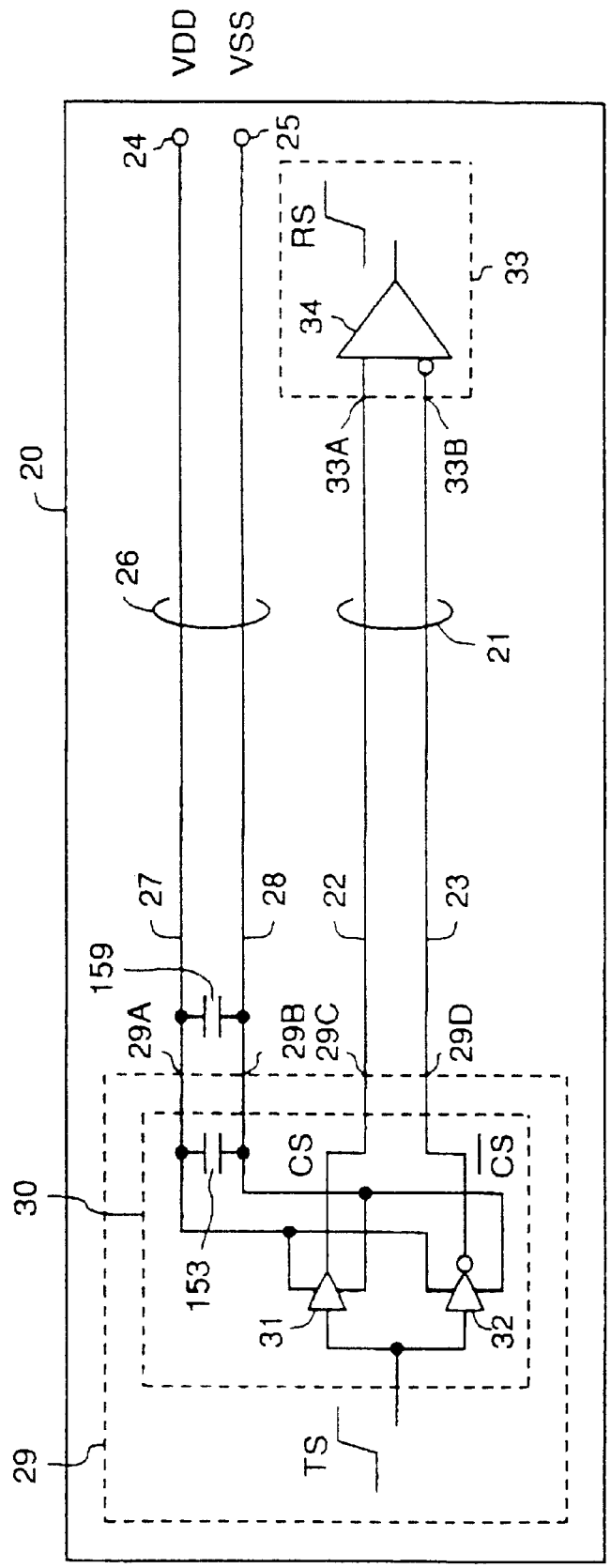
FIG. 23 is a schematic diagram of a thirteenth embodiment of the present invention.
Figure 24A:
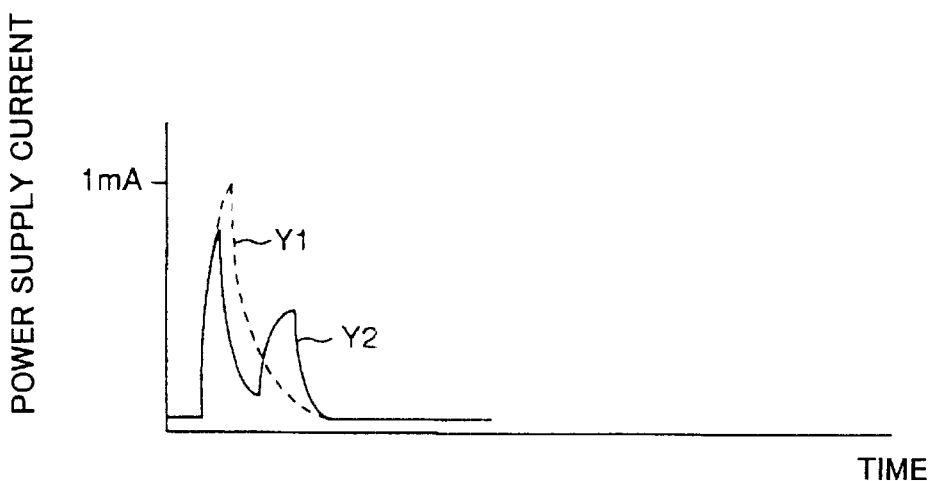
FIG. 24 is a time chart of an operation of the thirteenth embodiment of the present invention.
Figure 24B:
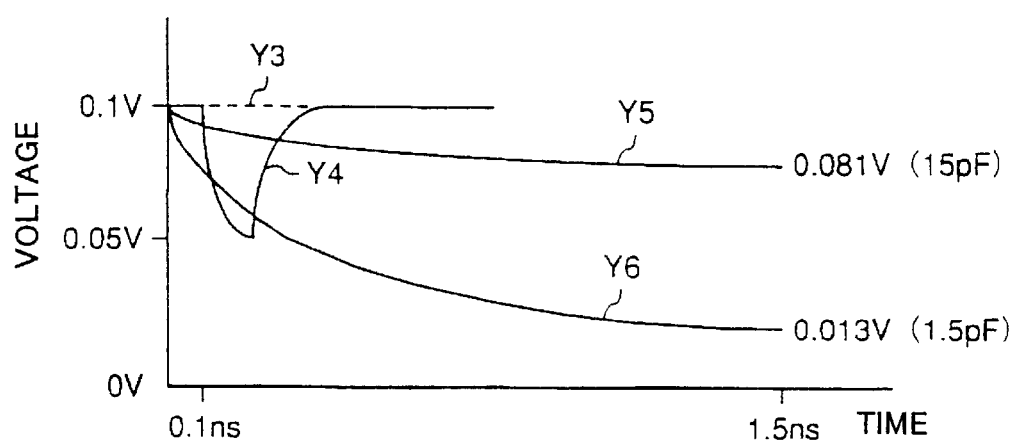

Thirteenth Embodiment
(FIGS. 23, 24A and 24B)

FIG. 23 is a schematic diagram of a thirteenth embodiment of the present invention, in which a capacitor 159 is connected between the power supply line 27 and the ground line 28 located in the vicinity of the IC chip 29. The other parts of the configuration shown in FIG. 23 are the same as those of the seventh embodiment of the present invention shown in FIG. 16.

FIGS. 24A and 24B are respectively time charts for explaining the thirteenth embodiment of the present invention. More particularly, FIG. 24A shows a power supply current (depicted by a broken line Y1) obtained when there is no voltage drop caused by an inductance in the power supply line for the CMOS differential driver 30 in the IC chip 29. Further, FIG. 24A shows a power supply current (depicted by a solid line Y2) obtained when there is a voltage drop caused by an inductance in the power supply line for the CMOS differential driver 30.

FIG. 24B shows a broken line Y3 and solid lines Y4, Y5 and Y6. The broken line Y3 indicates a power supply voltage obtained when there is no voltage drop caused by an inductance in the power supply line for the CMOS differential driver 30 provided in the IC chip 29. The solid line Y4 indicates a power supply voltage obtained when there is a voltage drop caused by an inductance in the power supply line for the CMOS differential driver 30 provided in the IC chip 29 without the capacitor 153. The solid line Y5 indicates a variation in the voltage across the capacitor 153 having a capacitance of 15 pF obtained when the power supply voltage is supplied to the signal line 22 only from the capacitor 153. The solid line Y6 indicates a variation in the voltage across the capacitor having a capacitance of 1.5 pF obtained when the power supply voltage is supplied to the signal line 22 only from the capacitor 153.

The graphs of FIGS. 24A and 24B assume that the signal line 22 has a delay time of 1.5 ns, and the power supply current I is equal to 1 mA, and that the amplitude of the digital transmit signal CS is equal to 0.1 V, and the rising time tr of the digital transmit signal TS 0.1 ns, as has been described with reference to the seventh embodiment of the present invention.

When the digital transmit signal TS starts to change its level from the low level toward the high level and becomes equal to the high level after 0.1 ns, the voltage drop of the power supply voltage is equal to 0.05 V in the case where the capacitor 153 is not used and there is a voltage drop caused by an inductance in the power supply line for the CMOS differential driver 30 in the IC chip 29. However, if the capacitor 153 is used, it is possible to reduce the voltage drop of the power supply voltage.

More particularly, when the power supply voltage is supplied to the signal line 22 only from the capacitor 153 having a capacitance of 15 pF, the power supply voltage (the voltage developing across the capacitor 153) is slightly dropped to 0.081 V even when 1.5 ns elapses after the level of the digital transmit signal TS starts to change toward the high level from the low level.

In contrast, when the power supply voltage is supplied to the signal line 22 only from the capacitor 153 having a capacitance of 1.5 pF, the power supply voltage (the voltage developing across the capacitor 153) is greatly dropped to 0.013 V even when 1.5 ns elapses after the level of the digital transmit signal TS starts to change toward the high level from the low level. However, the drop of the power supply voltage can be suppressed to approximately 0.06 V for 0.1 ns after the digital transmit signal TS changes to the high level.

With the above in mind, the capacitor 159 having a large capacitance than that of the capacitor 153 is provided between the power supply line 27 and the ground line 28 located in the vicinity of the IC chip 29. Hence, the capacitance of the capacitor 153 can be reduced and additionally the complementary digital transmit signals CS and /CS can be transferred at an increased speed. The thirteenth embodiment of the present invention is directed to realizing the above. The capacitor 159 can be formed under the pads even if the pads are miniaturized.

For example, if the capacitor 159 having a capacitance equal to five times the capacitance of the capacitor 153 or larger is connected between the power supply line 27 and the ground line 28 and is located at a distance responsible by a time equal to 1/10 of the delay time of the signal lines 22 and 23 or less from the capacitor 153, the complementary digital transmit signals CS and /CS can be transmitted at a high speed even if the capacitor 153 has a capacitance of 1.5 pF that is equal to 1/10 of the capacitance thereof (15 pF) used in the seventh embodiment of the present invention.

When the digital transmit signal TS changes, the complementary signal energy can be supplied to the CMOS differential driver 30 from the capacitor 153 and to the capacitor 153 from the capacitor 159 before the complementary signal energy is supplied to the CMOS differential driver 30 via the pair 26 of power supply and ground lines. Hence, it is possible to further speed up a transfer of the complementary digital transmit signals CS and /CS, as in the case of the seventh embodiment of the present invention and to reduce the capacitance of the capacitor 153. The above contributes to miniaturizing the IC chip 29.

The thirteenth embodiment of the present invention is particularly effective to a case where Z1>Z0 where Z1 denotes the characteristic impedance of the pair 26 of power supply and ground lines, and Z0 denotes the characteristic impedance of the pair 21 of signal lines.

Figure 25:
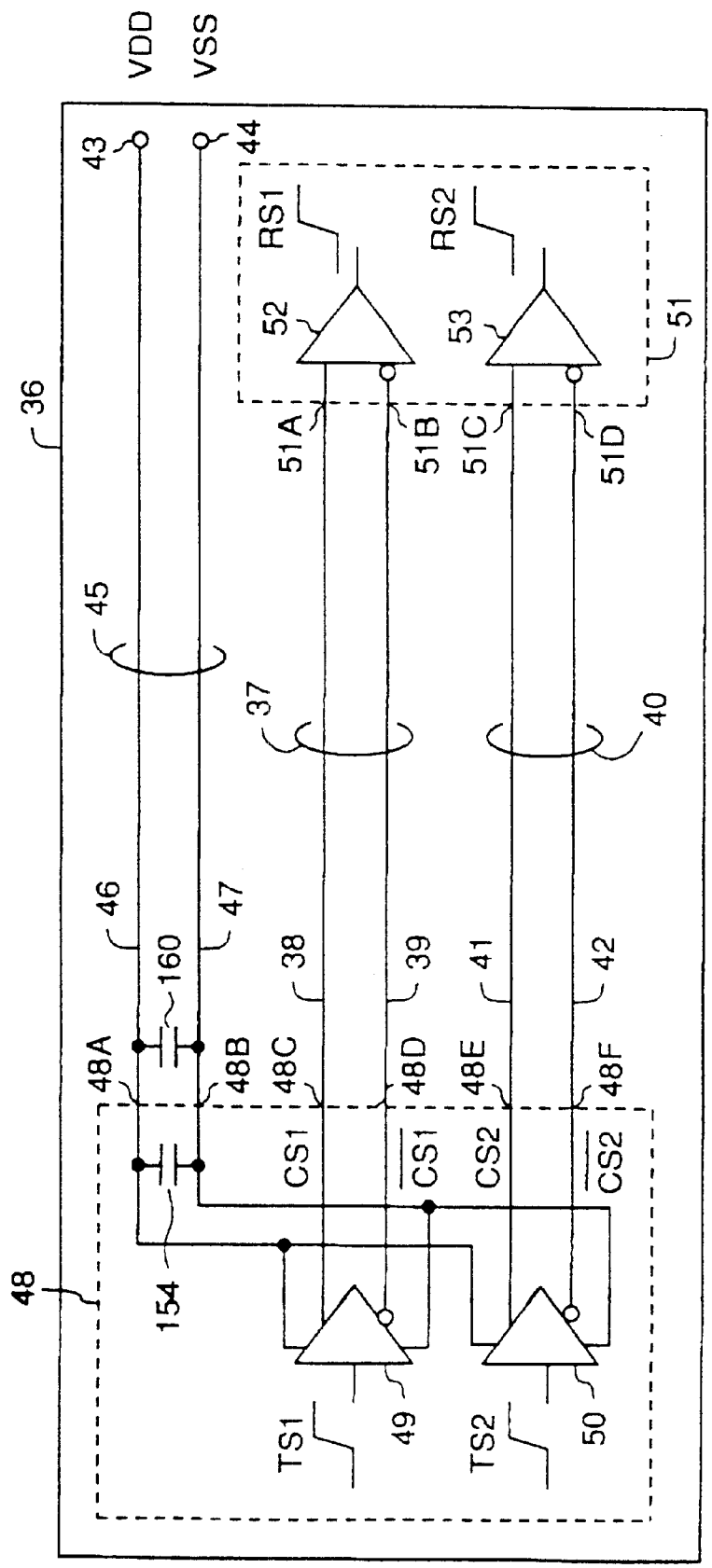
FIG. 25 is a schematic diagram of a fourteenth embodiment of the present invention.

Fourteenth Embodiment
(FIG. 25)

FIG. 25 is a schematic diagram of a fourteenth embodiment of the present invention, in which a capacitor 160 is connected between the power supply line 46 and the ground line 47 located in the vicinity of the IC chip 48. The other parts of the configuration shown in FIG. 25 are the same as those of the eighth embodiment of the present invention.

When the digital transmit signals TS1 and TS2 change, the complementary signal energy can be supplied to the CMOS differential drivers 49 and 50 from the capacitor 154 and can be supplied to the capacitor 154 from the capacitor 160 before the complementary signal energy is supplied to the CMOS differential drivers 49 and 50 via the pair 45 of power supply and ground lines. Hence, it is possible to further speed up a transfer of the complementary digital transmit signals CS1 and /CS1 and CS2 and /CS2, as compared to the eighth embodiment of the present invention.

The fourteenth embodiment of the present invention is particularly effective to a case where Z1>Z0 where Z1 denotes the characteristic impedance of the pair 45 of power supply and ground lines, and Z0 denotes the characteristic impedance of the pairs 37 and 40 of signal lines.

Figure 26:
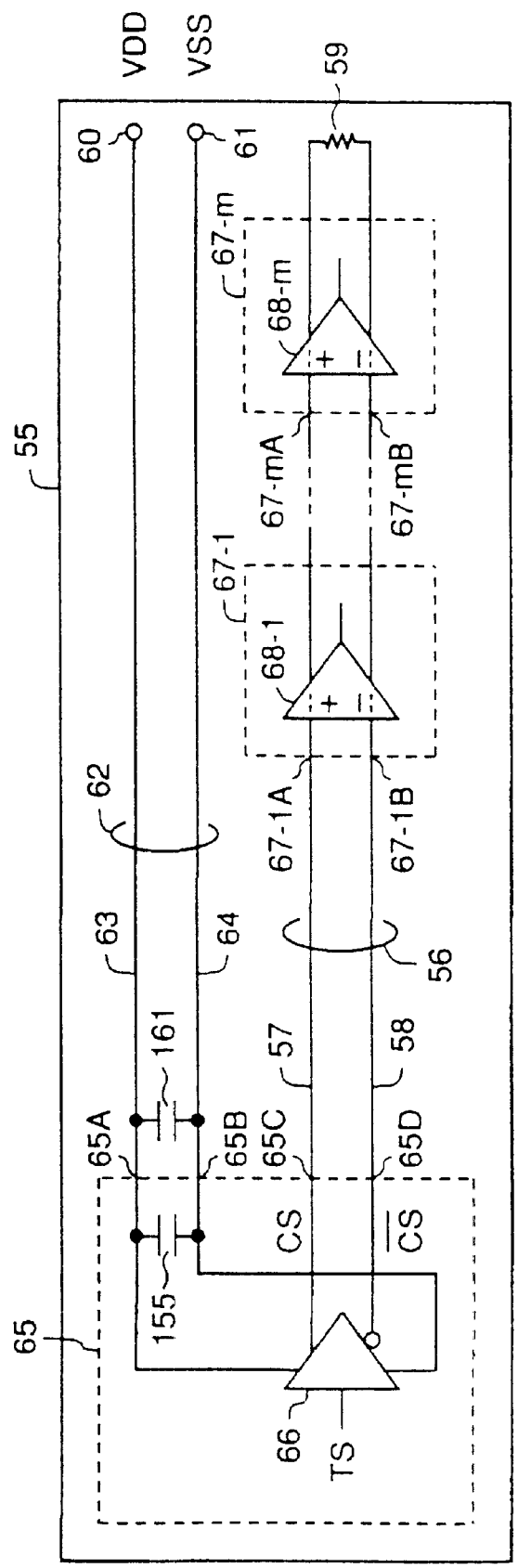
FIG. 26 is a schematic diagram of a fifteenth embodiment of the present invention.

Fifteenth Embodiment
(FIG. 26)

FIG. 26 is a schematic diagram of a fifteenth embodiment of the present invention, in which a capacitor 161 is connected between the power supply line 63 and the ground line 64 located in the vicinity of the IC chip 65. The other parts of the configuration shown in FIG. 26 are the same as those of the ninth embodiment of the present invention shown in FIG. 19.

When the digital transmit signal TS changes, the complementary signal energy can be supplied to the CMOS differential driver 66 from the capacitor 155 and to the capacitor 155 from the capacitor 161 before the complementary signal energy is supplied to the CMOS differential driver 66 via the pair 62 of power supply and ground lines. Hence, it is possible to further speed up a transfer of the complementary digital transmit signals CS and /CS, as in the case of the seventh embodiment of the present invention and to reduce the capacitance of the capacitor 155. The above contributes to miniaturizing the IC chip 65.

The fifteenth embodiment of the present invention is particularly effective to a case where Z1>Z0 where Z1 denotes the characteristic impedance of the pair 62 of power supply and ground lines, and Z0 denotes the characteristic impedance of the pair 56 of signal lines.

Figure 27:
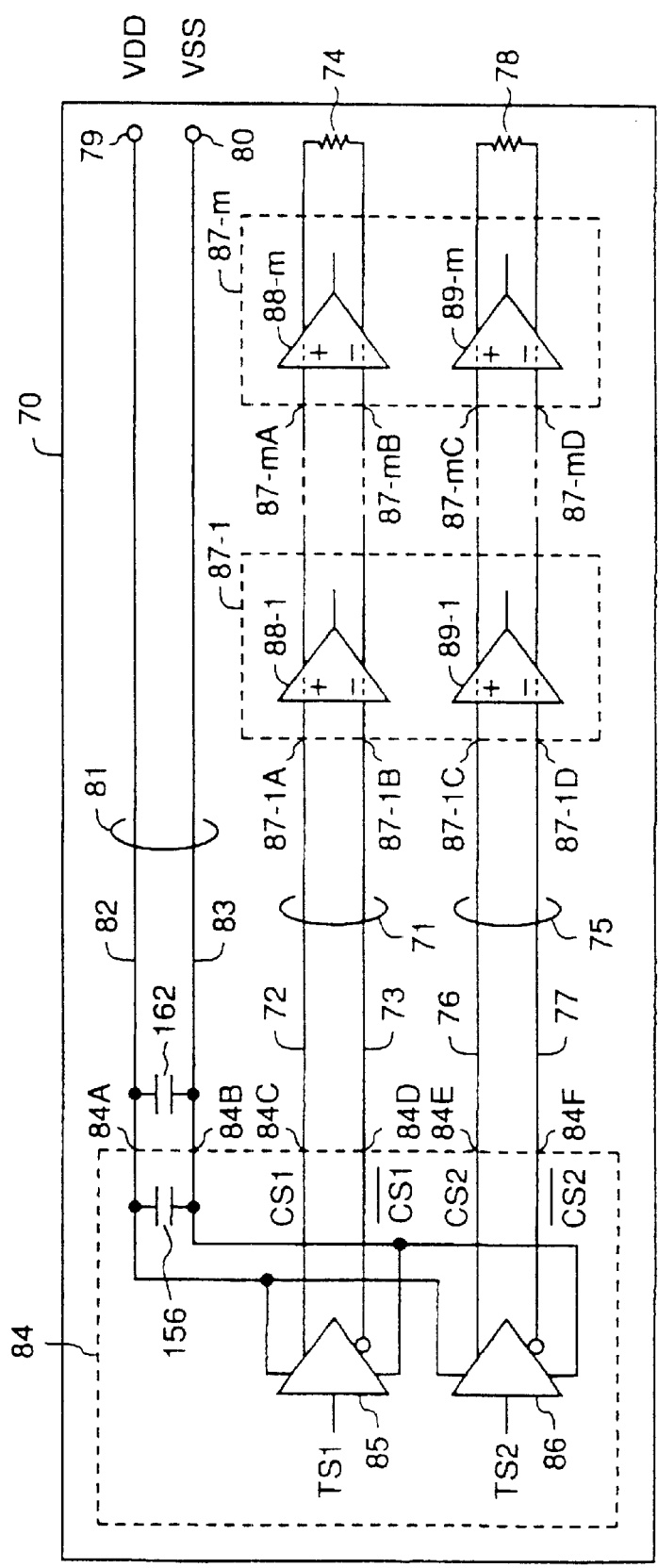
FIG. 27 is a schematic diagram of a sixteenth embodiment of the present invention.

Sixteenth Embodiment
(FIG. 27)

FIG. 27 is a schematic diagram of a sixteenth embodiment of the present invention, in which a capacitor 162 is connected between the power supply line 82 and the ground line 83 located in the vicinity of the IC chip 84. The other parts of the configuration shown in FIG. 27 are the same as those of the tenth embodiment of the present invention shown in FIG. 20.

When the digital transmit signals TS1 and TS2 change, the complementary signal energy can be supplied to the CMOS differential drivers 85 and 86 from the capacitor 156 and can be supplied to the capacitor 156 from the capacitor 162 before the complementary signal energy is supplied to the CMOS differential drivers 85 and 86 via the pair 81 of power supply and ground lines. Hence, it is possible to further speed up a transfer of the complementary digital transmit signals CS1 and /CS1 and CS2 and /CS2, as compared to the tenth embodiment of the present invention.

The sixteenth embodiment of the present invention is particularly effective to a case where Z1>Z0 where Z1 denotes the characteristic impedance of the pair 81 of power supply and ground lines, and Z0 denotes the characteristic impedance of the pairs 71 and 75 of signal lines.

Figure 28:
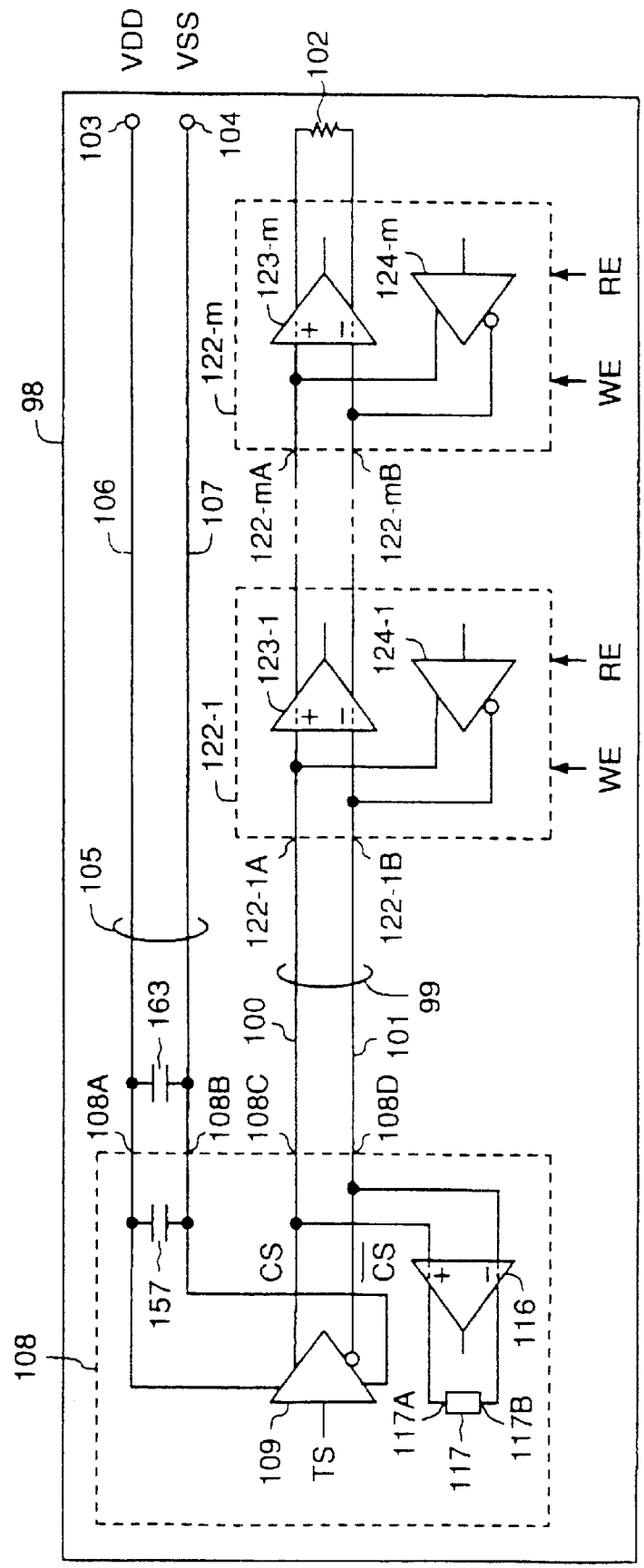
FIG. 28 is a schematic diagram of a seventeenth embodiment of the present invention.

Seventeenth Embodiment
(FIG. 28)

FIG. 28 is a schematic diagram of a seventeenth embodiment of the present invention, in which a capacitor 163 is connected between the power supply line 106 and the ground line 107 located in the vicinity of the IC chip 108. The other parts of the configuration shown in FIG. 28 are the same as those of the eleventh embodiment of the present invention shown in FIG. 20.

When the digital transmit signal TS changes, the complementary signal energy can be supplied to the CMOS differential driver 109 from the capacitor 157 and to the capacitor 157 from the capacitor 163 before the complementary signal energy is supplied to the CMOS differential driver 109 via the pair 105 of power supply and ground lines. Hence, it is possible to further speed up a transfer of the complementary digital transmit signals CS and /CS, as in the case of the seventh embodiment of the present invention and to reduce the capacitance of the capacitor 157. The above contributes to miniaturizing the IC chip 108.

The seventeenth embodiment of the present invention is particularly effective to a case where Z1>Z0 where Z1 denotes the characteristic impedance of the pair 105 of power supply and ground lines, and Z0 denotes the characteristic impedance of the pair 99 of signal lines.

Figure 29:
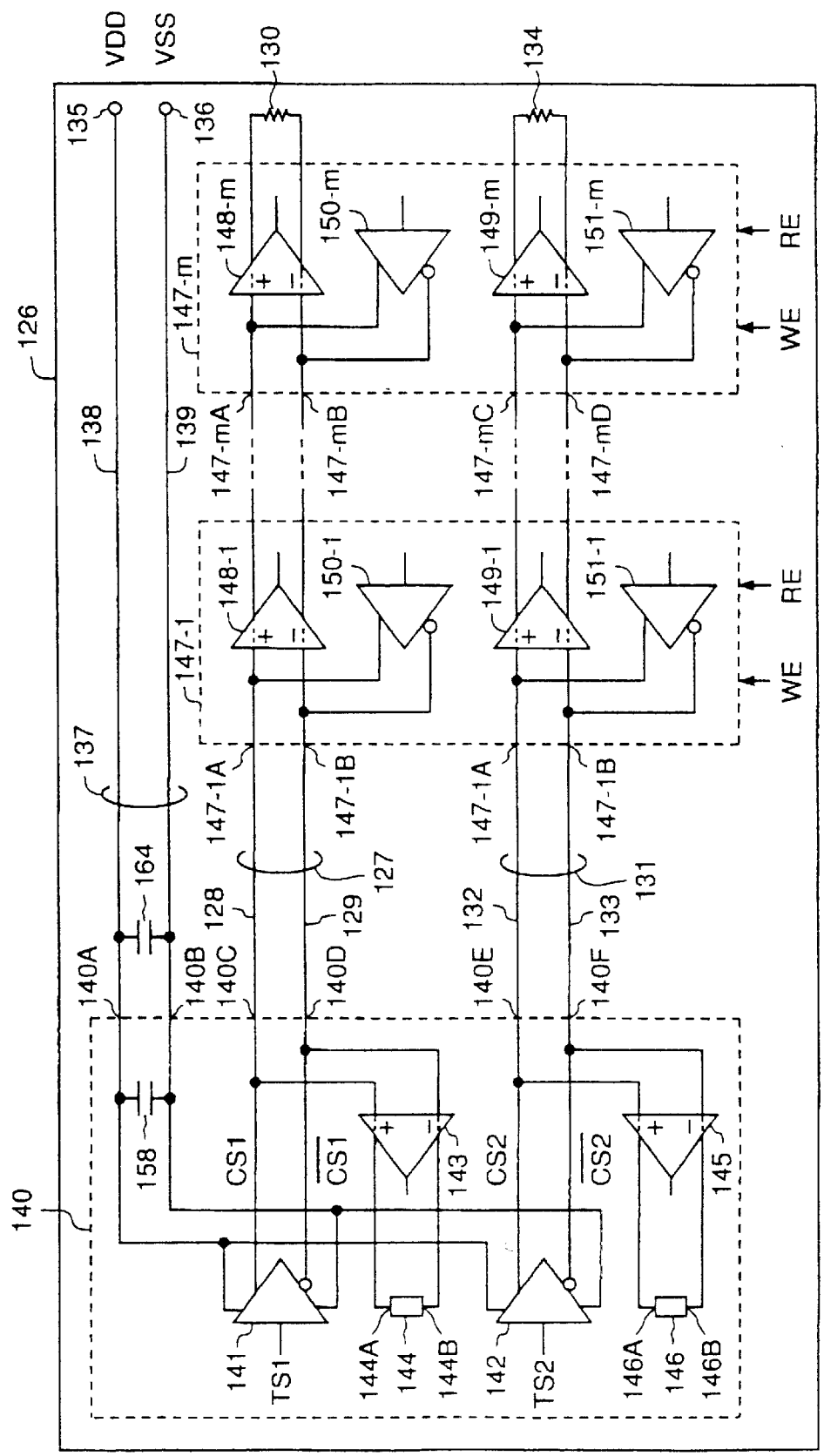
FIG. 29 is a schematic diagram of an eighteenth embodiment of the present invention.

Eighteenth Embodiment
(FIG. 29)

FIG. 29 is a schematic diagram of an eighteenth embodiment of the present invention, in which a capacitor 164 is connected between the power supply line 138 and the ground line 139 located in the vicinity of the IC chip 140. The other parts of the configuration shown in FIG. 29 are the same as those of the twelfth embodiment of the present invention shown in FIG. 22.

When the digital transmit signals TS1 and TS2 change, the complementary signal energy can be supplied to the CMOS differential drivers 141 and 142 from the capacitor 158 and can be supplied to the capacitor 158 from the capacitor 164 before the complementary signal energy is supplied to the CMOS differential drivers 141 and 142 via the pair 137 of power supply and ground lines. Hence, it is possible to further speed up a transfer of the complementary digital transmit signals CS1 and /CS1 and CS2 and /CS2, as compared to the tenth embodiment of the present invention.

The eighteenth embodiment of the present invention is particularly effective to a case where Z1>Z0 where Z1 denotes the characteristic impedance of the pair 137 of power supply and ground lines, and Z0 denotes the characteristic impedance of the pairs 127 and 131 of signal lines.

The use of the capacitor connected between the power supply line and the ground line provided in the IC chip as employed in the thirteenth through eighteenth embodiments of the present invention can be applied to an electronic device having an IC chip equipped with a driver which outputs a non-differential digital transmit signal. In such an application, it is possible to speed up a transfer of the non-differential digital transmit signal in the electronic device.

A low-pass filter can be applied to any of the first through eighteenth embodiments of the present invention. The low-pass filter is provided at the output side of the differential driver which outputs the complementary digital transmit signal, and functions to cut the third harmonic of the digital transmit signal and the higher harmonics thereof. Hence, it is possible to transfer the digital transmit signal with an improved waveform.

In addition to the above low-pass filter, another low-pass filter for cutting the third harmonic of the digital transmit signal and the higher harmonics can be provided to the power supply voltage input terminal and the ground voltage input terminal of the differential driver. In this case, the digital transmit signal can be transferred with a further improved waveform.

Alternatively, the low-pass filter for cutting the third harmonic of the digital transmit signal and the higher harmonics thereof can be made up of a band-pass filter having a pass band of the basic frequency components of the digital transmit signal, and a low-pass filter having a pass band of the dc component. The above band-pass filter and the low-pass filter are connected in parallel.

The low-pass filter may be formed within the IC chip or may be provided between the line and the IC chip.

The use of the low-pass filter can be applied to an electronic device having an IC chip equipped with a driver which outputs a non-differential digital transmit signal. In such an application, it is possible to transfer the non-differential digital transmit signal with an improved waveform in the electronic device.

Nineteenth Embodiment
(FIGS. 30 Through 34)

Figure 30:
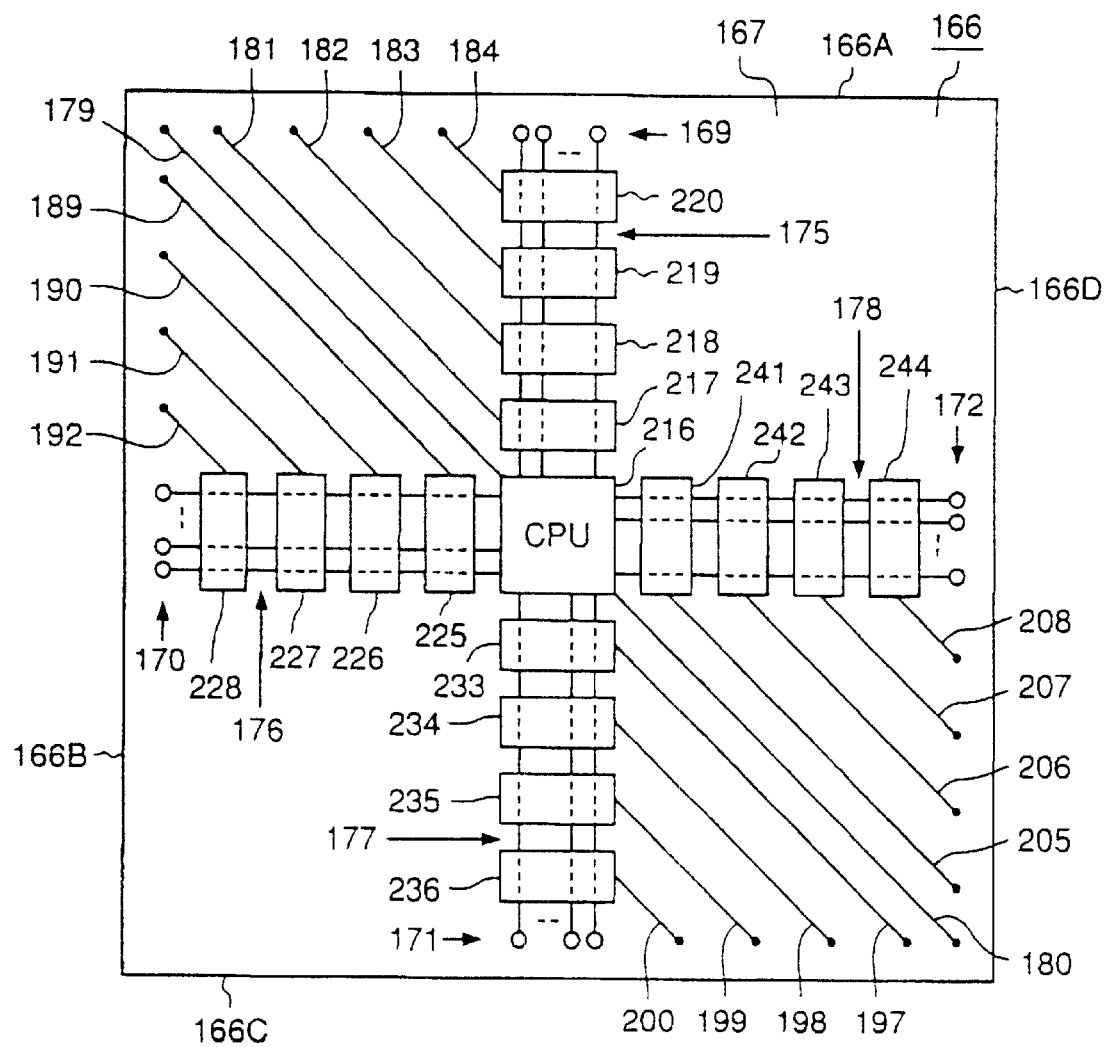
FIG. 30 is a schematic plan view of a nineteenth embodiment of the present invention.
Figure 31:
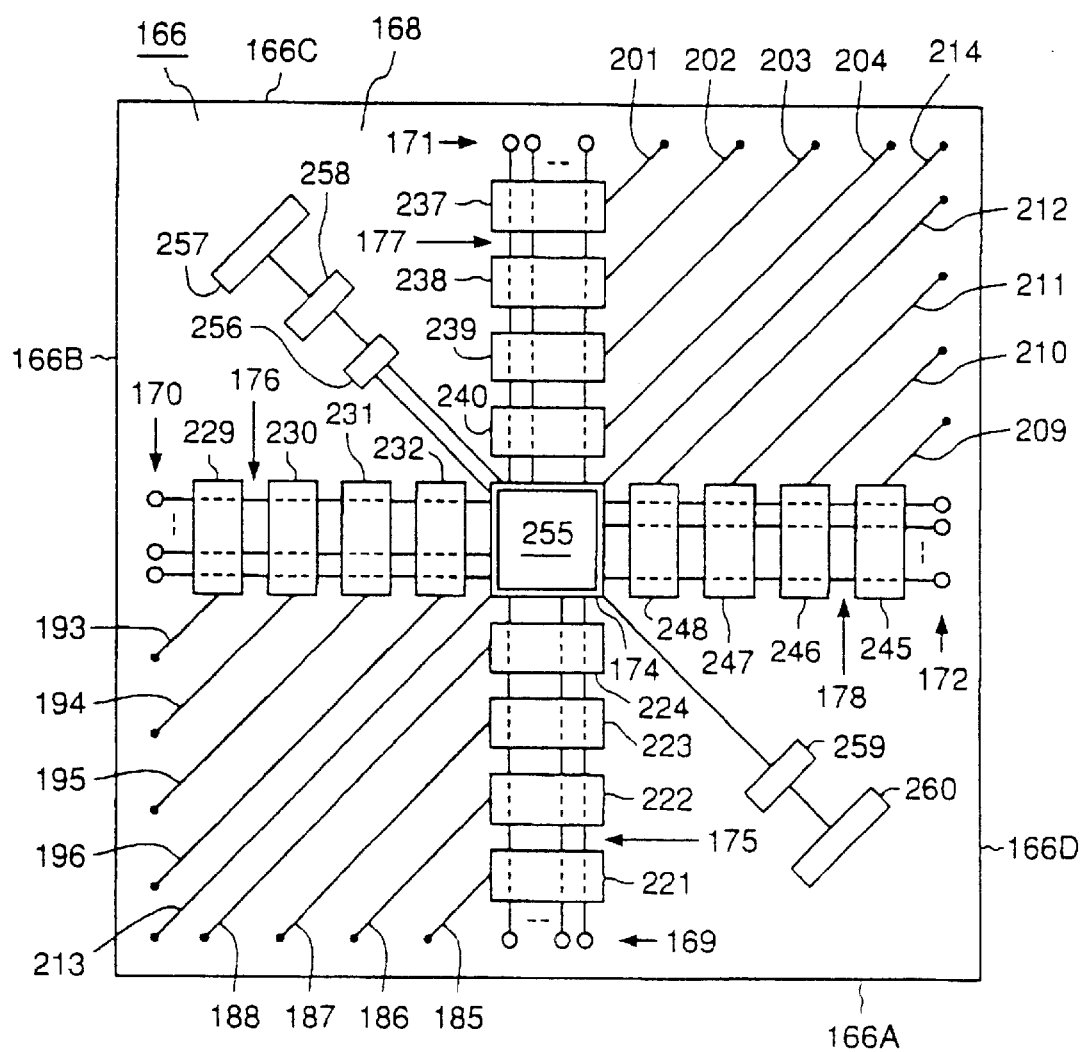
FIG. 31 is a schematic bottom view of the nineteenth embodiment of the present invention.

FIGS. 30 and 31 are respectively schematic plan and bottom views of a nineteenth embodiment of the present invention. In these figures, there are illustrated a wiring board 166, a front surface 167 of the wiring board 166, a back surface 168 thereof, and groups 169–172 of through holes.

Figure 32:
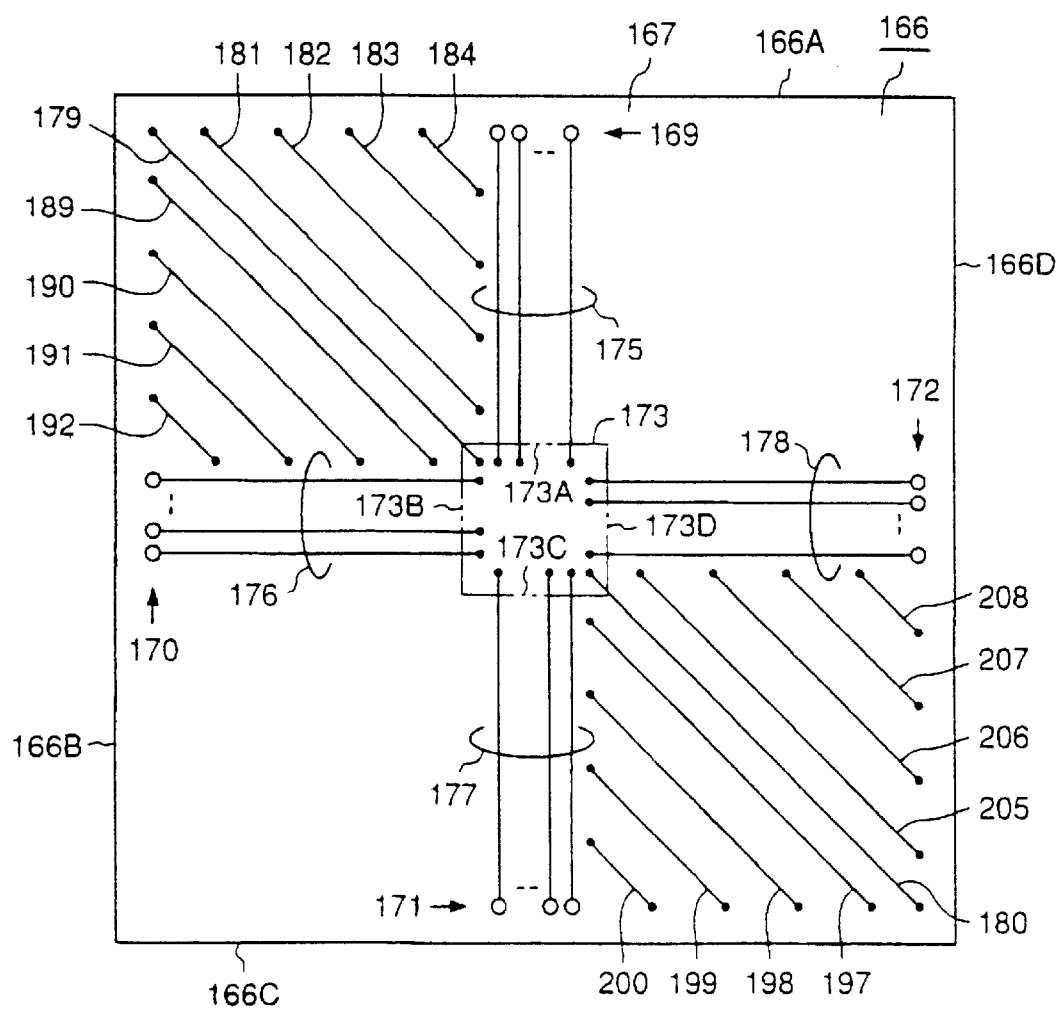
FIG. 32 is a schematic plan view of some lines formed on a wiring board used in the nineteenth embodiment of the present invention.
Figure 33:
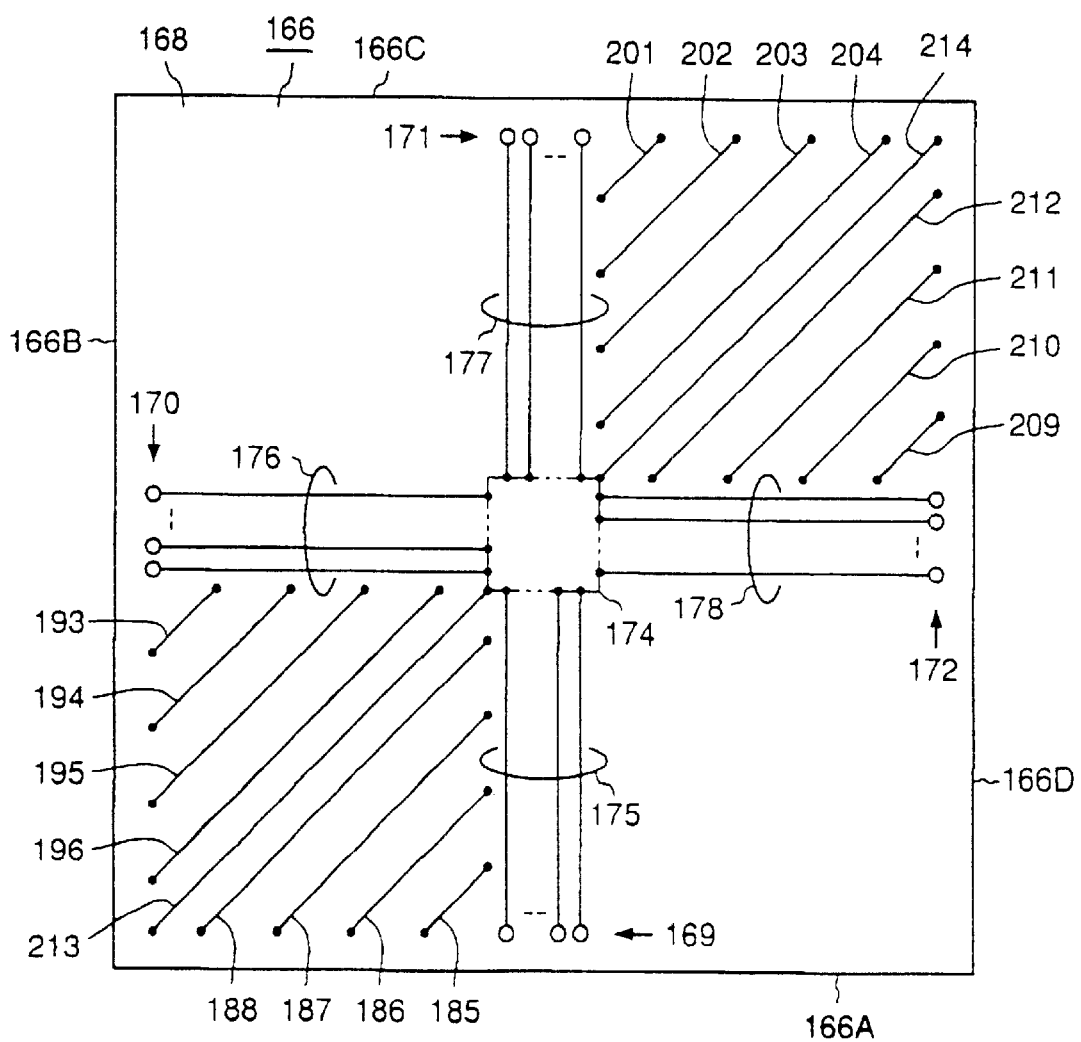
FIG. 33 is a schematic bottom view of some lines formed on the wiring board used in the nineteenth embodiment of the present invention.

FIGS. 32 and 33 are respectively schematic plan and bottom views of part of the lines formed on the front surface 167 and the back surface 168 of the wiring board 166. In FIG. 32, a CPU mounting area 173 of a rectangular shape is defined in the central portion on the front surface 167 of the wiring board 166. In FIG. 33, a terminating resistor formation area 174 of a rectangular shape is defined in the central portion on the back surface 168 of the wiring board 166.

In FIGS. 32 and 33, a group 175 of lines is formed on the main surface 167 and extends from a portion close to a side 173A of the CPU mounting area 173 toward a side 166A of the wiring board 166. The group 175 is folded to the back side 168 of the wiring board 166 via the group 169 of through holes. That is, the group 175 penetrates through the wiring board 166. Then, the group 175 extends on the back surface 168 toward the terminating resistor formation area 174. The group 175 includes pairs of signal lines over which digital transmit signals are transferred in the complementary fashion. The pairs of signal lines are formed of equal-length parallel lines and include data lines address signal lines, control signal lines, and clock signal lines.

A group 176 of lines is formed on the main surface 167 and extends from a portion close to a side 173B of the CPU mounting area 173 toward a side 166B of the wiring board 166. The group 176 is folded to the back side 168 of the wiring board 166 via the group 170 of through holes. Then, the group 176 extends on the back surface 168 toward the terminating resistor formation area 174. The group 176 includes pairs of signal lines over which digital transmit signals are transferred in the complementary fashion. The pairs of signal lines are formed of equal-length parallel lines and include data lines address signal lines, control signal lines, and clock signal lines.

A group 177 of lines is formed on the main surface 167 and extends from a portion close to a side 173C of the CPU mounting area 173 toward a side 166C of the wiring board 166. The group 177 is folded to the back side 168 of the wiring board 166 via the group 171 of through holes. Then, the group 177 extends on the back surface 168 toward the terminating resistor formation area 174. The group 177 includes pairs of signal lines over which digital transmit signals are transferred in the complementary fashion. The pairs of signal lines are formed of equal-length parallel lines and include data lines address signal lines, control signal lines, and clock signal lines.

A group 178 of lines is formed on the main surface 167 and extends from a portion close to a side 173D of the CPU mounting area 173 toward a side 166D of the wiring board 166. The group 178 is folded to the back side 168 of the wiring board 166 via the group 172 of through holes. Then, the group 178 extends on the back surface 168 toward the terminating resistor formation area 174. The group 178 includes pairs of signal lines over which digital transmit signals are transferred in the complementary fashion. The pairs of signal lines are formed of equal-length parallel lines and include data lines address signal lines, control signal lines, and clock signal lines.

The groups 175, 176, 177 and 178 may have an identical number of lines.

In FIG. 32, there are illustrated a pair of a power supply line 179 and a ground line 180 for the CPU, and pairs of power supply lines and ground lines 181–184, 189–192, 197–200 and 205–208 for a memory. In FIG. 33, there are illustrated pairs of power supply lines and ground lines 185–188, 193–196, 201–204, 209–212 for a memory, and pairs of power supply and ground lines 213 and 214 for an input/output chip.

In FIG. 30, a CPU 216 is mounted on the cPu mounting area 173 formed on the front surface 167 of the wiring board 166. The CPU 216 includes a data input/output terminal, an address output terminal, a control signal output terminal, a clock input terminal and a clock output terminals, which terminals are connected to the groups 175–178 of signal lines. Further. the CPU 216 includes a power supply voltage input terminal and a ground voltage input terminal, these terminals being connected to the pairs 178 and 180 of power supply and ground lines.

In FIGS. 30 and 31, memories 217–224, 225–232, 233–240 and 241–248 of an identical type are mounted on the front and back surfaces 167 and 168 of the-wiring board 166.

The memories 217–224 have data input/output terminals, address input terminals, control signal input terminals, and clock input terminals, these terminals being connected to the group 175 of signal lines. Further, the memories 217–224 have power supply voltage input terminals and ground voltage input terminals, which terminals are connected to the pairs 181–188 of power supply and ground lines.

The memories 225–232 have data input/output terminals, address input terminals, control signal input terminals, and clock input terminals, these terminals being connected to the group 176 of signal lines. Further, the memories 225–232 have power supply voltage input terminals and ground voltage input terminals, which terminals are connected to the pairs 189–196 of power supply and ground lines.

The memories 233–240 have data input/output terminals, address input terminals, control signal input terminals, and clock input terminals, these terminals being connected to the group 177 of signal lines. Further, the memories 233–240 have power supply voltage input terminals and ground voltage input terminals, which terminals are connected to the pairs 197–204 of power supply and ground lines.

The memories 241–248 have data input/output terminals, address input terminals, control signal input terminals, and clock input terminals, these terminals being connected to the group 178 of signal lines. Further, the memories 241–248 have power supply voltage input terminals and ground voltage input terminals, which terminals are connected to the pairs 205–212 of power supply and ground lines.

Connections with the memories 217, 225, 233 and 241 are respectively made in positions on the groups of signal lines 175, 176, 177 and 178, these positions being located at an equal distance from the signal terminals of the CPU 216 connected to the groups 175, 176, 177 and 178.

Connections with the memories 218, 226, 234 and 242 are respectively made in positions on the groups of signal lines 175, 176, 177 and 178, these positions being located at an equal distance from the signal terminals of the CPU 216 connected to the groups 175, 176, 177 and 178.

Connections with the memories 219, 227, 235 and 243 are respectively made in positions on the groups of signal lines 175, 176, 177 and 178, these positions being located at an equal distance from the signal terminals of the CPU 216 connected to the groups 175, 176, 177 and 178.

Connections with the memories 220, 228, 236 and 244 are respectively made in positions on the groups of signal lines 175, 176, 177 and 178, these positions being located at an equal distance from the signal terminals of the CPU 216 connected to the groups 175, 176, 177 and 178.

Connections with the memories 221, 229, 237 and 245 are respectively made in positions on the groups of signal lines 175, 176, 177 and 178, these positions being located at an equal distance from the signal terminals of the CPU 216 connected to the groups 175, 176, 177 and 178.

Connections with the memories 222, 230, 238 and 246 are respectively made in positions on the groups of signal lines 175, 176, 177 and 178, these positions being located at an equal distance from the signal terminals of the CPU 216 connected to the groups 175, 176, 177 and 178.

Connections with the memories 223, 231, 239 and 247 are respectively made in positions on the groups of signal lines 175, 176, 177 and 178, these positions being located at an equal distance from the signal terminals of the CPU 216 connected to the groups 175, 176, 177 and 178.

Connections with the memories 224, 232, 240 and 248 are respectively made in positions on the groups of signal lines 175, 176, 177 and 178, these positions being located at an equal distance from the signal terminals of the CPU 216 connected to the groups 175, 176, 177 and 178.

Figure 34:
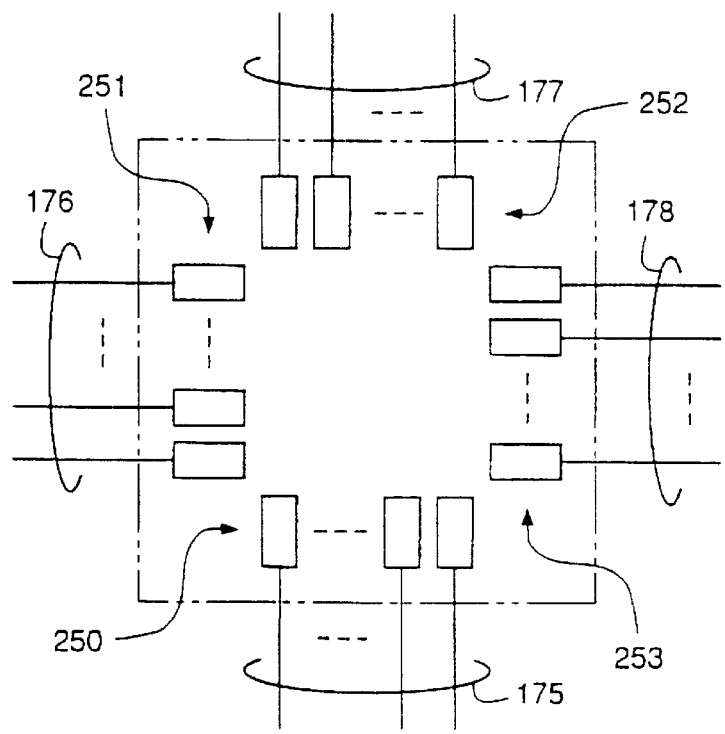
FIG. 34 is a schematic bottom view of a terminating resistor formation area provided on the wiring board used in the nineteenth embodiment of the present invention.

FIG. 34 is a schematic plan view of the terminating resistor formation area 174. As shown in FIG. 34, four groups 250, 251, 252 and 253 of terminating resistors are formed in the terminating resistor formation area 174. The group 250 of terminating resistors terminates the pairs of signal lines of the group 175. The group 251 of terminating resistors terminates the pairs of signal lines of the group 176. The group 252 of terminating resistors terminates the pairs of signal lines of the group 177. The group 253 of terminating resistors terminates the pairs of signal lines of the group 178.

Turning to FIG. 31 again, there are illustrated an input/output chip 255, a clock generator 256, a PCI port 257, a video/voice port 258, a signal compression/decompression chip 259, and a communication port 260.

The nineteenth embodiment of the present invention thus configured can configure an electronic device in which the CPU 216 and the 32 memories 217–248 accessed by the CPU 216 are connected by the signal lines of the equal and shortest length.

The signal lines forming the groups 175, 176, 177 and 178 are pairs of equal-length parallel lines over which the complementary digital transmit signals are transferred. Hence, the signal lines can be caused to function as transfer paths in which the electromagnetic field is approximately closed. Thus, it is possible to transfer, at a higher speed, the complementary signal energy necessary for transferring signals between the CPU 216 and the memories accessed by the CPU 216.

Each of the pairs 179, 180, 181–212 associated with the CPU 216 and the memories 217–248 is formed by two equal-length parallel lines, one of which serves as a power supply line and the other serves as a ground line. Hence, these pairs of power supply and ground lines can function as transfer paths in which the electromagnetic field is approximately closed with respect to the complementary signal energy to be supplied to the CPU 216 and the memories 217–248 Hence, the complementary signal energy can be transferred to the CPU 216 and the memories 217–248 at a higher speed.

According to the nineteenth embodiment of the present invention, it is possible to provide, by using a single wiring board (wiring board 166), an electronic device in which the CPU 216 and the 32 memories 217–248 accessed by the CPU 216 are connected by the signal lines of the equal and shortest length.

Figure 35:
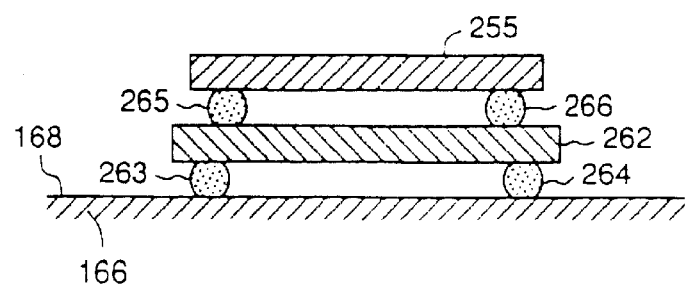
FIG. 35 is a schematic cross-sectional view of a twentieth embodiment of the present invention.

Twentieth Embodiment
(FIG. 35)

FIG. 35 is a schematic cross-sectional view of a twentieth embodiment of the present invention, in which the terminating resistor formation area 174 is provided on the back surface 168 of the wiring board 166, but a terminating resistor chip 262 including a terminating resistor is mounted on a central portion of the back surface 168. The input/output chip 255 is mounted on the terminating resistor chip 262. The other parts of the structure shown in FIG. 35 are the same as those of the nineteenth embodiment of the present invention shown in FIGS. 30 and 31. In FIG. 35, reference numbers 263–266 indicate solder bumps.

According to the twentieth embodiment of the present invention, it is possible to transfer, at a higher speed, signals between the CPU 216 and the memories accessed by the CPU 216 in an electronic device using the single wiring board 166 in which it is required to connect the CPU 216 and the 32 memories 217–248 by the equal-length parallel lines.

Figure 36:
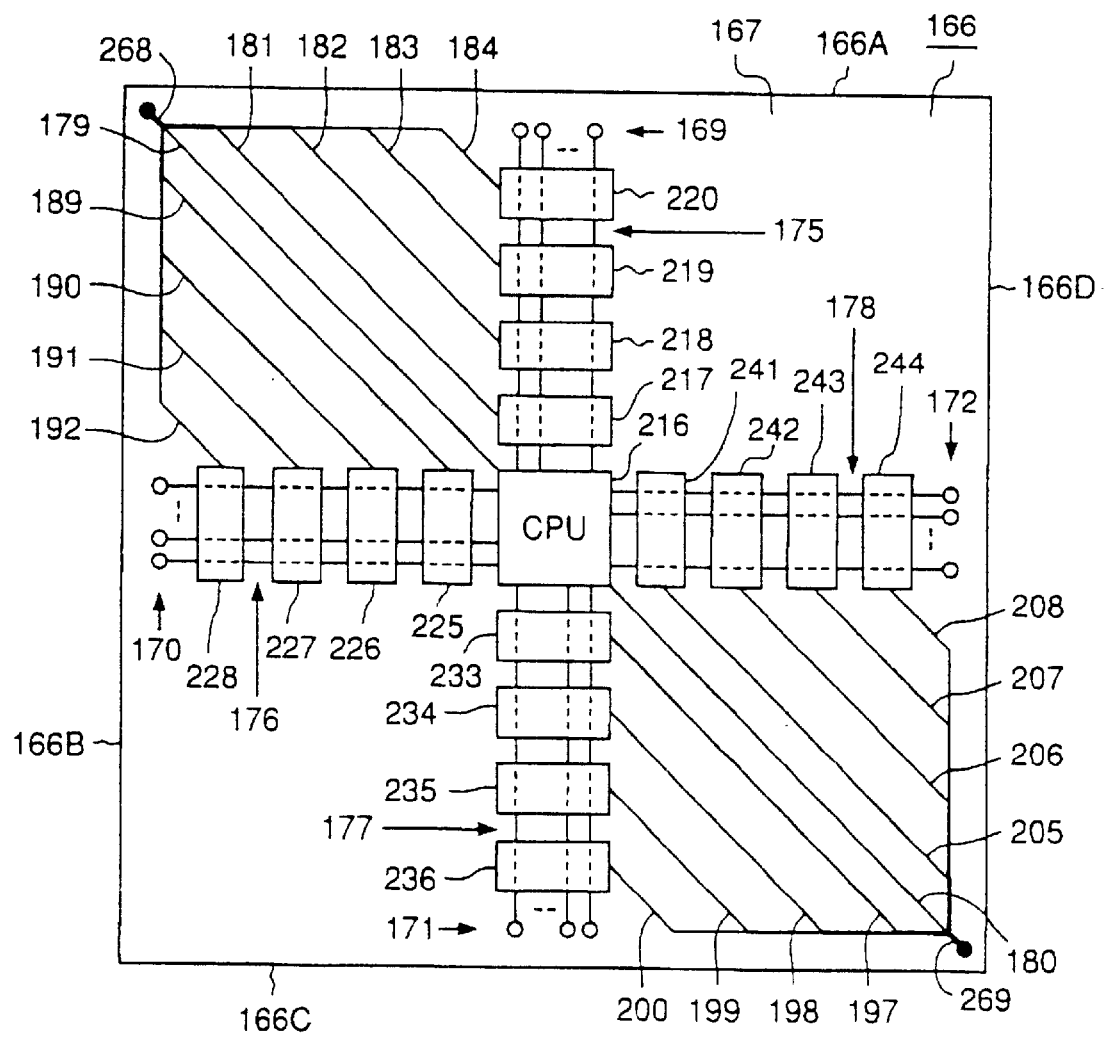
FIG. 36 is a schematic plan view of a twenty-first embodiment of the present invention.
Figure 37:
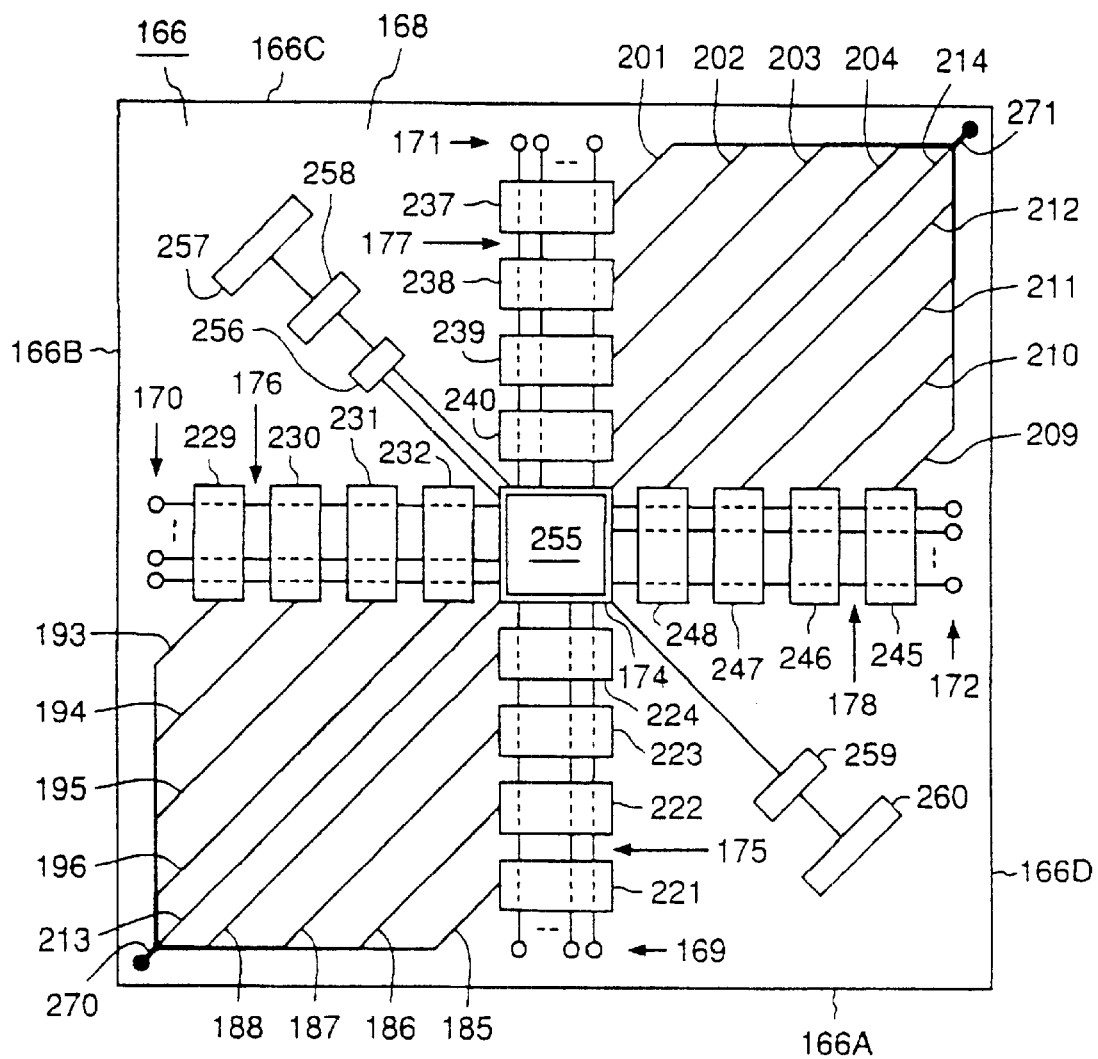
FIG. 37 is a schematic bottom view of the twenty-first embodiment of the present invention.

Twenty-first Embodiment
(FIGS. 36 and 37)

FIGS. 36 and 37 are respectively schematic plan and bottom views of a twenty-first embodiment of the present invention, in which the structure of the pairs of power supply and ground lines. The other parts of the structure shown in FIGS. 36 and 37 are the same as those of the nineteenth embodiment of the present invention.

The pairs of power supply and ground lines 179, 181–184 and 189–192 provided on the front surface 167 of the wiring board 166 are arranged so as to branch from the pair 268 of power supply and ground lines. Further, the pairs 180, 197–200 and 205–208 of power supply and ground lines are arranged so as to branch from the pair 269 of power supply and branch lines.

The pairs 268, 179, 181–184 and 189–192 of power supply and ground lines and the pairs of power supply and ground lines 269, 180, 197–200 and 205–208 of power supply and ground lines are formed in the stacked formation.

The pairs 213, 185–188 and 193–196 of power supply and ground lines formed on the back side 168 of the wiring board 166 are arranged so as to branch from a pair 270 of power supply and ground lines. The pairs 214, 201–204 and 209–212 of power supply and ground lines are arranged so as to branch from a pair 271 of power supply and ground lines.

The pairs 270, 213, 185–188 and 193–196 of power supply and ground lines and the pairs 271, 214, 201–204 and 209–212 of power supply and ground lines are formed in the stacked formation.

Impedance matching is made in the branching points on the pairs 268, 179, 181–184 and 189–192, the branching points on the pairs 269, 180, 197–200 and 205–208, the branching points on the pairs 270, 213, 185–188 and 193–196, and the branching points on the pairs 271, 214, 201–204 and 209–212.

According to the twenty-first embodiment of the present invention, it is possible to transfer, at a higher speed, signals between the CPU 216 and the memories accessed by the CPU 216 in an electronic device using the single wiring board 166 in which it is required to connect the CPU 216 and the 32 memories 217–248 by the equal-length parallel lines.

Figure 38:
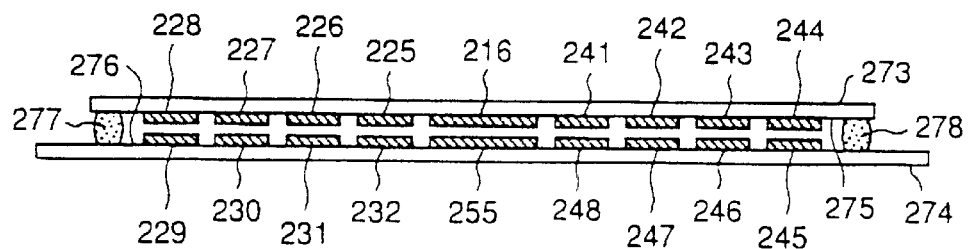
FIG. 38 is a schematic cross-sectional view of a twenty-second embodiment of the present invention.

Twenty-second Embodiment
(FIG. 38)

FIG. 38 is a schematic cross-sectional view of a twenty-second embodiment of the present invention, which includes wiring boards 273 and 274. The wiring board 273 has a surface 275 facing the wiring board 274, and the surface 275 serves as an element mounting surface. The wiring board 274 has a surface 276 facing the wiring board 273, and the surface 276 serves as an element mounting surface.

The element mounting surface 275 of the wiring board 273 is configured in the same manner as the front surface 167 of the wiring board 166 used in the nineteenth embodiment of the present invention. The element mounting surface 276 of the wiring board 274 is configured in the same manner as the back surface 168 of the wiring board 166 used in the nineteenth embodiment of the present invention.

On the element mounting surface 275 of the wiring board 273, provided are the pairs 175, 176, 177 and 178 of signal lines and the pairs 179, 180, 181–184, 189–192, 197–200 and 205–208 of power supply and ground lines, all of which pairs are the same as those formed on the front surface 167 of the wiring board 166 used in the nineteenth embodiment of the present invention shown in FIG. 30.

On the element mounting surface 275 of the wiring board 273, provided are the CPU 216 and the memories 217–220, 225–228, 233–236 and 241–244, which are the same as those formed on the front surface 167 of the wiring board 166 shown in FIG. 30.

On the element mounting surface 276 of the wiring board 274, provided are the pairs 175, 176, 177 and 178 of signal lines and the pairs 185–188, 193–196, 201–204, 209–212, 213 and 214 of power supply and ground lines, all of which pairs are the same as those formed on the back surface 168 of the wiring board 166 used in the nineteenth embodiment of the present invention shown in FIG. 31.

On the element mounting surface 276 of the wiring board 274, provided are the CPU 216 and the memories 221–224, 229–232, 237–240 and 245–248, which are the same as those formed on the back surface 168 of the wiring board 166 shown in FIG. 31.

The wiring board 273 and 274 are bonded and electrically connected together by solder bumps so that the element mounting surfaces 275 and 276 face each other. That is, the groups of signal lines of the wiring boards 273 and 274 are connected together by the solder bumps. Electrodes for external connections are arranged in the peripheral portions on the wiring board 274. Reference numbers 277 and 278 indicate some of the solder bumps.

According to the twenty-second embodiment of the present invention, it is possible to transfer, at a higher speed, signals between the CPU 216 and the memories accessed by the CPU 216 in an electronic device using the two wiring boards 273 and 274 in which it is required to connect the CPU 216 and the 32 memories 217–248 by the equal-length parallel lines.

Alternatively, it is possible to form the arrangement on the element mounting surface 275 of the wiring board 273 in the same manner as that on the front surface 167 of the wiring board 166 used in the twenty-first embodiment of the present invention shown in FIG. 36 and to form the arrangement on the element mounting surface 276 of the wiring board 274 in the same manner as that on the back surface 168 of the wiring board 166 shown in FIG. 37.

Figure 39:
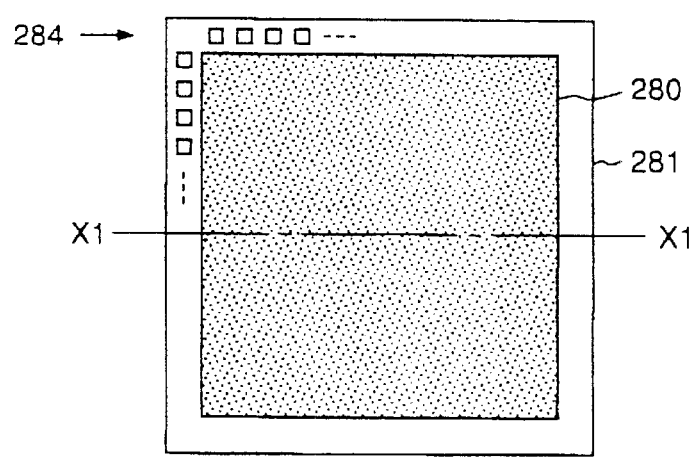
FIG. 39 is a schematic plan view of a twenty-third embodiment of the present invention.
Figure 40:
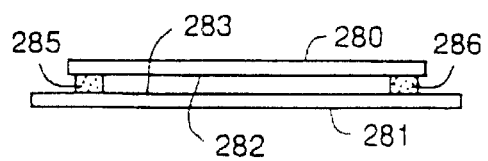
FIG. 40 is a schematic cross-sectional view taken along a line X1—X1 shown in FIG. 39.

Twenty-third Embodiment
(FIGS. 39 and 40)

FIG. 39 is a schematic plan view of a twenty-third embodiment of the present invention, and FIG. 40 is a schematic cross-sectional view taken along a line X1—X1 shown in FIG. 39. The structure shown in FIGS. 39 and 40 includes semiconductor substrates 280 and 281. The semiconductor substrate 280 has a surface 282, which faces the semiconductor substrate 281 and serves as an element formation area. The semiconductor substrate 281 has a surface 283, which faces the semiconductor substrate 280 and serves as an element formation area.

On the element formation surface 282 of the semiconductor substrate 280, provided are the CPU 216 and the memories 217–220, 225–228, 233–236 and 241–244 which are the same as those formed on the front surface 167 of the wiring board 166 used in the nineteenth embodiment of the present invention shown in FIG. 30.

Further, on the element formation surface 282 of the semiconductor substrate 280, provided are the pairs 175, 176, 177 and 178 of signal lines and the pairs 179, 180, 181–184, 189–192, 197–200 and 205–208 of power supply and ground lines which are the same as those formed on the front surface 167 of the wiring board 166 used in the nineteenth embodiment of the present invention shown in FIG. 30.

On the element formation surface 283 of the semiconductor substrate 281, provided are the memories 221–224, 229–232, 237–240 and 245–248 and the input/output chip 255 which are the same as those formed on the back surface 168 of the wiring board 166 used in the nineteenth embodiment of the present invention shown in FIG. 31.

On the element formation surface 283 of the semiconductor substrate 281, provided are the pairs 175, 176, 177 and 178 of signal lines and the pairs 185–188, 193–196, 201–204, 209 0 212, 213 and 214 of power supply and ground lines which are the same as those formed on the back surface 168 of the wiring board 166 shown in FIG. 31.

The semiconductor substrates 280 and 281 are bonded and electrically connected together by solder bumps so that the element formation surfaces 282 and 283 face each other. A group of electrodes 284 for external connections is arranged on the peripheral portions on the semiconductor substrate 281. Reference numbers 285 and 286 indicate some of the solder bumps.

According to the twenty-third embodiment of the present invention, it is possible to transfer, at a higher speed, signals between the CPU 216 and the memories accessed by the CPU 216 in an electronic device using the two wiring boards 280 and 281 in which it is required to connect the CPU 216 and the 32 memories 217–248 by the equal-length parallel lines.

Alternatively, it is possible to form the arrangement on the element mounting surface 282 of the wiring board 280 in the same manner as that on the front surface 167 of the wiring board 166 used in the twenty-first embodiment of the present invention shown in FIG. 36 and to form the arrangement on the element mounting surface 283 of the wiring board 281 in the same manner as that on the back surface 168 of the wiring board 166 shown in FIG. 37.

Figure 41:
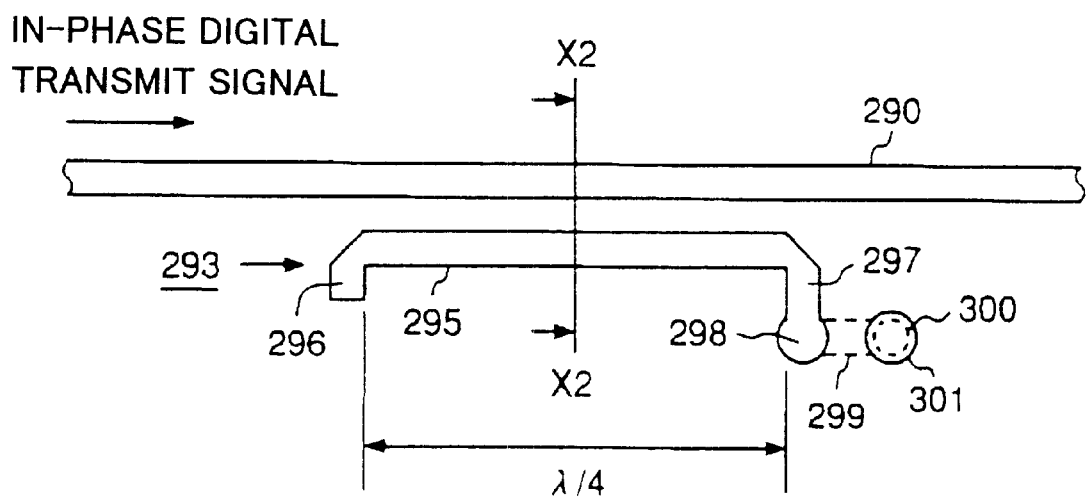
FIG. 41 is a schematic plan view of a twenty-fourth embodiment of the present invention.
Figure 42:
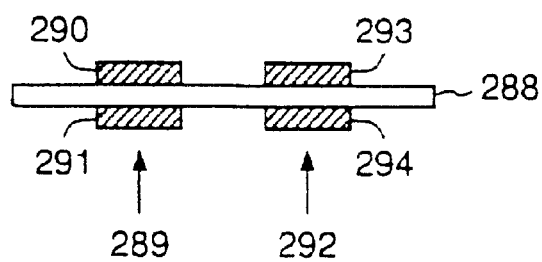
FIG. 42 is a schematic cross-sectional view taken along a line X2—X2 shown in FIG. 40.

Twenty-fourth Embodiment
(FIGS. 41 and 42)

FIG. 41 is a schematic plan view of a twenty-fourth embodiment of the present invention, and FIG. 42 is a schematic plan view taken along a line X2—X2 shown in FIG. 40. The structure shown in these figures includes an insulating board 288 and a pair 289 of signal lines 290 and 291 formed of equal-length parallel lines having a large coupling coefficient, over which complementary digital transmit signals are transferred in one way.

The structure shown in FIGS. 41 and 42 includes a pair of directional couplers 293 and 294. The directional coupler 293 receives and picks up the in-phase digital transmit signal transferred over the signal line 290. The directional coupler 294 receives and picks up the anti-phase digital transmit signal transferred over the signal line 291.

The directional coupler 293 includes a line part 295, which is formed in parallel with the signal line 290 and has a length equal to ¼ of the wavelength λ of the fundamental frequency component of the digital transmit signal. The directional coupler 293 receives the fundamental frequency component of the in-phase digital transmit signal transferred over the signal line 290.

The directional coupler 293 includes line parts 296 and 297, which are located on both ends of the line part 295 and are formed in the direction orthogonal to the signal line 290 in order to avoid interference with the electromagnetic field of the signal line 290. An end 298 of the line part 297 serves as an electrode via which the in-phase digital transmit signal received by the line part 290 is output.

The directional coupler 294 has line parts which face the line parts 295, 296 and 297 of the directional coupler 293, and a line part 299 slightly extending rightward from the end of the line part facing the line part 297.

An electrode 301 connected to the line part 299 via a through hole 300 is provided on the surface on which the electrode 298 is provided. The anti-phase digital transmit signal is output via the electrode 301.

An end of the line part 296 of the directional coupler 293 and an end of the line part of the directional coupler 294 opposite to the former end of the line part may be open or terminated by terminating resistors.

According to the twenty-fourth embodiment of the present invention thus configured, the fundamental frequency component of the in-phase digital transmit signal transferred over the signal line 290 is received by the line part 295 of the directional coupler 293 and is output via the electrode 298. The fundamental frequency component of the anti-phase digital transmit signal transferred over the signal line 291 is received by the line part of the directional coupler 294 facing that of the directional coupler 293 and is output via the electrode 301.

Hence, by connecting the in-phase and anti-phase input terminals of the differential receiver to the electrodes 298 and 301, respectively, it is possible to easily receive high-speed complementary digital signals transferred over the pair 289 of signal lines in one way, for example, digital signals of 1 GHz or higher.

Figure 43:
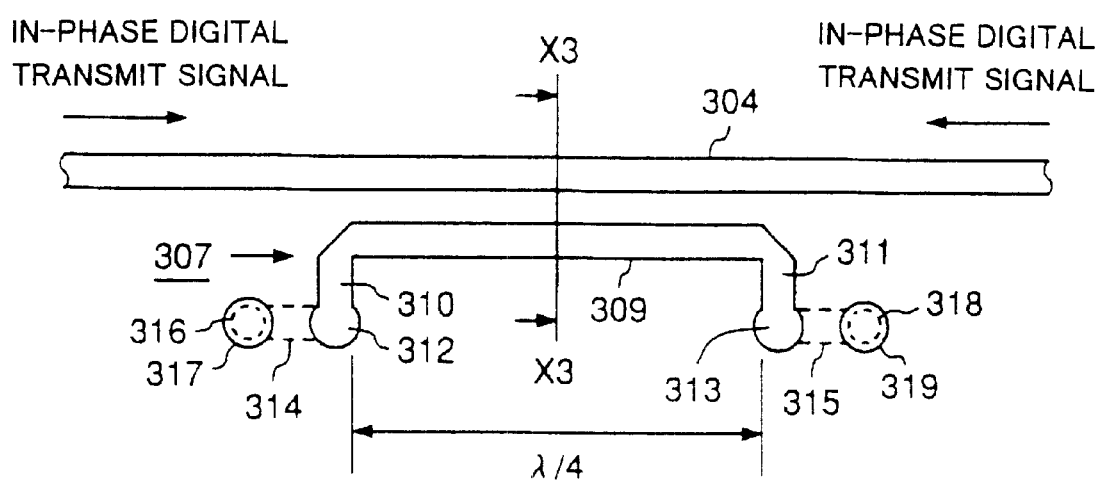
FIG. 43 is a schematic plan view of a twenty-fifth embodiment of the present invention.
Figure 44:
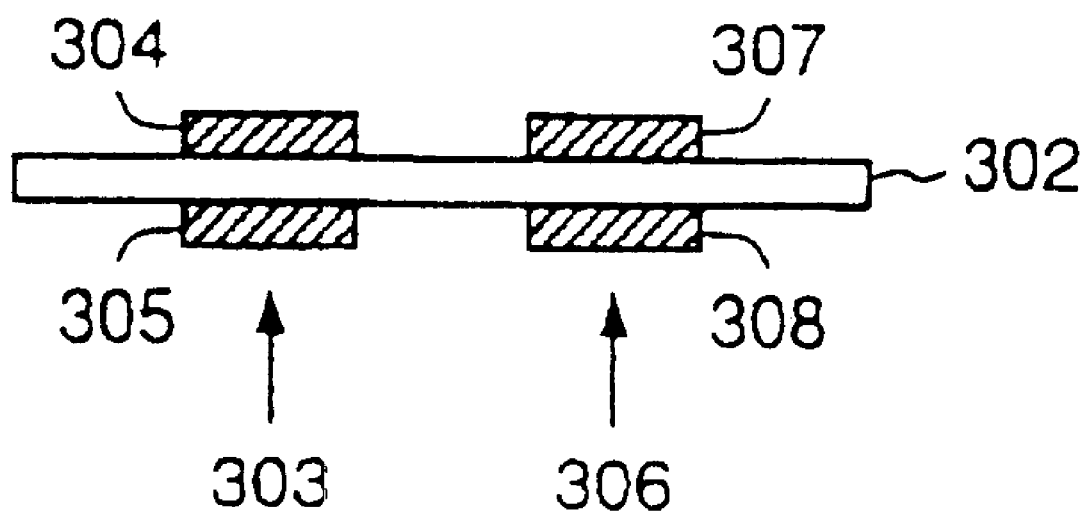
FIG. 44 is a schematic cross-sectional view taken along a line X3—X3 shown in FIG. 43.

Twenty-fifth Embodiment
(FIGS. 43 and 44)

FIG. 43 is a schematic plan view of a twenty-fifth embodiment of the present invention, and FIG. 44 is a schematic cross-sectional view taken along a line X3—X3 shown in FIG. 43. The structure shown in FIGS. 43 and 44 has an insulating board 302 and a pair 303 of signal lines 304 and 405 formed of equal-length parallel lines having a large coupling coefficient.

Further, the structure shown in FIGS. 43 and 44 a pair of directional couplers 307 and 308. The directional coupler 307 receives and picks up the in-phase digital transmit signal transferred over the signal line 304. The directional coupler 308 receives and picks up the anti-phase digital transmit signal transferred over the signal line 305.

The directional coupler 307 includes a line part 309, which is formed in parallel with the signal line 304 and has a length equal to ¼ of the wavelength λ of the fundamental frequency component of the digital transmit signal. The directional coupler 307 receives the fundamental frequency component of the in-phase digital transmit signal transferred over the signal line 304. The directional coupler 307 includes line parts 310 and 311, which are located on both ends of the line part 309 and are formed in the direction orthogonal to the signal line 304 in order to avoid interference with the electromagnetic field of the signal line 304.

An end 312 of the line part 310 serves as an electrode via which the in-phase digital transmit signal transferred leftward is output. An end 313 of the line part 311 serves as an electrode via which the in-phase digital transmit signal transferred rightward is output.

The directional coupler 308 includes line parts which face the line parts 309 and 310 of the directional coupler 307, a line part 314 slightly extending leftward from the end of the line part facing the line part 310, and a line part 315 slightly extending rightward from the end of the line part facing the line part 311.

An electrode 317 connected to the line part 314 via a through hole 316 is provided on the surface on which the electrode 312 is provided. Further, an electrode 319 connected to the line part 315 via a through hole 318 is provided on the surface on which the electrode 313 is formed. Receive-end terminating resistors are connected to the directional couplers 307 and 308 although an illustration thereof is omitted.

The fundamental frequency component of the in-phase digital transmit signal transferred over the signal line 304 leftward is received by the line part 309 of the directional coupler 307, and is output via the electrode 312. Further, the fundamental frequency component of the anti-phase digital transmit signal transferred over the signal line 305 leftward is received by the line part of the directional coupler 308 facing the line part 309 of the directional coupler 307, and is output via the electrode 317.

The fundamental frequency component of the in-phase digital transmit signal transferred over the signal line 304 rightward is received by the line part 309 of the directional coupler 307, and is output via the electrode 313. Further, the fundamental frequency component of the anti-phase digital transmit signal transferred over the signal line 305 rightward is received by the line part of the directional coupler 308 facing the line part 309 of the directional coupler 307 and is output via the electrode 319.

Thus, it is possible to easily receive high-speed complementary digital transmit signals, for example, signals of 1 GHz or higher, transferred over the pair 303 of signal lines in two ways by connecting the in-phase input terminal of the differential driver to the electrodes 312 and 313 and connecting the anti-phase input terminal thereof to the electrodes 317 and 319.

Figure 45:
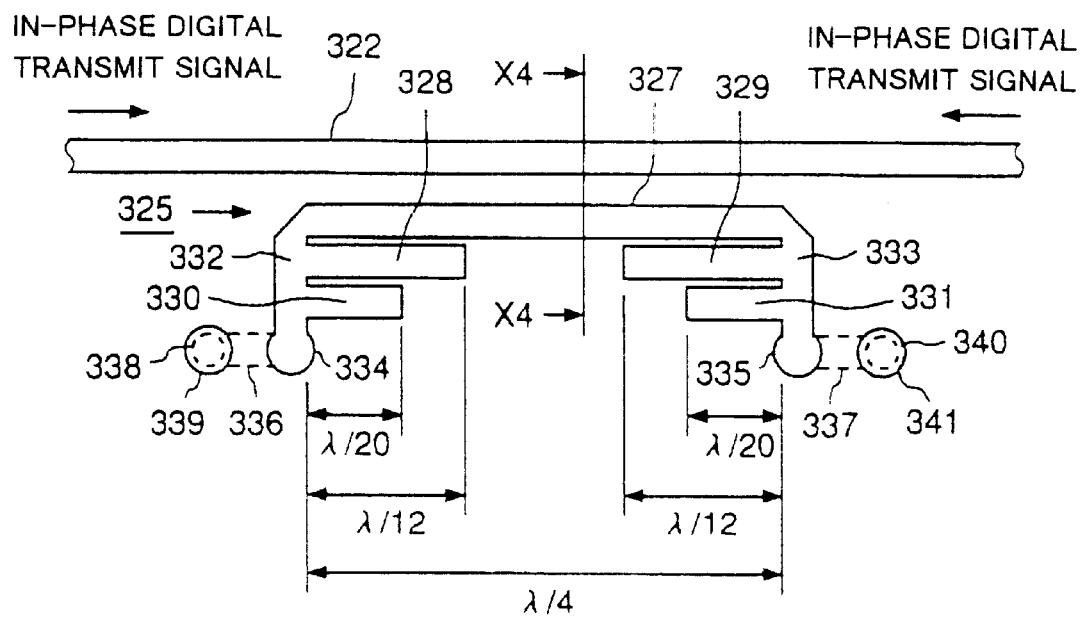
FIG. 45 is a schematic plan view of a twenty-sixth embodiment of the present invention.
Figure 46:
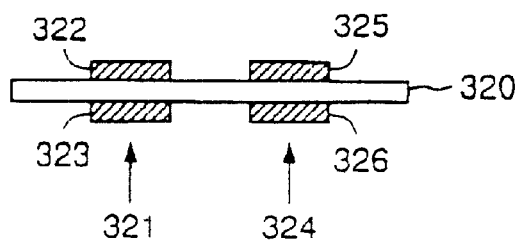
FIG. 46 is a schematic cross-sectional view taken along a line X4—X4 shown in FIG. 45.

Twenty-sixth Embodiment
(FIGS. 45 and 46)

FIG. 45 is a schematic plan view of a twenty-sixth embodiment of the present invention, and FIG. 46 is a schematic cross-sectional view taken along a line X4—X4 shown in FIG. 45. The structure shown in FIGS. 45 and 46 includes an insulating board 320 and a pair 321 of signal lines 322 and 323 formed of equal-length parallel lines having a large coupling coefficient over which the complementary digital transmit signals are transferred in two ways.

The above structure further includes a pair of directional couplers 325 and 326. The directional coupler 325 receives and picks up the in-phase digital transmit signal transferred over the signal line 322. The directional coupler 326 receives and picks up the anti-phase digital transmit signal transferred over the signal line 323.

The directional coupler 325 includes a line part 327, which is formed in parallel with the signal line 322 and has a length equal to ¼ of the wavelength λ of the fundamental frequency component of the digital transmit signal. The directional coupler 325 receives the fundamental frequency component of the in-phase digital transmit signal transferred over the signal line 322.

The directional coupler 325 further includes line parts 328 and 329, which extend in parallel with the signal line 322 and have a length equal to $\frac{1}{12}$ of the wavelength λ of the fundamental frequency component of the digital transmit signal. The line parts 328 and 329 receive the second harmonic of the in-phase digital transmit signal transferred over the signal line 322.

The directional coupler 325 further includes line parts 330 and 331, which extend in parallel with the signal line 322 and have a length equal to $\frac{1}{12}$ of the wavelength λ of the fundamental frequency component of the digital transmit signal. The line parts 330 and 331 receive the third harmonic of the in-phase digital transmit signal transferred over the signal line 322.

The directional coupler 325 includes line parts 332 and 333, which are located on both ends of the line part 322 and are formed in the direction orthogonal to the signal line 322 in order to avoid interference with the electromagnetic field of the signal line 322. An end 334 of the line part 332 serves as an electrode via which the in-phase digital transmit signal transferred leftward is output. An end 335 of the line part 333 serves as an electrode via which the in-phase digital transmit signal transferred rightward is output.

The directional coupler 326 includes line parts which face the line parts 327, 328, 329, 330, 331, 332 and 333 of the directional coupler 325. Further the directional coupler 326 includes a line part 336 slightly extending leftward from the end of the line part facing the line part 332, and a line part 337 slightly extending rightward from the end of the line part facing the line part 333.

An electrode 339 connected to the line part 336 via a through hole 338 is provided on the surface on which the electrode 334 is provided. The anti-phase digital transmit signal is output via the electrode 339. Further, an electrode 341 connected to the line part 337 via a through hole 340 is provided on the surface on which the electrode 335 is formed. The anti-phase digital transmit signal is output via the electrode 341. Receive-end terminating resistors are connected to the directional couplers 325 and 326 although an illustration thereof is omitted.

The fundamental frequency component, the second and third harmonics of the in-phase digital transmit signal transferred over the signal line 322 leftward are respectively received by the line parts 327, 328 and 330 of the directional coupler 325, and are output via the electrode 334. Further, the fundamental frequency component, the second and third harmonics of the anti-phase digital transmit signal transferred over the signal line 323 leftward are respectively received by the line parts 327, 328 and 330 of the directional coupler 325, and are output via the electrode 339.

The fundamental frequency component, the second and third harmonics of the in-phase digital transmit signal transferred over the signal line 322 rightward are respectively received by the line parts 327, 328 and 331 of the directional coupler 325, and are output via the electrode 335. Further, the fundamental frequency component, the second and third harmonics of the anti-phase digital transmit signal transferred over the signal line 323 rightward are respectively received by the line parts 327, 328 and 331 of the directional coupler 325, and are output via the electrode 341.

Thus, it is possible to easily receive high-speed complementary digital transmit signals, for example, signals of 1 GHz or higher, transferred over the pair 321 of signal lines in two ways by connecting the in-phase input terminal of the differential driver to the electrodes 334 and 335 and connecting the anti-phase input terminal thereof to the electrodes 339 and 341.

Figure 47:
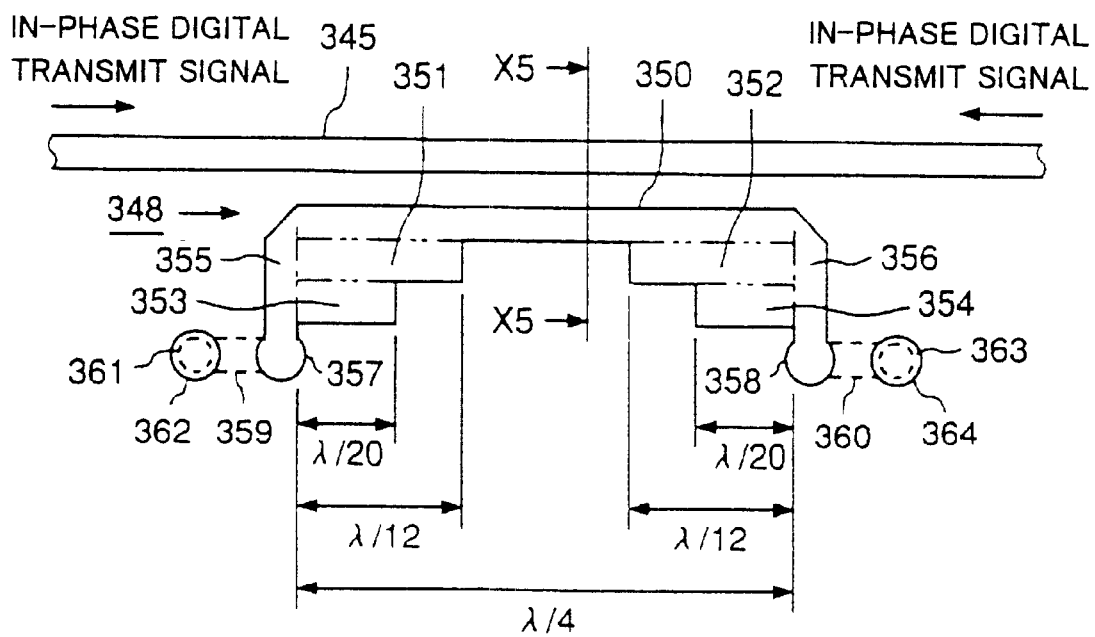
FIG. 47 is a schematic plan view of a twenty-seventh embodiment of the present invention.
Figure 48:
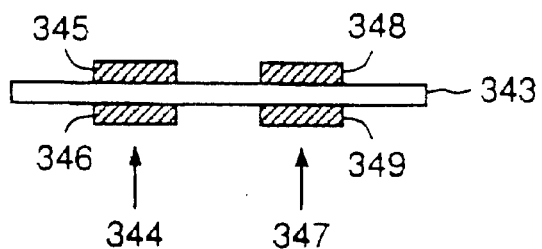
FIG. 48 is a schematic cross-sectional view taken along a line X5—X5 shown in FIG. 47.

Twenty-seventh Embodiment
(FIGS. 47 and 48)

FIG. 47 is a schematic plan view of a twenty-seventh embodiment of the present invention, and FIG. 48 is a schematic cross-sectional view taken along a line X5—X5 shown in FIG. 47. The structure shown in FIGS. 47 and 48 includes an insulating board 343 and a pair of signal lines 345 and 346 formed of equal-length parallel lines having a coupling coefficient, over which the complementary digital transmit signals are transferred in two ways.

The structure further includes a pair 347 of directional couplers 348 and 349. The directional coupler 348 receives and picks up the in-phase digital transmit signal transferred over the signal line 345. The directional coupler 349 receives and picks up the anti-phase digital transmit signal transferred over the signal line 346.

The directional coupler 348 includes a line part 350, which is parallel to the signal line 345 and has a length equal to ¼ of the wavelength λ of the fundamental frequency component of the digital transmit signal. The line part 350 receives the fundamental frequency component of the in-phase digital transmit signal transferred over the signal line 345.

The directional coupler 348 further includes line parts 351 and 352, which extend in parallel with the signal line 345 and have a length equal to ¹⁄₁₂ of the wavelength λ of the fundamental frequency component of the digital transmit signal. The line parts 351 and 352 receive the second harmonic of the in-phase digital transmit signal transferred over the signal line 322.

The directional coupler 348 further includes line parts 353 and 354, which extend in parallel with the signal line 345 and have a length equal to ¹⁄₂₀ of the wavelength λ of the fundamental frequency component of the digital transmit signal. The line parts 353 and 354 receive the third harmonic of the in-phase digital transmit signal transferred over the signal line 345. The line parts 350, 351, 352, 353 and 354 are integrally formed.

The directional coupler 348 includes line parts 355 and 356, which are located on both ends of the line part 350 and are formed in the direction orthogonal to the signal line 350 in order to avoid interference with the electromagnetic field of the signal line 350. An end 357 of the line part 355 serves as an electrode via which the in-phase digital transmit signal transferred leftward is output. An end 358 of the line part 356 serves as an electrode via which the in-phase digital transmit signal transferred rightward is output.

The directional coupler 349 includes line parts which face the line parts 350, 351, 352, 353, 354, 355 and 356 of the directional coupler 348. Further the directional coupler 349 includes a line part 359 slightly extending leftward from the end of the line part facing the line part 355, and a line part 360 slightly extending rightward from the end of the line part facing the line part 356.

An electrode 362 connected to the line part 359 via a through hole 361 is provided on the surface on which the electrode 357 is provided. The anti-phase digital transmit signal is output via the electrode 362. Further, an electrode 364 connected to the line part 360 via a through hole 363 is provided on the surface on which the electrode 358 is formed. Receive-end terminating resistors are connected to the directional couplers 348 and 349 although an illustration thereof is omitted.

The fundamental frequency component, the second and third harmonics of the in-phase digital transmit signal transferred over the signal line 345 leftward are respectively received by the line parts 350, 351 and 353 of the directional coupler 348, and are output via the electrode 357. Further, the fundamental frequency component, the second and third harmonics of the anti-phase digital transmit signal transferred over the signal line 346 leftward are respectively received by the line parts 350, 351 and 353 of the directional coupler 349, and are output via the electrode 362.

The fundamental frequency component, the second and third harmonics of the in-phase digital transmit signal transferred over the signal line 345 rightward are respectively received by the line parts 350, 352 and 354 of the directional coupler 348, and are output via the electrode 358. Further, the fundamental frequency component, the second and third harmonics of the anti-phase digital transmit signal transferred over the signal line 346 rightward are respectively received by the line parts 350, 352 and 354 of the directional coupler 348, and are output via the electrode 364.

Thus, it is possible to easily receive high-speed complementary digital transmit signals, for example, signals of 1 GHz or higher, transferred over the pair 344 of signal lines in two ways by connecting the in-phase input terminal of the differential driver to the electrodes 357 and 358 and connecting the anti-phase input terminal thereof to the electrodes 362 and 364.

The present invention is not limited to the specifically disclosed embodiments, and variations and modifications may be made without departing from the scope of the present invention.

What is claimed is:

1. An electronic apparatus comprising:

a wiring board;

at least one pair of signal lines provided on the wiring board in parallel and having equal lengths;

a chip that is mounted on the wiring board and includes at least one differential driver which outputs complementary digital transmit signals to at least one of said pair of lines; and a pair of power system lines through which first and second power supply voltages are supplied to said at least one differential driver, the pair of power system lines being parallel to each other and having equal lengths.

2. The electronic apparatus as claimed in claim 1, wherein the pair of power system lines has a characteristic impedance $Z1$ equal to or close to $Z0/n$, where $Z0$ denotes a characteristic impedance of said at least one pair of signal lines, and n denotes a number of pairs of signal lines.

3. The electronic apparatus as claimed in claim 1, wherein the following condition is satisfied with regard to said at least one pair of signal lines and said pair of power system lines:

$$b > 2a,$$

where a denotes a distance between two lines in each pair and b denotes a distance between adjacent pairs.

4. The electronic apparatus as claimed in claim 1, wherein the following condition is satisfied with regard to said at least one pair of signal lines and said pair of power system lines:

$$s/(t+c) > 2,$$

where t denotes a thickness of the wiring board, c denotes a width of two lines in each pair and s denotes a distance between adjacent pairs.

5. The electronic apparatus as claimed in claim 1, wherein said at least one differential driver has an ON resistance equal to a characteristic impedance of said at least one pair of signal lines.

6. The electronic apparatus as claimed in claim 1, further comprising a terminating resistor between said at least one pair of signal lines.

7. The electronic apparatus as claimed in claim 6, wherein:

said at least one differential driver is a three-state differential driver; and said chip includes a differential receiver which has a high input impedance and is connected to said at least one pair of signal lines.

8. The electronic apparatus as claimed in claim 1, further comprising a first capacitor connected between power system lines formed on the chip through which lines the first and second power supply voltages are supplied.

9. The electronic apparatus as claimed in claim 8, wherein the first capacitor is formed under a pad on the chip for a power supply.

10. The electronic apparatus as claimed in claim 8, further comprising a second capacitor connected between said pair of power system lines and located close to the chip.

11. The electronic apparatus as claimed in claim 10, wherein:

said second capacitor is located at a distance equal to or less than 1/10 of the length of said at least one pair of signal lines from said first capacitor; and said second capacitor has a capacitance equal to five times that of said first capacitor or larger.

12. The electronic apparatus as claimed in claim 1, further comprising a first capacitor connected between power system lines formed on the chip through which lines the first and second power supply voltages are supplied, said power system lines formed on the chip being arranged in parallel and having equal lengths.

13. The electronic apparatus as claimed in claim 1, further comprising a first low-pass filter which is provided at an output side of said at least one differential driver and attenuates a third harmonic.

14. The electronic apparatus as claimed in claim 13, further comprising a second low-pass filter connected to the pair of power system lines.

15. The electronic apparatus as claimed in claim 1, further comprising a receive part including a coupler arranged in parallel with said at least one of the pair of signal lines.

16. An electronic apparatus comprising:

a wiring board;

at least one signal line formed on the wiring board;

a chip that is mounted on the wiring board and includes a driver which outputs a non-differential digital transmit signal; and a first capacitor connected between power system lines formed on the chip via which lines first and second power supply voltages are supplied to the driver, said power system lines being parallel to each other and having equal lengths.

17. The electronic apparatus as claimed in claim 16, wherein the first capacitor is formed under a pad on the chip for a power supply.

18. The electronic apparatus as claimed in claim 16, further comprising a second capacitor connected between a pair of power system lines and located close to the chip, said pair of power system lines being connected to the power system lines formed on the chip.

19. The electronic apparatus as claimed in claim 18, wherein:

said second capacitor is located at a distance equal to or less than 1/10 of the length of said at least one signal line from said first capacitor; and said second capacitor has a capacitance equal to five times that of said first capacitor or larger.

20. The electronic apparatus as claimed in claim 16, further comprising a first low-pass filter which is provided at an output side of the driver and attenuates a third harmonic.

21. The electronic apparatus as claimed in claim 20, further comprising a second low-pass filter connected to the power system lines.

22. The electronic apparatus as claimed in claim 16, further comprising a receive part including a coupler arranged in parallel with said signal line.

* * * * *

UNITED STATES PATENT AND TRADEMARK OFFICE
CERTIFICATE OF CORRECTION

PATENT NO. : 6,522,173 B1 Page 1 of 1
DATED : February 18, 2003
INVENTOR(S) : Kanji Otsuka It is certified that error appears in the above-identified patent and that said Letters Patent is hereby corrected as shown below:

<u>Title page,</u>
Item [73], change "Matsushita Electronics Corporation" to -- Matsushita Electric Industrial Co., Ltd. --.

Signed and Sealed this

Tenth Day of June, 2003

JAMES E. ROGAN
*Director of the United States Patent and Trademark Office*